US006890700B2

(12) United States Patent
Tomita et al.

(10) Patent No.: US 6,890,700 B2

(45) Date of Patent: May 10, 2005

(54) LITHOGRAPHIC PRINTING PLATE PRECURSOR

(75) Inventors: Tadabumi Tomita, Shizuoka (JP); Atsushi Matsuura, Shizuoka (JP); Akio Uesugi, Shizuoka (JP); Katsuyuki Teraoka, Shizuoka (JP); Hisashi Hotta, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 10/022,244

(22) Filed: Dec. 20, 2001

(65) Prior Publication Data

US 2002/0182538 A1 Dec. 5, 2002

(30) Foreign Application Priority Data

| | | |
|---|---|---|
| Dec. 20, 2000 | (JP) | P.2000-387210 |
| Jan. 18, 2001 | (JP) | P.2001-009871 |
| Apr. 3, 2001 | (JP) | P.2001-104632 |
| Jul. 6, 2001 | (JP) | P.2001-206572 |

(51) Int. Cl.[7] .................................................. G03F 7/11

(52) U.S. Cl. ............................... 430/271.1; 430/275.1; 430/278.1; 430/944; 430/945; 101/453; 101/454

(58) Field of Search ........................... 430/275.1, 270.1, 430/271.1, 278.1, 302, 303, 348, 944, 945, 964, 138; 101/130, 453, 454, 456, 463.1, 467

(56) References Cited

U.S. PATENT DOCUMENTS

| | | | | | |
|---|---|---|---|---|---|
| 5,807,659 | A | * | 9/1998 | Nishimiya et al. | 430/302 |
| 6,001,536 | A | | 12/1999 | Vermeersch et al. | |
| 6,045,681 | A | * | 4/2000 | Mori | 205/214 |
| 6,110,644 | A | | 8/2000 | Vermeersch et al. | |
| 6,340,426 | B1 | * | 1/2002 | Uesugi | 205/687 |
| 6,468,717 | B2 | * | 10/2002 | Kita et al. | 430/278.1 |
| 6,637,334 | B2 | | 10/2003 | Akiyama et al. | |
| 2001/0041305 | A1 | * | 11/2001 | Sawada et al. | 430/278.1 |
| 2002/0033108 | A1 | * | 3/2002 | Akiyama et al. | 101/457 |
| 2002/0039702 | A1 | * | 4/2002 | Hotta | 430/273.1 |
| 2002/0056648 | A1 | * | 5/2002 | Sawada et al. | 205/219 |
| 2002/0094490 | A1 | * | 7/2002 | Endo et al. | 430/278.1 |
| 2002/0160308 | A1 | * | 10/2002 | Nishino et al. | 430/271.1 |

FOREIGN PATENT DOCUMENTS

| | | | |
|---|---|---|---|
| EP | 0 924 101 | A2 | 6/1999 |
| EP | 1 038 666 | A2 | 9/2000 |
| EP | 1 052 113 | A1 | 11/2000 |
| EP | 1 142 707 | A1 | 10/2001 |
| EP | 1 142 708 | A1 | 10/2001 |

* cited by examiner

*Primary Examiner*—Barbara L. Gilliam

(74) *Attorney, Agent, or Firm*—Burns, Doane, Swecker & Mathis, L.L.P.

(57) ABSTRACT

A lithographic printing plate precursor is disclosed, comprising a metal support having formed thereon an anodic oxide film, and an image-forming layer containing a light-to-heat converting agent, or a light-sensitive layer capable of image-forming with infrared laser exposure provided in this order from the support.

8 Claims, 3 Drawing Sheets

LITHOGRAPHIC PRINTING PLATE PRECURSOR

FIELD OF THE INVENTION

The present invention relates to a lithographic printing plate precursor, in particular, to a lithographic printing plate precursor which is capable of plate-making by scanning exposure based on digital signals, high sensitivity, free of residual color and residual film phenomena, and excellent in resistance to smearing (i.e., staining) and excellent in press life.

Further, the present invention relates to a lithographic printing plate precursor capable of recording by an infrared laser, specifically to a lithographic printing plate precursor having a heat-sensitive layer capable of image-forming by exposure with an infrared laser.

BACKGROUND OF THE INVENTION

In the field of the lithographic printing plate precursor, metal supports are widely used. Above all, it is known that an oxide film can be formed when a direct electric current is turned on in an acid solution with an aluminum sheet as the anode, which is generally known as the Alumite treatment, in addition, aluminum is light weight and inexpensive. Aluminum oxide film formed on the surface of aluminum by Alumite treatment is high in acid resistance and hardness as compared with metallic aluminum, further, many minute holes called pores are formed regularly on the surface of the film structure, and the surface area by BET method (Brunauer-Emmett-Teller gas adsorption equation) steeply increases due to the pores, and so very advantageous in the improvements of hydrophilicity and the adhering property when a film is formed.

In the formation of pores, an anodic oxide film is conventionally formed in an electrolyte by using a proper electrolyte, such as a sulfuric acid, and applying a direct electric current at constant current to the support. The sectional form of the pore of the anodic oxide film obtained in such a method can be seen by observing the broken-out section of the pore with an ultra-high resolution scanning electron microscope (SEM) (S-900). In that case, the form of the pore is generally a pipe-like form in which the diameters at the surface mouth part and at the maximum diameter part are almost the same.

Dyes, which are light-sensitive layer components, sometimes enter into such pores of the anodic oxide film and cause a phenomenon of residual color that the dyes remain even after development, and binders, which are also light-sensitive layer components, cause a phenomenon of residual film that the binders remain even after development. Therefore, techniques of sealing the pores by appropriate process to prevent the light-sensitive layer from entering into the pores according to necessity have been known.

Further, in recent years, lithographic printing plate precursors for heat mode CTP (computer to plate) capable of image-forming by exposure in near infrared to infrared region, in particular, capable of direct plate-making from digital data of, e.g., a computer, by recording an image by utilizing the heat generated by irradiation with a laser having emission region in near infrared to infrared region attract public attention.

These are lithographic printing plate precursors which convert irradiated laser beam for imaging to heat by using a light-to-heat converting material (also, simply called "a light/heat converting material"), change the solubility in a developing solution of a light-sensitive layer by the generated heat, or heat-decomposed a light-sensitive layer, or subject a light-sensitive layer to explosive abrupt removal (ablation) by sudden heating. When aluminum is used as the support of these lithographic printing plate precursors for heat mode CTP (hereinafter simply referred to as "heat mode photographic material"), since the heat conductivity of aluminum is high, abrupt heat release to the support side occurs and exothermic loss is generated, which is one of the cause of the reduction of sensitivity. Conversely speaking, it is expected that if the heat insulation of the support surface can be improved and heat release can be suppressed to the minimum, sensitivity can be increased by that portion.

On the other hand, techniques for higher sensitization by using organic materials having low heat conductivity, such as PET, as a support have been tried variously, but organic materials are low in hydrophilicity as compared with metallic materials and dimensional accuracy is deteriorated during printing by absorbing moisture, and so these materials cannot be used for printing of a high degree, e.g., color printing and highly precise printing in the present state.

As the support for a heat mode photographic material, it has been an object of the industry to improve the only drawback of aluminum of heat insulating property with making the best use of excellent aspects, e.g., easiness of various surface treating processes, hydrophilicity, and the stability of dimensional accuracy.

For improving the heat insulating property of aluminum, there are a method of thickening the thickness of an anodic oxide film by making use of the property of low heat conductivity of the anodic oxide film itself, and a method of increasing the void ratio of an anodic oxide film by immersing an anodic oxide film formed in an acid aqueous solution or an alkali aqueous solution to enlarge the pore diameter. However, when a film thickness is thickened, extra quantity of electricity of that portion is required, which causes the increase of production costs and, further, the pore is deepened by the increment of the thickness, and so the residual color is liable to be noticeable. Contrary to this, when a pore diameter is enlarged, the void ratio in the anodic oxide film on the support surface is improved and the heat insulating property is improved, and the heat generated by irradiation with laser beams is difficult to dissipate on the aluminum sheet side of the metal. As a result, the generated heat effectively functions in a light-sensitive layer, which results in high sensitivity. On the other hand, when a pore diameter is enlarged, a light-sensitive layer and a coloring dye for absorbing laser beams contained in a light-sensitive layer enter into the pores and cause a residual color and a residual film. For reducing a residual color, by performing sealing treatment such as boiling water sealing by mixing a very small amount of a sealing agent, the surface of an anodic oxide film is covered, thereby the specific surface area is reduced, and at the same time, a light-sensitive layer does not enter into the pores, thus residual color is improved. However, when pore density is reduced as a result of sealing treatment to cover the surface of an anodic oxide film, pile driving effect that a light-sensitive layer enters into the pores is reduced and an adhesive force is decreased. In addition, when pores are enlarged, adjacent pores form a multi-pore, which leads to extreme lowering of the anodic oxide film strength, and results in smearing due to peeling off of the film and also the deterioration of press life.

With the advancement of the image-forming technique in recent years, a technique of direct plate-making by scanning a printing plate with a diaphragmed laser beam and directly forming a character original and an image original on the printing plate without using a film original has attracting public attention.

As such an image-forming material, a so-called thermal type positive lithographic printing plate precursor in which an infrared absorber contained in a heat-sensitive layer exhibits a light/heat converting function and generates heat when subjected to exposure, and the exposed area of the heat-sensitive layer is solubilized in an alkali due to the heat generated by exposure and forms a positive image, and a thermal type negative lithographic printing plate precursor in which a radical and an acid are generated by a radical generating agent and an acid generating agent due to that heat, thereby a radical polymerization reaction and an acid crosslinking reaction progress and the exposed area of the heat-sensitive layer is insolubilized to form a negative image are exemplified. That is, in such thermal type image formation, a heat is generated by a light/heat converting material in a heat-sensitive layer by irradiation with a laser beam and that heat causes an image-forming reaction.

However, since the heat conductivity of a support is extremely high as compared with that of a heat-sensitive layer in an aluminum support on which a surface-roughened anodic oxide film is formed, the heat generated on the periphery of the interface of the heat-sensitive layer and the support diffuses to the inside of the support before being used sufficiently in image formation, as a result, the following phenomena occur in the interface of the heat-sensitive layer and the support.

In the first place, in a positive type heat-sensitive layer, there is the problem of low sensitivity, i.e., when a heat diffuses to the inside of a support and an alkali solubilization reaction of the heat-sensitive layer becomes insufficient, a residual film is generated on the area to be a non-image area originally, and this is an essential problem of the positive type heat-sensitive layer.

Further, in such a thermal type positive lithographic printing plate precursor, infrared absorbers having a function of light/heat conversion is requisite, but these compounds are low in solubility due to comparatively large molecular weights, further they are adsorbed onto the micro pores formed by the anodic oxidation and it is difficult to removed them, and so there is another problem that a residual film is liable to be generated in a developing process by an alkali developing solution.

On the other hand, in a negative type heat-sensitive layer, when a heat diffuses to the inside of a support and the insolubilization in a developing solution of the heat-sensitive layer on the periphery of the interface of the heat-sensitive layer and the support becomes insufficient, an image is not formed sufficiently on the area to be an image area originally and the image is removed during development, or easily peeled off during printing, even if an image is formed.

Further, in recent years, various investigations and suggestions have been done on a lithographic printing plate precursor capable of being mounted on a printing machine after exposure as it is and performing printing. For example, a lithographic printing plate precursor of forming an image by the coalescence of fine particles by heat has been proposed.

However, in such a lithographic printing plate precursor, sensitivity is low due to the dissipation of heat to an aluminum support, and the strength of the image area of a heat-sensitive layer becomes weak when the coalescence of fine particles is insufficient, which causes an insufficient press life.

For coping with these problems, it has been tried to enlarge the micro pores of an anodic oxide film for the purpose of inhibiting the heat generated in a heat-sensitive layer from diffusing to an aluminum support.

Further, from the similar viewpoint, sealing of micro pores has been made on trial by the method of immersing an aluminum support comprising an aluminum sheet having provided thereon an anodic oxide film in a boiling water or a boiling aqueous solution containing an inorganic or organic salt, or the method of exposing an aluminum support to a water vapor bath.

However, in the method of enlarging the micro pores of the anodic oxide film, the sensitivity and the press life are improved but the smearing resistance (i.e., also, called "the stain resistance") is deteriorated. "Smearing resistance" here means the property of hardly generating smearing on the non-image area when printing is stopped in the middle of printing, and printing is restarted from the stare of the lithographic printing plate being left as it is on the printing machine. On the other hand, in the method of sealing the micro pores, the smearing resistance is improved but the sensitivity and the press life are deteriorated. Accordingly, sufficiently satisfactory level is not achieved yet in either case.

SUMMARY OF THE INVENTION

An object of the present invention is to provide a lithographic printing plate precursor capable of getting over the drawbacks of prior art techniques, improving residual color and residual film with maintaining sensitivity, and excellent in smearing resistance and press life.

Another object of the present invention is to provide a lithographic printing plate precursor capable of using a heat efficiently in image-forming, high in sensitivity, excellent in press life, and free from the generation of smearing on a non-image area.

As a result of the eager investigation to solve the above problems, the present inventors have found that the following lithographic printing plate precursor can achieve the objects of the present invention.

A lithographic printing plate precursor comprising a metal support having formed thereon an anodic oxide film (sometimes, called "anodic oxidation film), and an image-forming layer containing a light/heat converting agent (i.e., a light-to-heat converting agent) or a light-sensitive layer capable of image-forming with infrared laser exposure provided on the anodic oxide film.

The present inventors have found, as the preferred first embodiment, that when the mouth diameter of the surface of the pores of the anodic oxide film on the metal support is from 0 to 30 nm and the maximum inside diameter is from 20 to 300 nm, residual color, residual film, smearing resistance (i.e., staining resistance) and press life of the lithographic printing plate precursor can be improved with maintaining sensitivity.

That is, the present invention provides a lithographic printing plate precursor comprising a metal support having formed thereon an anodic oxide film having pores having a mouth diameter of the surface of from 0 to 30 nm and a maximum inside diameter of from 20 to 300 nm, and an image-forming layer containing a light/heat converting agent provided on the anodic oxide film.

The present inventors have found, as the more preferred second embodiment, that by providing a specific particle layer between the anodic oxide film and the heat-sensitive layer in a thermal type lithographic printing plate precursor, a heat can be efficiently used in image-forming, and a lithographic printing plate precursor which is high insensitivity, excellent in press life and free of generation of smearing (i.e., staining) on a non-image area can be obtained.

That is, the present invention provides a lithographic printing plate precursor comprising an aluminum support comprising an aluminum sheet having formed thereon an anodic oxide film, a particle layer comprising particles having an average particle diameter of from 8 to 800 nm, and a heat-sensitive layer capable of image-forming with infrared laser exposure provided in this order.

DESCRIPTION OF THE SYMBOLS

Figure 1:
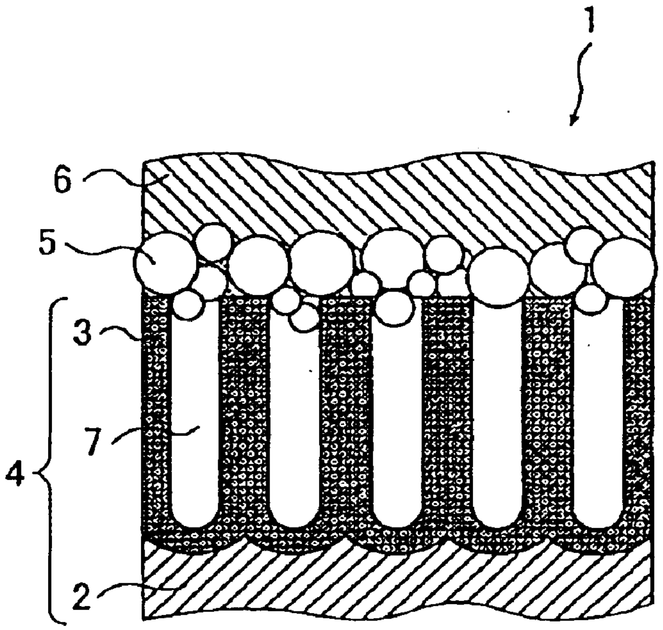
FIG. 1 is a cross sectional view of the lithographic printing plate precursor according to the present invention.

1: Lithographic printing plate precursor
2: Aluminum sheet
3: Anodic oxide film
4: Aluminum support
5: Particle layer
6: Heat-sensitive layer
7: Micro pore
11: Aluminum sheet
12: Radial drum roller
13*a*, 13*b*: Main poles
14: Electrolyte
15: Feeding port of electrolyte
16: Slit
17: Passage of electrolyte
18: Auxiliary anode
19*a*, 19*b*: Thyristors
20: AC power

DETAILED DESCRIPTION OF THE INVENTION

The preferred first embodiment of the present invention is described below.

When the anodic oxide film on the metal support has pores having an average mouth diameter of the surface of from 0 to 30 nm and an average diameter of the bottom area of from 20 to 300 nm, the range of the void ratio of the anodic oxide film becomes appropriate, the heat insulating property of the anodic oxide film is improved, the heat generated by laser irradiation can be efficiently used in image-forming without dissipating to the metal support, and so the lithographic printing plate precursor of the present invention is provided with high sensitivity. Further, a phenomenon of residual color caused by the dyes, which are light-sensitive layer (e.g., image forming layer) components, entered into the pores of the anodic oxide film and a phenomenon of residual film caused by the binders, which are also light-sensitive layer components, entered into the pores hardly occur. In addition, since adjacent pores do not form a multi-pore and extreme lowering of the anodic oxide film strength does not occur, therefore, smearing due to peeling off of the film and the deterioration of press life are not generated. That is, the lithographic printing plate precursor according to the present invention is excellent in smearing resistance and press life.

Further, it is preferred that sealing treatment is performed on the surface mouth areas of the pores of the anodic oxide film of the lithographic printing plate precursor of the present invention to lessen the average pore diameter of the surface mouth areas. In that case, since pore density is reduced as a result of sealing treatment to cover the surface of the anodic oxide film, the pore density is reduced and pile driving effect that an image-forming layer enters into the pores is reduced, thereby an adhesive force is decreased. It is preferred that the metal support is subjected to electrolytic surface roughening treatment before performing anodic oxidation treatment for compensating for the reduction of adhesive force.

It is also preferred that the thickness of the surface mouth area of the pore diameter of from 0 to 30 nm of the anodic oxide film is from 10 to 500 nm and the thickness of the area having the maximum inside diameter of from 20 to 300 nm is from 100 to 2,000 nm, the pore density of the surface area of the anodic oxide film is preferably 2,500/$\mu m^2$ or less, and the void ratio of the anodic oxide film is preferably from 20 to 70%.

It is sufficient that the pore diameter of the surface mouth area of the anodic oxide film of the lithographic printing plate precursor of the present invention should be from 0 to 30 nm, preferably from 5 to 20 nm. When it exceeds 30 nm, an image forming layer and a sealing agent enter into the inside of the pore, as a result, the background smearing (i.e., scumming), the ink eliminability and the developing property on machine (also, called "the on-press developing property) are lowered.

It is sufficient that the maximum inside diameter of the anodic oxide film of the lithographic printing plate precursor of the present invention should be from 20 to 300 nm, preferably from 40 to 200 nm. When it is less than 20 nm, the void ratio is lowered, the sensitivity is inferior and the press life is decreased. While when it exceeds 200 nm, the strength of the anodic oxide film itself is lowered and the press life is deteriorated.

Further, the thickness of the surface mouth area of the pore diameter of from 0 to 30 nm of the anodic oxide film is from 10 to 500 nm, preferably from 50 to 300 nm. When the thickness is less than 10 nm, scratch resistance is sometimes reduced, while when it exceeds 500 nm, disadvantageously high production costs (mainly electric cost) are required for the quality.

The thickness of the area having the maximum inside pore diameter of from 20 to 300 nm of the anodic oxide film is preferably from 100 to 2,000 nm, more preferably from 500 to 1,500 nm. When it is less than 100 nm, sensitivity is sometimes reduced, resulting in the reduction of press life, while when it exceeds 2,000 nm, disadvantageously high production costs (mainly electric cost) are required for the quality.

The pore density of the surface area of the anodic oxide film is preferably 2,500/$\mu m^2$ or less, more preferably from 500 to 2,000/$\mu m^2$. When the pore density exceeds 2,500/$\mu m^2$, scratch resistance is sometimes reduced.

The void ratio of the anodic oxide film is preferably from 20 to 70%, more preferably from 30 to 50%. When the void ratio is less than 20%, sensitivity is sometimes reduced, resulting in the reduction of press life, while when it exceeds 70%, scratch resistance is sometimes reduced.

The lithographic printing plate precursor according to the present invention is described in detail below.

Metal Support

Various kinds of metals can be used as the metal support of the lithographic printing plate precursor of the present invention. Aluminum, copper, stainless steel and plated steel sheet are preferably used. Inexpensive aluminum is most preferably used for its excellent corrosion preventing property, recycling property and handleability due to light weight.

As the aluminum materials for this purpose, JIS1050 materials, JIS1100 materials, JIS1070materials, Al—Mn alloys, Al—Mn—Mg alloys, Al—Zr alloys and Al—Mg—Si alloys are used.

With respect to JIS1050 materials, the techniques developed by the present inventors are disclosed in JP-A-59-153861 (the term "JP-A" as used herein means an "unexamined published Japanese patent application"), JP-A-61-51395, JP-A-62-146694, JP-A-60-215725, JP-A-60-215726, JP-A-60-215727, JP-A-60-216728, JP-A-61-272367, JP-A-58-11759, JP-A-58-42493, JP-A-58-221254, JP-A-62-148295, JP-A-4-254545, JP-A-4-165041, JP-B-3-68939 (the term "JP-B" as used herein means an "examined Japanese patent publication"), JP-A-3-234594, JP-B-1-47545 and JP-A-62-140894. The techniques disclosed in JP-B-1-35910 and JP-B-55-28874 are also known.

With respect to JIS1070 materials, the techniques developed by the present inventors are disclosed in JP-A-7-81264, JP-A-7-305133, JP-A-8-49034, JP-A-8-73974, JP-A-8-108659 and JP-A-8-92679.

With respect to Al—Mg alloys, the techniques developed by the present inventors are disclosed in JP-B-62-5080, JP-B-63-60823, JP-B-3-61753, JP-A-60-203496, JP-A-60-203497, JP-B-3-11635, JP-A-61-274993, JP-A-62-23794, JP-A-63-47347, JP-A-63-47348, JP-A-63-47349, JP-A-64-1293, JP-A-63-135294, JP-A-63-87288, JP-B-4-73392, JP-B-7-100844, JP-A-62-149856, JP-B-4-73394, JP-A-62-181191, JP-B-5-76530, JP-A-63-30294 and JP-B-6-37116. The techniques disclosed in JP-A-2-215599 and JP-A-61-201747 are also known.

With respect to Al—Mn alloys, the techniques developed by the present inventors are disclosed in JP-A-60-230951, JP-A-1-306288 and JP-A-2-293189. Al—Mn alloys are also disclosed in JP-B-54-42284, JP-B-4-19290, JP-B-4-19291, JP-B-4-19292, JP-A-61-35995, JP-A-64-51992, JP-A-4-226394, U.S. Pat. Nos. 5,009,722 and 5,028,276.

With respect to Al—Mn—Mg alloys, the techniques developed by the present inventors are disclosed in JP-A-62-86143 and JP-A-3-222796. In addition to the above, Al—Mn—Mg alloys are also disclosed in JP-B-63-60824, JP-A-60-63346, JP-A-60-63347, JP-A-1-293350, EP 223737, U.S. Pat. No. 4,818,300 and British Patent 1,222,777.

With respect to Al—Zr alloys, the techniques developed by the present inventors are disclosed in JP-B-63-15978 and JP-A-61-51395. Besides the above, Al—Zr alloys are disclosed in JP-A-63-143234 and JP-A-63-143235.

Al—Mg—Si alloys are disclosed in British Patent 1,421,710.

An aluminum or aluminum alloy sheet (or plate) for use as the support of a lithographic printing plate precursor is generally produced by subjecting the molten aluminum alloys containing the above-described components and the rates of alloy components to ordinary purification treatment and then cast.

For the purification treatment to remove unnecessary gas in molten metals such as hydrogen, the following treatments are performed, e.g., fluxing, degassing using an argon gas and a chlorine gas, filtering using rigid medium filters such as ceramic tube filters and ceramic foam filters, and filters using alumina flakes and alumina balls as filter media, and filtering using a glass cloth filter, or degassing and filtering in combination. It is preferred to perform purification treatment to prevent hindrance due to foreign matters in molten metals, e.g., nonmetallic inclusions and oxides, and to prevent hindrance due to gases entered into molten metals. Filtering of molten metals is disclosed in JP-A-6-57432, JP-A-3-162530, JP-A-5-140659, JP-A-4-231425, JP-A-4-276031, JP-A-5-311261 and JP-A-6-136466. Degassing of molten metals is disclosed in JP-A-5-51659 and JP-A-5-49148. The technique of degassing developed by the present inventors is disclosed in JP-A-7-40017.

Casting is performed using the thus-purified molten metals. As the casting method, there are a method of using a solid casting mold represented by DC casting and a method of using a driving casting mold represented by continuous casting. When DC casting is used, the molten metal solidifies at cooling velocity of from 0.5to 30° C./second. When the cooling velocity is less than 0.5° C./second, many coarse intermetallic compounds are formed. In continuous casting, methods of using cooling rolls represented by a Hunter method and a 3C method, and methods of using cooling belts and cooling blocks represented by a Hazelett method and an Alswiss caster II type are industrially used. When continuous casting is used, the molten metal solidifies at cooling velocity of from 100 to 1,000° C./second. In general, since the cooling velocity in continuous casting is faster than that in DC casting, the degree of solid solubility of alloy content to aluminum matrix can be made high. With respect to continuous casting, the techniques developed by the present inventors are disclosed in JP-A-3-79798, JP-A-5-201166, JP-A-5-156414, JP-A-6-262203, JP-A-6-122949, JP-A-6-210406 and JP-A-6-26308. An ingot having a thickness of from 300 to 800 mm can be produced by DC casting.

The ingot is subjected to scalping by general methods, and from 1 to 30 mm, preferably from 1 to 10 mm, of the surface layer is cut, if necessary.

Before and after scalping, if necessary, the ingot is subjected to soaking treatment. When the ingot undergoes soaking treatment, the ingot is subjected to heat treatment at 450 to 620° C. for 1 to 48 hours, so that intermetallic compound is not coarsened. When the heat treatment is shorter than 1 hour, the effect of soaking treatment cannot be obtained sufficiently.

In the next place, the ingot is subjected to hot rolling and cold rolling to make an aluminum rolled sheet. Before or after or during hot rolling, intermediate annealing may be performed. In this case, crystal structure can be made fine by heating on the intermediate annealing conditions of heating at 280 to 600° C. for 2 to 20 hours, preferably from 350 to 500° C. for 2 to 10 hours, in a batch furnace, or at 10 to 200° C./second of the temperature increasing velocity in a continuous furnace.

The plane surface property of the aluminum sheet finished in thickness of from 0.1 to 0.5 mm through the above processes may be improved by correcting apparatus, such as a roller leveler or a tension leveler. The improvement of a plane surface property way be performed after the aluminum sheet is cut to a sheet, but it is preferred to perform the improvement of a plane surface property in the state of being wound up in coils to increase the productivity.

For cutting the aluminum sheet in a prescribed width, the sheet may be provided with a slitter line. Further, a thin oil film may be provided on the surface of the aluminum sheet for preventing the generation of scratches due to the friction of aluminum sheets with each other. A volatile or non-volatile oil film is arbitrarily used according to necessity.

With respect to cold rolling, the techniques developed by the present inventors are disclosed in JP-A-6-210308. When continuous casting is performed, a cast plate having a thickness of from 1 to 10 mm can be directly continuously cast by using, e.g., cooling rolls by a Hunter method, by which method a hot rolling process can be omitted. Further, when cooling rolls by a Hazelett method are used, a cast plate having a thickness of from 10 to 50 mm can be cast and, in general, a continuously cast rolled plate having a thickness of from 1 to 10 mm can be obtained by continuously rolling by arranging hot rolling rolls immediately after casting. These continuously cast rolled plates are finished in thickness of from 0.1 to 0.5 mm through processes of cold rolling, intermediate annealing, improvement of a plane surface property and slitting in the same manner as described in DC casting. With respect to intermediate annealing conditions and cold rolling conditions in the case of using continuous casting, the techniques developed by the present inventors are disclosed in JP-A-6-220593, JP-A-6-210308, JP-A-7-54111 and JP-A-8-92709.

When the thus-produced aluminum sheet is used as the support of a lithographic printing plate precursor, the following various characteristics are required according to purposes.

Regarding Strength

For obtaining the nerve strength (as defined in JIS K6200) necessary as the support for a printing plate, it is preferred that 0.2% offset stress is 140 MPa or more. For obtaining a certain degree of firm strength when burning treatment is performed, it is preferred that 0.2% offset stress after burning at 270° C. for 3 to 10 minutes is 80 MPa or more, preferably 100 MPa or more. When nerve strength of a support is particularly required, aluminum sheets containing Mg and Mn can be used but such sheets are inferior in fitting property to the plate cylinder of a printing machine, accordingly materials and the addition amounts of minor components are arbitrarily selected according to purposes. With respect to this item, the techniques developed by the present inventors are disclosed in JP-A-7-126820 and JP-A-62-140894.

Regarding Crystal Structure

When an aluminum sheet is subjected to chemical surface treatment or electrochemical surface treatment as the support for a lithographic printing plate, surface quality failure due to the crystal structure of the surface of the aluminum sheet is sometimes generated, therefore surface crystal structure is preferably not very coarse. The width of crystal structure is generally 200 μm or less, preferably 100 μm or less, and more preferably 50 μm or less. The length of crystal structure is generally 5,000 μm or less, preferably 1,000 μm or less, and more preferably 500 μm or less. With respect to this item, the techniques developed by the present inventors are disclosed in JP-A-6-218495, JP-A-7-39906 and JP-A-7-124609.

Regarding Alloy Component Distribution

When an aluminum sheet is subjected to chemical surface treatment or electrochemical surface treatment as the support for a lithographic printing plate, surface quality failure due to uneven distributions of the alloy components of the surface of an aluminum sheet is sometimes generated. Therefore, distributions of the alloy components of the surface is preferably not very uneven. With respect to this item, the techniques developed by the present inventors are disclosed in JP-A-6-48058, JP-A-5-301478 and JP-A-7-132689.

Regarding Intermetallic Compound

When an aluminum sheet is subjected to chemical surface treatment or electrochemical surface treatment as the support for a lithographic printing plate, the aluminum sheet is sometimes affected by the sizes and densities of intermetallic compounds. With respect to this item, the techniques developed by the present inventors are disclosed in JP-A-7-138687 and JP-A-4-254545.

The style of the package of an aluminum sheet is, for example, such that hardboard and a felt pad are laid in an iron pallet, a corrugated doughnut board is applied to both ends of the product, the whole is packaged with a plastic tube, a wooden doughnut is inserted into the bore part of the coil, a felt pad is applied around the circumference of the coil, the coil is cramped with iron hoops, and indication of the product is attached on the circumference. A polyethylene film is used as the package material, and needle felt and hardboard are used as the cushioning material. There are various styles besides the above but it is important that the product can be transported stably without damaging.

These aluminum sheets are subjected to the following surface treatment. The representative pre-treatments are the removal of a rolling oil from the surface of the sheet with solvents, e.g., trichlene and surfactants and the exposure of a clean aluminum surface of the sheet with alkali etchants, e.g., sodium hydroxide and potassium hydroxide. Specifically, as the solvent degreasing method, there are a method of using a petroleum solvent, e.g., gasoline, kerosene, benzene, solvent napththa and normal hexane, and a method of using a chlorine solvent, e.g., trichloroethylene, methylene chloride, perchloroethylene and 1,1,1-trichloroethane. As the alkali degreesing method, there are a method of using an aqueous solution of sodium salt, e.g., sodium hydroxide, sodium carbonate, sodium bicarbonate and sodium sulfate, a method of using an aqueous solution of silicate, e.g., sodium orthosilicate, sodium metasilicate, sodium disilicate and disodium trisilicate, and a method of using an aqueous solution of phosphate, e.g., sodium primary phosphate, sodium tertiary phosphate, sodium secondary phosphate, sodium tripolyphosphate, sodium pyrophosphate, and sodium hexametaphosphate. When the alkali degreasing method is used, there is the possibility that the surface of an aluminum sheet is dissolved according to the processing time and the processing temperature, therefore, it is necessary that the degreasing treatment is not accompanied by a dissolution phenomenon. In the degreasing method by surfactants, the aqueous solutions of an anionic surfactant, a cationic surfactant, a nonionic surfactant and an ampholytic surfactant are used, and various commercially available products can be used. As the methods of degreasing, an immersion method, a blasting method, and a rubbing method of rubbing an aluminum sheet with a cloth impregnated with a solution can be used. Ultrasonic waves can be used in an immersion method and a blasting method. With respect to the degreasing methods, for instance, JP-A-2-26793 can be referred to.

It is preferred for the above metal support to undergo mechanical surface roughening treatment, chemical dissolution treatment i, electrolytic surface roughening treatment and chemical dissolution treatment ii in this order as disclosed in JP-A-11-87675.

Mechanical Surface Roughening Treatment

Mechanical surface roughening treatment is performed by methods of transfer, brushing and liquid honing, and these methods can be used in combination taking the productivity into consideration. Various methods can be used as a transfer method of pressing the uneven surface of a transfer roll to an aluminum sheet. That is, the techniques disclosed in JP-A-55-74898, JP-A-60-36195 and JP-A-60-203496, further, Japanese Patent Application No. 4-175945 which specifies to perform transfer several times, and JP-A-6-24168 in which the surface of a transfer roll is elastic, are applicable to the transfer method. Transfer may be performed repeatedly with a roll having minute concavities and convexities etched by electric discharge machining, shot blast, laser or plasma etching, or the surface of a roll having minute concavities and convexities coated with fine particles is be brought into contact with an aluminum sheet, pressure is applied onto the roll repeatedly to transfer the pattern of the concavities and convexities corresponding to the average diameter of the fine particles to the aluminum sheet, and this procedure may be repeated several times. The method of providing minute concavities and convexities on transfer rolls are disclosed in JP-A-3-8635, JP-A-3-66404 and JP-A-63-65017. Further, square-shaped concavities and convexities may be provided on the surface of a roll by forming minute grooves from two directions with dies, bites or lasers. The corners of the thus-formed square-shaped convexities may be rounded off by well-known etching treatments. It is of course possible to perform hardening and hard chrome plating to increase the hardness of the surface.

Showing an example of mechanical surface roughening treatment using a brush, an abrasive slurry is uniformly sprayed on a traveling aluminum sheet and a brush roll is rotated on the surface to effect mechanical surface roughening treatment. The surface roughening treatment by the spraying of an abrasive slurry and a brush roll can be performed at two or more places. When a brush is used, it is preferred to use brush hair having a modulus of elasticity by bending of from 10,000 to 40,000 $kg/cm^2$, preferably from 15,000 to 35,000 $kg/cm^2$, and the strength of the hair is 500 g or less, preferably 400 g or less, and abrasives having a particle diameter of from 20 to 80 $\mu$m, preferably from 30 to 60 $\mu$m. The materials of the brush are preferably provided with the above mechanical strength but those having the mechanical strength other than the above can also be used, for example, the materials can be arbitrarily selected from synthetic resins and metals. As the synthetic resins, polyamides, e.g., nylon; polyolefins, e.g., polypropylene; polyesters, e.g., polyvinyl chloride and polybutylene terephthalate; and polycarbonate can be used. As the metals, stainless steel and brass can be used. The abrasives also preferably have a particle diameter of the above range but the materials are not limitative, and can be selected from among the abrasives heretofore in use for surface roughening treatment, e.g., alumina, silica, silicon carbide and silicon nitride. Mechanical surface roughening treatment is performed by pressing a roll brush having the above brush hair against the surface of an aluminum sheet while rotating at high speed with supplying the abrasive to the roll brush. The number of revolutions of the roll brush, the pressing force and the feeding rate of the abrasive at this time are not particularly restricted. The apparatus preferably used for the above mechanical surface roughening treatment is disclosed in JP-B-50-40047.

For obtaining Ra (center line average surface roughness as defined JIS B 0601) of from 0.1 to 0.5 $\mu$m, a combination of a fine nylon brush (No. 0.9 to No. 3) and a fine abrasive (average particle size: from 10 to 30 $\mu$m, pumice and silica sand) is particularly preferred.

Chemical Dissolution Treatment i

After mechanical surface roughening treatment has been performed in the manner as described above, the surface of the aluminum sheet is subjected to chemical etching treatment with an alkali solution having pH of 11 or more, preferably 13 or more, for the purpose of making the aluminum sheet smooth and uniform.

The process of chemical etching treatment of the surface of an aluminum sheet is performed bypassing a traveling aluminum sheet through an etching tank with spraying an alkali solution (an etching solution mainly comprising sodium hydroxide) uniformly in the transverse direction of the sheet in the etching tank to effect etching of the surface. When the aluminum sheet comes out of the etching tank, the surface of the aluminum sheet is wiped with nipping rolls for preventing the treating solution from being carried out of the tank.

The amounts and concentrations of the components are varied during etching, i.e., the sodium hydroxide component in the treating solution is decreased by the reaction, the aluminum ion content is increased and water is reduced by evaporation. Accordingly, a sodium hydroxide solution and water are replenished to the treating solution in the solution-preparing tank, but it is unavailing to maintain the aluminum ions in the treating solution in a prescribed concentration by the replenisher without reducing the increasing aluminum ions. Therefore, a part of the treating solution in the solution-preparing tank is arbitrarily fed to a diffusion dialysis tank and a part of the treating solution circulating in use us fed to a precipitation tank to remove aluminum ions from the system. In the diffusion dialysis tank, about 70% of the fed treating solution is recovered as a sodium hydroxide solution and returned to the solution-preparing tank. On the other hand, the waste solution dialyzed in the diffusion dialysis tank becomes a supersaturated sodium aluminate solution and introduced to the precipitation tank. Water can be added to the diffusion dialysis tank for compensating for the evaporated water. The dialyzed waste solution from the diffusion dialysis tank and the treating solution from the solution-preparing tank are mixed in the precipitation tank, and aluminum hydroxide is crystallized from the mixed solution with the seed of the aluminum hydroxide in the supersaturated sodium aluminate solution as a nucleus. The mixture of the treating solution mainly comprising a sodium hydroxide solution from which aluminum ions have been removed and the aluminum hydroxide crystals is fed to a thickener. The crystallized aluminum hydroxide is subjected to syneresis by a drum filter and collected in a hopper. On the other hand, the treating solution mainly comprising a sodium hydroxide solution is returned as a recovered solution to the solution-preparing tank.

As the method of recovering a treating solution, a method of crystallization may be used other than a method of using diffusion dialysis. The etching weight in chemical etching treatment is from 3 $g/m^2$ to 25 $g/m^2$, preferably from 3 $g/m^2$ to 15 $g/m^2$. When the etching weight is less than 3 $g/m^2$, concavities and convexities formed by mechanical surface roughening treatment cannot be smoothed and uniform pits cannot be formed in the later electrolytic treatment. On the other hand, when the etching weight exceeds 25 $g/m^2$, the concavities and convexities are vanished. As usable alkali solutions, an aqueous solution of sodium salt such as sodium hydroxide, sodium carbonate, sodium bicarbonate and sodium sulfate, an aqueous solution of silicate, e.g., sodium orthosilicate, sodium metasilicate, sodium disilicate and disodium trisilicate, and an aqueous solution of phosphate, e. g., sodium primary phosphate, sodium secondary phosphate, sodium tertiary phosphate, sodium tripolyphosphate, sodium pyrophosphate and sodium hexametaphosphate are exemplified. As treatment conditions, the concentration of an alkali solution is from 0.01 to 50% wt %, the temperature is from 20 to 90° C., and the time is from 5 seconds to 5 minutes, and these conditions are arbitrarily selected so that the etching weight falls within the above range.

As a result of chemical etching of the surface of an aluminum sheet with the above alkali solution, an insoluble residue, i.e., smut, is formed on the surface of the sheet, which is removed with an acid solution having the same composition as the acid solution which is used in the later electrolytic surface roughening treatment. The preferred treatment conditions are the temperature of from 30 to 80° C. and the time of from 3 seconds to 3 minutes.

The thus-treated aluminum sheet is subjected to electrolytic surface roughening treatment.

Electrolytic Surface Roughening Treatment

The electrolytic surface roughening treatment in the present invention is not particularly restricted, but it is preferred to perform the first and second electrolytic treatments in an acid solution by alternating wave electric current before and after cathode electrolytic treatment as disclosed in JP-A-11-84675. Smut is formed on the surface of the aluminum sheet due to cathode electrolytic treatment and, at the same time, a hydrogen gas is generated, thus more uniform electrolytic surface roughening becomes possible. In the first place, the first and second electrolytic surface roughening treatments in an acid solution by alternating wave electric current will be explained. The first treatment and the second treatment of the electrolytic surface roughening treatment may be performed on the same condition or may be different from each other within the preferred range of conditions.

One example of the electrolytic surface roughening treatment of an aluminum support comprising a first and second electrolytic surface roughening treatments is shown below. The apparatus for use in the electrolytic surface roughening treatment of an aluminum support comprises a first surface roughening unit for electrolytically roughening the surface of an aluminum support, a second surface roughening unit for electrolytically roughening the surface of the aluminum support, and a back surface roughening unit for electrolytically roughening the back surface of the aluminum support. These surface roughening units and back surface roughening unit are provided with a pair of circular main electrodes connected to an electrolytic cell via ac power, and a rotatable drum roll is arranged above each main electrode. An electrolyte is filled between the main electrode and the drum roll. Between the first surface roughening unit and the second surface roughening unit and between the second surface roughening unit and the back surface roughening unit, a plurality of passing rolls are arranged at prescribed positions, to thereby form a path of the aluminum support. The path between the second surface roughening unit and the back surface roughening unit makes, in the back surface roughening unit, a reverse path to reverse the aluminum support so that the front surface comes to be contact with the drum roll and the back surface is immersed in the electrolyte. The reverse path is provided with a plurality of sprayers for spraying electrolyte to the aluminum support.

For producing the aluminum support by the above-described apparatus, the aluminum support is traveled with applying electric power to each main electrode of the surface roughening units. With the application of electric power, the front surface of the aluminum support is continuously surface-roughened in the first surface roughening unit and the second surface roughening unit. The aluminum support whose front surface has undergone surface roughening treatment passes through the reverse path and sent to the back surface roughening unit in a reversed state so that the front surface comes to be contact with the drum roll of the back surface roughening unit and the back surface is immersed in the electrolyte. The aluminum support is maintained always in a wet state by being sprayed with electrolyte from a plurality of sprayers during traveling through the reverse path.

This electrolytic surface roughening treatment can follow the electrochemical graining methods as disclosed, e.g., in JP-B-48-28123 and British Patent 896,563. This electrolytic graining method uses sine wave alternating current but specific wave forms such as those disclosed in JP-A-52-58602 may be used. Wave forms as disclosed in JP-A-3-79799 can also be used. Various methods such as those disclosed in JP-A-55-158298, JP-A-56-28898, JP-A-52-58602, JP-A-52-152302, JP-A-54-85802, JP-A-60-190392, JP-A-58-120531, JP-A-63-176187, JP-A-1-5889, JP-A-1-280590, JP-A-1-118489, JP-A-1-148592, JP-A-1-178496, JP-A-1-188315, JP-A-1-154797, JP-A-2-235794, JP-A-3-260100, JP-A-3-253600, JP-A-4-72079, JP-A-4-72098, JP-A-3-267400, and JP-A-1-141094 can also be referred to. Frequencies suggested in electrolytic condenser can also be used in addition to the above, e.g., those disclosed in U.S. Pat. Nos. 4,276,129 and 4,676,879.

As the acid solution which is an electrolyte, besides nitric acid and hydrochloric acid, the electrolytes disclosed in U.S. Pat. Nos. 4,671,859, 466,576, 4,661,219, 4,618,405, 462,628, 4,600,482, 4,566,960, 4,566,958, 4,566,959, 4,416,972, 4,374,710, 4,336,113, and 4,184,932 can also be used. The concentration of an acid solution is preferably from 0.5 to 2.5 wt % but from 0.7 to 2.0 wt % is especially preferred taking into consideration the use in the above smut removal. The temperature of the solution is preferably from 20 to 80° C. and particularly preferably from 30 to 60° C.

Various electrolytic cells and electric sources are suggested, e.g., those disclosed in the following patents: U.S. Pat. No. 4,203,637, JP-A-56-123400, JP-A-57-59770, JP-A-53-12738, JP-A-53-32821, JP-A-53-32822, JP-A-53-32823, JP-A-55-122896, JP-A-55-132884, JP-A-62-127500, JP-A-1-52100, JP-A-1-52098, JP-A-60-67700, JP-A-1-230800, and JP-A-3-257199. In addition to the above, e. g., electrolytic cells and electric sources disclosed in the following patents can also be applied to the present invention: JP-A-52-58602, JP-A-52-152302, JP-A-53-12738, JP-A-53-12739, JP-A-53-32821, JP-A-53-32822, JP-A-53-32833, JP-A-53-32824, JP-A-53-32825, JP-A-54-85802, JP-A-55-122896, JP-A-55-132884, JP-B-48-28123, JP-B-51-7081, JP-A-52-133838, JP-A-52-133840, JP-A-52-133844, JP-A-52-133845, JP-A-53-149135, and JP-A-54-146234.

The electrolytic treatment is carried out with the quantity of the anode electricity of from 30 to 400 $C/dm^2$, preferably from 50 to 200 $C/dm^2$. If the quantity of the anode electricity is less than 30 $C/dm^2$, uniform pits cannot be formed. On the other hand, if it exceeds 400 $C/dm^2$, pits become too large.

The aluminum sheet undergoes cathode electrolytic treatment during the above first and second electrolytic surface roughening treatments. Smut is formed on the surface of the aluminum sheet due to the cathode electrolytic treatment and, at the same time, a hydrogen gas is generated, thus more uniform electrolytic surface roughening becomes possible.

The cathode electrolytic treatment is performed in an acid solution with the quantity of the cathode electricity of from 3 to 80 $C/dm^2$, preferably from 5 to 30 $C/dm^2$. If the quantity of the cathode electricity is less than 3 $C/dm^2$, the smut adhesion amount is insufficient, while when it exceeds 80 $C/dm^2$, smut excessively adheres to the aluminum sheet surface, which is disadvantageous. The electrolyte used at this time may be the same as or different from the solution used in the first and the second electrolytic surface roughening treatments.

Chemical Dissolution Treatment ii

After the second electrolytic surface-roughening treatment, the aluminum sheet is subjected to the second chemical etching treatment using an alkali solution having pH of 11 or higher. The alkali solution having pH of 11 or higher used in the second chemical etching treatment may be the same as or different from the alkali solution used in the above-described first chemical etching treatment. However, the etching weight is different from that in the first chemical etching treatment, and is generally from 0.1 to 8 $g/m^2$, preferably from 0.2 to 3.0 $g/m^2$, and still more preferably from 0.5 to 1.5 $g/m^2$. When the etching weight is less than 0.1 $g/m^2$, the edge part of the pit obtained by the electrolytic treatment cannot be smoothed, while when it exceeds 8 $g/m^2$, pits are vanished.

The smut generated by the above chemical etching treatment is removed from the aluminum sheet with a solution mainly comprising a sulfuric acid. "A solution mainly comprising a sulfuric acid" means a mixed solution containing a phosphoric acid, a nitric acid, a chromic acid or a hydrochloric acid appropriately, as well as a solution comprising a sulfuric acid alone. As for the smut removal using a solution mainly comprising a sulfuric acid, JP-A-53-12739 can be referred to. Alkali treatment may be combined with the removal of smut and JP-A-56-51388 can be referred to, for instance. The methods disclosed in the following patents may also be used together, e.g., JP-A-60-8091, JP-A-63-176188, JP-A-1-38291, JP-A-1-127389, JP-A-1-188699, JP-A-3-177600, JP-A-3-126891 and JP-A-3-191100.

Anodic Oxidation Treatment

An anodic oxide film is then formed on the surface of the aluminum sheet. One example of an anodic oxidation treatment step of the aluminum sheet is described below. The aluminum sheet is transported and charged in plus (+) by an electric power supplying electrode in an electric power supplying tank where an electrolyte is reserved. The aluminum sheet is transported toward an electrolytic treating tank. The aluminum sheet is then charged in minus (−) by an electrolytic electrode, thereby an anodic oxide film is formed on the surface of the aluminum sheet, and the aluminum sheet came out of the electrolytic treating tank is transported to the post step. The electric power supplying electrode and the electrolytic electrode are connected to direct current electric source. With these anodic oxidation treatment apparatus, an anodic oxide film can be formed by turning on an electric current to the aluminum sheet as the anode in a solution of the concentration of sulfuric acid of from 50 to 300 g/liter and aluminum concentration of 5 wt % or less. A phosphoric acid, a chromic acid, an oxalic acid, a sulfamic acid or a benzenesulfonic acid may be mixed in the above solution. It is preferred that the amount of the anodic oxide film to be formed is from 1.0 to 5.0 $g/m^2$, particularly preferably from 1.5 to 4.0 $g/m^2$. The treatment conditions of anodic oxidation vary according to the electrolytes to be used hence cannot be mentioned unconditionally but in general the concentration of an electrolyte is from 1 to 80 wt %, the temperature of the solution is from 5 to 70° C., the electric current density is from 0.5 to 60 $A/dm^2$, the voltage is from 1 to 100 V, and the time of electrolysis is from 15 seconds to 50 minutes, and conditions are adjusted so as to obtain the above pore structure.

It is known that if the kind of the electrolyte is the same, the diameter of the pore generated by electrolysis is proportional to electrolytic voltage. The pore having a pore diameter larger at the bottom than at the mouth portion can be obtained by gradually increasing the electrolytic voltage by utilizing this nature.

It is also known that when different kinds of electrolytes are used, the pore diameters largely vary. Generally speaking, the sizes of the pore diameters take the following order: that is, the pore diameter formed by a sulfuric acid electrolyte<the pore diameter formed by an oxalic acid electrolyte<the pore diameter formed by a phosphoric acid electrolyte. Accordingly, it is possible to obtain an anodic oxide film by using two or three treatment apparatus and exchanging the electrolyte and continuously treating in two or three stages.

In the present invention, evaluations were performed by the method of using a phosphoric acid electrolyte with gradually increasing the electrolytic voltage, and the method of using a sulfuric acid in the first stage and a phosphoric acid in the second stage to thereby form an anodic oxide film having a pore diameter larger at the bottom with maintaining the pore diameter at the surface mouth portion. However, the present invention is not limited thereto.

Determining Method of Anodic Oxide Film Amount

The amount of an anodic oxide film is proportional to the quantity of electricity. The quantity of electricity is in the relationship of the following equation 1:

$$\text{Quantity of electricity (Coulomb}/m^2\text{)} = \text{electric current } (A/m^2) \times \text{treating time (second)}$$

Accordingly, in the case of constant current, the treating time corresponding to a desired anodic oxide film amount can be determined by electrolyzing with varying treating time, measuring the film amount according to JIS-H8680-7 (a film weight measuring method) and forming a calibration curve.

However, since JIS-H8680-7 (a film weight measuring method) is a test method using an aqueous solution of a poison such as chromic acid by boiling, this method is unstable and takes time. Therefore, as a simple method, the measurement can be performed by substituting with a fluorescent X-ray analyzer. That is, a film weight can be obtained by measuring a part of the sample for a calibration curve by JIS-H8680-7 (a film weight measuring method) and measuring the scattering strength by fluorescent X-ray analysis (Compton scattering curve of Lα-ray of Rh) with a part of the sample, to thereby form a calibration curve. The sample for a calibration curve in the Example of the present invention was subjected to ordinary anodic oxidation treatment using a sulfuric acid with changing the treating time (170 g/liter, 33° C., 5 $A/dm^2$) and electrolytic time was adjusted by fluorescent X-ray analysis so as to obtain a desired film amount.

Further, for simplicity, the same calibration curve formed by using a sulfuric acid was used in the present invention even when the electrolyte was changed to a phosphoric acid.

Measuring Method of Pore Diameter at Surface Mouth Area and Maximum Inside Diameter of Anodic Oxide Film A high resolution TEM (transmission electron microscope) and a super high resolution SEM (scanning electron microscope) can be used for observing film structure for the measurement of the pore diameter of an anodic oxide film at a mouth area and a maximum inside diameter. It is necessary to cut out an ultra-thin slice with a microtome for observation by TEM, and so it takes much time. Therefore, in general, it is preferred to use a super high resolution SEM. Hitachi S-900 (manufactured by Hitachi, Ltd.) was used in the Examples and Comparative Examples of the present invention.

The surface of the anodic oxide film was observed by 5 to 200,000 magnifications at relatively low accelerating voltage of 12 V without performing vacuum evaporation for giving electric conductivity. Fifty pores were selected by random sampling and the average value obtained therefrom was used as the pore diameter at the mouth area of the anodic oxide film. The standard deviation error was ±10% or less. The maximum inside diameter of the pore of the anodic oxide film was observed as follows: an aluminum sheet having been subjected to anodic oxidation treatment was bent and the side of the cracked part which was generated when the sheet was bent (usually called a broken out section) was observed with a super high resolution SEM (Hitachi S-900). The bottom area of the broken out section of the anodic oxide film was observed by appropriate magnifications at relatively low accelerating voltage of 12 V without performing vacuum evaporation for giving electric conductivity. Fifty pores were selected by random sampling and the average value obtained therefrom was used as the maximum inside diameter of the anodic oxide film. The standard deviation error was ±10% or less.

Sealing Treatment

Sealing treatment is treatment to seal the pores of a porous anodic oxide film with a metallic oxide, a hydroxide or a salt.

As representative sealing methods, there are a method of forming a sealing film by diluting water glass, e.g., sodium silicate or potassium silicate, coating or immersing a sheet, and then drying, and a method of preparing a sealing solution by adding a proper amount of a sealing agent to vapor or boiling water, and immersing or spraying a sheet, to thereby form a sealing film.

As representative sealing agents, sodium fluoride, calcium fluoride, potassium fluoride, magnesium fluoride, barium fluoride, chromium fluoride, lithium fluoride, manganese fluoride, nickel fluoride, iron fluoride, fluorophosphoric acid, ammonium fluorophosphate, potassium fluoroaluminate, sodium hexafluorozirconate, sodium hexafluorotitanate, potassium hexafluorotitanate, hexafluorozirconium hydroacid, hexafluorotitanium hydroacid, ammonium hexafluorotitanate, and hexafluorosilicic acid are exemplified, and these compounds can be used alone or in combination of two or more. Of these, sodium fluoride and potassium fluoride are particularly preferred. The concentration of these inorganic fluorine compounds in a treating solution is preferably from 0.1 to 40 wt %, preferably from 0.1 to 10 wt %. When the concentration is less than 0.1 wt %, comparatively large particles are formed and the effect of the object of sealing cannot be obtained and when it exceeds 40 wt %, the particles are too small or an aluminum sheet is easily subjected to etching, therefore not preferred.

Other phosphorus compounds which do not hinder the growth of particles and do not etch an aluminum sheet may be added to the above inorganic fluorine-containing treating solution, e.g., phosphoric acid, and aluminum salt, ammonium salt, sodium salt, potassium salt, calcium salt, zinc salt, magnesium salt and lithium salt of phosphoric acid are exemplified.

The specific examples of phosphorus compounds include zinc phosphate, aluminum phosphate, ammonium phosphate, diammonium hydrogenphosphate, ammonium dihydrogenphosphate, monoammonium phosphate, monopotassium phosphate, monosodium phosphate, potassium dihydrogenphosphate, dipotassium hydrogenphosphate, calcium phosphate, sodium ammonium hydrogenphosphate, diammonium hydrogenphosphate, magnesium hydrogenphosphate, magnesium phosphate, ferrous phosphate, ferricphosphate, sodium dihydrogenphosphate, sodium phosphate, disodium hydrogenphosphate, lead phosphate, diammonium phosphate, calcium dihydrogenphosphate, lithium phosphate, phosphorus tungstic acid, ammonium phosphorus tungstate, sodium tungstate phosphate, ammonium phosphomolybdate, and sodium phosphomolybdate. Further, phosphonic acids, e.g., sodium phosphite, sodium tripolyphosphate, sodium pyrophosphate, aminoethylphosphonic acid and phenylphosphonic acid can also be exemplified. Of these compounds, sodium dihydrogenphosphate, disodium hydrogenphosphate, potassium dihydrogenphosphate and dipotassium hydrogenphosphate are preferred. They can be used alone or in combination of two or more.

The concentration of these compounds in the case where they are added to a treating solution is preferably less than 50 wt %. When the concentration exceeds 50 wt %, they are dissolved with difficulty and hinder the formation of the particles having a preferred particle size, or the front and back surfaces of the anodic oxide film of an aluminum sheet are liable to be etched, which is not preferred. Preferred concentration is about 10 wt %.

As the sealing method, immersion, atomization, spraying and coating are preferably used. The treating temperature is preferably from 60 to 100° C., treating time is preferably from 30 to 300 seconds, and pH is preferably from 1.0 to 6.5. During performing this treatment, an aluminum sheet can be treated by turning on a DC or AC electric current to the aluminum sheet in the same manner as in anodic oxidation, and treating time can be shortened in this case. Further, if the treatment concentration is too high or the treating time is too long, too much product is produced, which causes smearing during printing and not preferred. The thus-treated support generally undergoes washing with water. If necessary, the support may be further treated.

As further preferred surface treatment, treatment by an aqueous solution of phosphoric acid and ammonium salt or alkali metal salt, treatment of providing an undercoating layer comprising water-soluble compounds, such as polyacrylic acid, polyvinyl alcohol, or polyvinyl phosphonic acid, and treatment of undercoating antihalation dyes or pigments can be exemplified.

A method of more strongly adhering the above-produced granular product to an aluminum support by hot water of 50° C. or higher and/or hot air treatment and water vapor treatment is preferred.

As sealing treatment, sealing treatment of exposing an aluminum support in a vapor atmosphere for 10 to 30 seconds and treatment of immersing an aluminum support in an aqueous solution of 0.1 wt % NaF/10 wt % $NaH_2PO_4$ (using pure water) at 90 to 100° C. for 10 to 30 seconds are preferred.

The optimal conditions of sealing amounts are preferably such that the surface mouth areas are not observed, petal-like and needle-like protrusions are not observed, and the surface mouth areas are almost flat when observation is performed by the observation method of the surface mouth areas of an anodic oxide film described above in the item of "Measuring method of pore diameter at surface mouth area and maximum inside diameter of anodic oxide film".

The surface of a metal support after being subjected to the above surface treatment preferably has a central line average surface roughness (Ra) of from 0.1 to 0.5 μm, and an average roughness (Rz) of from 1.0 to 5.0 μm. When Ra exceeds 0.5 μm, although the adhesion to an image-forming layer is improved, an image-forming layer is liable to reside in the concavities at the time of image formation by laser exposure, and so laser irradiation intensity is necessary to be heightened, which results in lowering of sensitivity, further, the reflected light at the interface between the image-forming layer and the support causes irregular reflection, resulting in thickening of dots, which causes the reduction of definition.

Measuring Method of Ra by Surface Roughness Meter

Center line surface roughness (defined in JIS B0601-1970) is preferably from 0.1 to 0.5 μm. To the central line surface roughness after being subjected to mechanical surface roughening treatment, chemical etching and desmutting treatment, the center line surface roughness obtained by adding electrochemical surface roughening treatment, chemical etching and desmutting treatment to the above surface roughening treatments is preferably from 0.9 to 1.5 times.

Image-forming Layer

The image-forming layer of the lithographic printing plate precursor according to the present invention contains a light/heat converting agent and is classified into the following four types.

Type I: The irradiated part with laser beams of the uppermost layer capable of image-forming is subjected to ablation and splashed in the air by heat and a metal layer appears as an uppermost layer. (An ablation positive type image-forming layer)

Type II: The uppermost layer capable of image-forming is decomposed or softened by heat and the property of the layer is transformed to be soluble in a developing solution or the film strength is extremely deteriorated, and thereafter the irradiated part with laser beams of the layer is removed in a development step. (A thermal positive type image-forming layer)

Type III: The uppermost layer capable of image-forming is polymerized or hardened by heat and the property of the layer is transformed to be insoluble in a developing solution or the film strength is extremely strengthened, and thereafter the non-irradiated part with laser beams of the layer is removed in a development step. (A thermal negative type image-forming layer)

Type IV: The uppermost layer capable of image-forming is polymerized or hardened by heat and the film strength is extremely strengthened, on the other hand, the non-irradiated part with laser beams of the layer is easily removed by water or rubbing. (A development on machine type thermal negative image-forming layer, i.e., a on-press development type thermal negative image-forming layer)

Ablation Positive Type Image-forming Layer

As the specific examples of type I, as inorganic substances, metals such as Cr, Ti, materials having hydrophobicity such as ternary alloys of Pb—Sb—Sn, etc., which are known as type metals, carbons such as coal, charcoal, diamond, DLC (diamond-like coating), graphite, and glassy carbon, oxide, nitride, silicide, and carbide can be exemplified. These compounds may be used not only as simple substances but also as mixtures.

Specifically, aluminum oxide, silicon oxide, titanium oxide, zirconium oxide, hafnium oxide, vanadiumoxide, niobium oxide, tantalum oxide, molybdenum oxide, tungsten oxide, and chromium oxide can be exemplified. Further, aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride and boron nitride can be exemplified. Further, titanium silicide, zirconium silicide, hafnium silicide, vanadium silicide, niobium silicide, tantalum silicide, molybdenum silicide, tungsten silicide and chromium silicide can be exemplified. Further, titanium boride, zirconium boride, hafnium boride, vanadium boride, niobium boride, tantalum boride, molybdenum boride, tungsten boride and chromium boride can be exemplified. Further, aluminum carbide, silicon carbide, titanium carbide, zirconium carbide, hafnium carbide, vanadium carbide, niobium carbide, tantalum carbide, molybdenum carbide, tungsten carbide and chromium carbide can be exemplified.

Even among inorganic substances, these inorganic substances are high in absorption rate of light having wavelength of from 760 to 1,064 nm such as YAG laser and LD laser, and they are such materials that layers capable of image-forming by heat are abraded.

Above all, Cr, Ti, Pb—Sb—Sn, diamond, DLC, $TiO_2$, $BaTiO_3$, $SrTiO_3$, $Si_3N_4$ and SiC which show affinity to ink are preferred. The layer capable of image-forming can be formed by methods such as vacuum evaporation, CVD, sol-gel, sputtering, ion-plating, diffusion, electrodeposition, metal plating, etc.

As is generally performed after ablation, a step of physical scraping with a brush, etc. may be used to remove residual substances.

As the specific examples of organic substances, PMMA (polymethyl methacrylate), EMA-styrene, polystyrene and novolak, which are generally known as polymers having affinity to ink, are exemplified. Since these polymers are low in absorption rate of the light of the laser wavelength for write (from 760 to 1,064 nm), it is necessary to dissolve, disperse or mix appropriate light/heat converting materials to the above polymers. As the light/heat converting materials (i.e., the compounds capable of converting light to heat), various kinds of commercially available YAG- and LD-absorbing dyes Cyabsorb IR-165 (manufactured by American Cyanamid), Epolight III-117, Epolight III-130, Epolight III-180, etc., can be used, and also the powders of the various inorganic substances described above as the specific examples of the inorganic substance of type I may be dispersed or mixed into the above polymers. For improving the adhesion of a support and an image-forming layer, various kinds of undercoating agent may be coated.

Thermal Positive Type Image-forming Layer

The thermal positive type image-forming layer of type II contains at least a high molecular compound which is transformed into alkali-soluble by heating and a light/heat converting material described in detail later.

As the high molecular compounds which are transformed into alkali-soluble by heating for use in the thermal positive type image-forming layer, resins having an acid radical such as a phenolic hydroxyl group or a carboxyl group are exemplified. As the resins having a phenolic hydroxyl group, resol type phenolic resins and novolak type phenolic resins are exemplified and novolak resins are preferred among them. The examples of the novolak resins preferably used in the present invention include, e.g., a phenol/formaldehyde resin, cresol/formaldehyde resins such as an m-cresol/formaldehyde resin, ap-cresol/formaldehyde resin, an o-cresol/formaldehyde resin, an m-/p-mixed cresol/formaldehyde resin, and phenol/cresol mixed (m-, p-, o-, and any of m-/p-, m-/o-, p-/o-mixture) formaldehyde resins.

Resol type phenolic resins are also preferably used in the present invention, e.g., phenol/cresol mixed (m-, p-, o-, and any of m-/p-, m-/o-, p-/o-mixture) formaldehyde resins are preferred, and the phenolic resins disclosed in JP-A-61-217034 are particularly preferred.

As other high molecular compounds which are transformed into alkali-soluble by heating, e.g., copolymers containing a carboxyl group can be exemplified. For example, copolymers with monomers having at least one or more unsaturated bond(s) polymerizable with a carboxyl group (a COOH group) in one molecule are preferred. As the monomers having a carboxyl group, a methacrylic acid, an acrylic acid and an itaconic acid are exemplified. In addition to the above, the monomers represented by following formula (I), (II) or (III) are also preferably used:

(I)

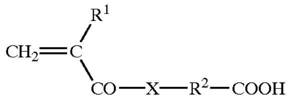

(II)

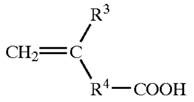

(III)

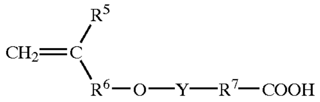

wherein $R^1$, $R^3$ and $R^5$ each represents a hydrogen atom or a methyl group; $R^2$, $R^4$, $R^6$ and $R^7$ each represents an alkylene group having from 1 to 12 carbon atoms which may have a substituent, a cycloalkylene group, an arylene group, or an aralkylene group; X represents —O— or —$NR^8$—; Y represents a single bond or a —CO— group; $R^8$ represents a hydrogen atom, an alkyl group having from 1 to 12 carbon atoms which may have a substituent, a cycloalkyl group, an aryl group, or an aralkyl group, specifically, N-(4-carboxyphenyl)methacrylamide, N-(2-carboxyphenyl) acrylamide, N-(4-chloro-2-carboxyphenyl)methacrylamide, 4-carboxyphenylethyl methacrylate, 4-carboxystyrene, 2-carboxyphenyloxyethyl acrylate can be exemplified.

As monomers which impart a property of being transformed into alkali-soluble by heating to high molecular compounds other than the above monomers having a carboxyl group, monomers comprising low molecular compounds having, in one molecule, one or more sulfonamido group(s) having at least one hydrogen atom bonded on the nitrogen atom and one or more polymerizable unsaturated bond(s) are preferred. Among these monomers, monomers comprising low molecular compounds having an acryloyl group, an allyl group or a vinyloxy group, and an unsubstituted or mono-substituted aminosulfonyl group or a substituted sulfonylamino group are preferred. The compounds represented by the following formula (IV), (V), (VI), (VII) or (VIII) can be exemplified as such a compound:

(IV)

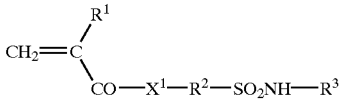

-continued (V)

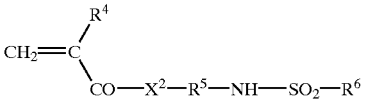

(VI)

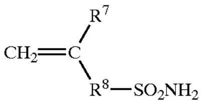

(VII)

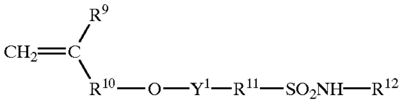

(VIII)

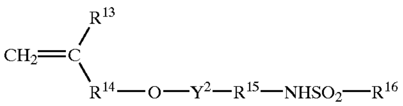

wherein $X^1$ and $X^2$ each represents —O— or —$NR^{17}$—; $R^1$ and $R^4$ each represents a hydrogen atom or —$CH_3$; $R^2$, $R^5$, $R^8$, $R^{11}$ and $R^{15}$ each represents an alkylene group having from 1 to 12 carbon atoms which may have a substituent, a cycloalkylene group, an arylene group, or an aralkylene group; $R^3$, $R^{17}$ and $R^{12}$ each represents a hydrogen atom, or an alkyl group having from 1 to 12 carbon atoms which may have a substituent, a cycloalkyl group, an aryl group, or an aralkyl group; $R^6$ and $R^{16}$ each represents an alkyl group having from 1 to 12 carbon atoms which may have a substituent, a cycloalkyl group, an aryl group, or an aralkyl group; $R^7$, $R^9$ and $R^{13}$ each represents a hydrogen atom or —$CH_3$; $R^{10}$ and $R^{14}$ each represents a single bond, or an alkylene group having from 1 to 12 carbon atoms which may have a substituent, a cycloalkylene group, an arylene group, or an aralkylene group; and $Y^1$ and $Y^2$ each represents a single bond or —CO—.

Specifically, m-aminosulfonylphenyl methacrylate, N-(p-aminosulfonylphenyl)methacrylamide, and N-(p-toluenesulfonyl)acrylamide are preferably used as such monomers.

As monomers other than the monomers represented by formula (IV), (V), (VI), (VII) or (VIII), monomers comprising low molecular compounds having, in one molecule, one or more active imino group(s) represented by —CO—NH—$SO_2$— and one or more polymerizable unsaturated bond(s) are preferred. Specifically, N-(m-aminosulfonyl) methacrylamide, N-(p-aminosulfonyl)methacrylamide, N-(p-toluenesulfonyl)acrylamide are preferably used as such monomers. Further, acrylamide having a phenolic hydroxyl group, methacrylamide, acrylate, and methacrylate, or monomers comprising hydroxystyrene are also preferably used as other monomers. As such compounds, specifically, N-(4-hydroxyphenyl)acrylamide, N-(4-hydroxyphenyl)methacrylamide, o-hydroxyphenyl acrylate, m-hydroxyphenyl acrylate, p-hydroxyphenyl acrylate, o-hydroxystyrene, m-hydroxystyrene, and p-hydroxystyrene are exemplified.

As the copolymer components of the above monomers, e.g., the following monomers (1) to (11) can be exemplified, and as the components, two or more of the following monomers may be used.

(1) Acrylates and methacrylates having an aliphatic hydroxyl group such as 2-hydroxyethyl acrylate, 2-hydroxyethyl methacrylate.

(2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(4) Acrylamide or methacrylamide, e. g., acrylamide, methacrylamide, N-methylolacrylamide, N-ethylacrylamide, N-hexylmethacrylamide, N-cyclohexylacrylamide, N-hydroxy-ethylacrylamide, N-phenylacrylamide, N-nitrophenylacrylamide, and N-ethyl-N-phenylacrylamide.

(5) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters, e.g., vinyl acetate, vinyl chloroacetate, vinyl butyrate, and vinyl benzoate.

(7) Styrenes, e.g., styrene, α-methylstyrene, methylstyrene, and chloromethylstyrene.

(8) Vinyl ketones, e.g., methyl vinyl ketone, ethyl vinyl ketone, propyl vinyl ketone, and phenyl vinyl ketone.

(9) Olefins, e.g., ethylene, propylene, isobutylene, butadiene, and isoprene.

(10) N-vinylpyrrolidone, N-vinylcarbazole, 4-vinylpyridine, acrylonitrile, and methacrylonitrile.

(11) Unsaturated imide, e.g., maleimide, N-acryloylacrylamide, N-acetylmethacrylamide, N-propionylmethacrylamide, and N-(p-chlorobenzoyl) methacrylamide.

The weight average molecular weight of these high molecular compounds which are transformed into alkali-soluble by heating is preferably from 500 to 200,000, and the number average molecular weight is preferably from 200 to 60,000. The high molecular compounds which are transformed into alkali-soluble by heating may be used alone or they may be used in combination of two or more. These compounds are used in the proportion of from 5 to 99 wt %, preferably from 10 to 95 wt %, and particularly preferably from 20 to 90 wt %, based on the entire solid content of the thermal positive type image-forming layer. When the addition amount is less than 5 wt %, the durability of the image-forming layer is deteriorated, while when the amount exceeds 99 wt %, sensitivity and durability are deteriorated.

In addition to the above-described compounds which are transformed into alkali-soluble by heating, a binder is preferably added to the thermal positive type image-forming layer. Urethane resins are exemplified as the binder, and urethane resins having a carboxyl group or a sulfonamido group are preferred above all. That is, the polyurethane resins which are preferably used in the present invention are polyurethane resins having basic skeleton of the reaction product of a diisocyanate compound with a diol compound containing a sulfonamido group having at least one hydrogen atom bonded on the nitrogen atom.

The examples of diisocyanate compounds which are preferably used in the present invention include aromatic diisocyanate compounds, e.g., 2,4-tolylene diisocyanate, dimers of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, and 3,3'-dimethylbiphenyl-4,4'-diisocyanate; fatty acid diisocyanate compounds, e.g., hexamethylene diisocyanate, trimethylhexamethylene diisocyanate, lysine diisocyanate, and dimer acid diisocyanate; alicyclic diisocyanate compounds, e.g., isophorone diisocyanate, 4,4'-methylenebis(cyclohexyl isocyanate), methylcyclohexane-2,4(or 2,6)-diisocyanate, and 1,3-(isocyanatemethyl)cyclohexane; and diisocyanate compounds which are the reaction products of the diols, such as the addition products of 1 mol of 1,3-butylene glycol and 2 mols of tolylene diisocyanate, with diisocyanate.

The examples of diol compounds containing a sulfonamido group having at least one hydrogen atom bonded on the nitrogen atom include p-(1,1-dihydroxy-methylethylcarbonylamino)benzenesulfonamide, N-ethyl body of p-(1,1-dihydroxy-methylethylcarbonyl- amino) benzenesulfonamide, N-(m-methylsulfonylaminophenyl)-2,2-dihydroxymethylpropaneamide, N-(p-methylsulfonylaminophenyl)-2,2-dihydroxymethylpropaneamide, N-(m-ethylsulfonylaminophenyl)-2,2-dihydroxymethylpropaneamide, N-(p-ethylsulfonylaminophenyl)-2,2-dihydroxymethylpropaneamide, N-[2,2-(dihydroxyethylaminocarbonyl)ethyl]methanesulfonamide, N-[2,2-(dihydroxyethylaminocarbonyl)ethyl]-benzenesulfonamide, and N-[2,2-(dihydroxyethylaminocarbonyl)ethyl]-p-toluenesulfonamide.

The diol compounds containing these sulfonamido groups may be used alone or they may be used in combination of two or more. Further, diol compounds which do not have a sulfonamido group and may have other substituents which do not react with isocyanate may be used in combination with diol compounds having a sulfonamido group. The examples of such diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butyl-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenatedbisphenol A, hydroquinonedihydroxyethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate, bis(2-hydroxyethyl)isophthalate, 3,5-dihydroxybenzoic acid, 2,2-bis-(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, and tartaric acid.

A polyurethane resin which can be used in the present invention is synthesized by adding a well-known catalyst of the activity according to respective reactivities to the above diisocyanate compound and the diol compound in a non-protonic solvent and then heating. The molar ratio of the diisocyanate compound and the diol compound is preferably from 0.8/1 to 1.2/1, more preferably from 0.85/1.1 to 1.1/1. When isocyanate groups remain at polymer terminals, the terminals are treated with alcohols or amines, thereby a polyurethane resin having no remaining isocyanate groups at last can be synthesized.

Polyurethane resins which can be used in the present invention have weight average molecular weight of preferably 2,000 or more, more preferably from 5,000 to 300,000, and number average molecular weight of preferably 1,000 or more, more preferably from 2,000 to 250,000. The degree of polydispersion (weight average molecular weight/number average molecular weight) of polyurethane resins is preferably 1 or more, more preferably from 1.1 to 10.

Unreacted monomers may be contained in a binder which can be used in the present invention. In such a case, the proportion of the monomers occupied in a binder is preferably 15 wt % or less. The above-described binders may be used alone or two or more kinds may be used as mixture. Above all, it is preferred to use a novolak resin as mixture with other binders.

Various additives may further be added to the thermal positive type image-forming layer according to the present invention, if necessary. For example, such additives include thermal-decomposable compounds such as onium salts, o-quinonediazide compounds, aromatic sulfone compounds, and aromatic sulfonate compounds. It is preferred to use a compound in combination which, in the state not being decomposed, substantially lowers the solubility of the high molecular compounds which are transformed into alkali-soluble by heating with a view to improving the inhibition of dissolution of an image area in a developing solution. As such onium salts, a diazonium salt, an ammonium salt, a phosphonium salt, an iodonium salt, a sulfonium salt, a selenonium salt, and an arsonium salt are exemplified.

The examples of preferred onium salts which can be used in the present invention include the diazonium salts described in S. I. Schlesinger, *Photogr. Sci. Eng.,* 18, 387 (1974), T. S. Bal et al., *Polymer,* 21, 423 (1980), and JP-A-5-158230; the ammonium salts disclosed in U.S. Pat. Nos. 4,069,055, 4,069,056, and JP-A-3-140140; the phosphonium salts described in D. C. Necker et al., *Macromolecules,* 17, 2468 (1984), C. S. Wen et al., *Teh, Proc. Conf. Rad. Curing ASIA*, p. 478,Tokyo, October (1988), U.S. Pat. Nos. 4,069,055, and 4,069,056; the iodonium salts described in J. V. Crivello et al., *Macromolecules,* 10 (6), 1307 (1977), *Chem. & Eng. News*, November 28, p. 31 (1988), EP 104143, U.S. Pat. Nos. 339,049, 410,201, JP-A-2-150848, and JP-A-2-296514; the sulfonium salts described in J. V. Crivello et al., *Polymer J.,* 17, 73 (1985), J. V. Crivello et al., *J. Org. Chem.,* 43, 3055 (1978), W. R. Watt et al., *J. Polymer Sci.*, Polymer Chem. Ed., 22, 1789 (1984), J. V. Crivello et al., *Polymer Bull.,* 14, 279 (1985), J. V. Crivello et al., *Macromolecules,* 14 (5), 1141 (1981), J. V. Crivello et al., *Polymer Sci.*, Polymer Chem. Ed., 17, 2877 (1979), EP 370693, EP 233567, EP 297443, EP 297442, U.S. Pat. Nos. 4,933,377, 3,902,114, 410,201, 339, 049, 4,760,013, 4,734,444, 2,833,827, German Patents 2,904,626, 3,604,580, and 3,604,581; the selenonium salts described in J. V. Crivello et al., *Macromolecules,* 10 (6), 1307 (1977), and J. V. Crivello et al., *J. Polymer Sci.*, Polymer Chem. Ed., 17, 1047 (1979); and the arsonium salts described in C. S. Wen et al., *Teh, Proc. Conf. Rad. Curing ASIA*, p. 478, Tokyo, October (1988).

Of these, diazonium salts are particularly preferably used in the present invention, and the diazonium salts disclosed 3in JP-A-5-158230 are particularly preferred.

The preferred quinonediazide compounds are o-quinonediazide compounds. The o-quinonediazide compounds for use in the present invention are compounds having at least one o-quinonediazido group and whose alkali solubility is increased by thermal decomposition and compounds of various structures can be used. That is, o-quinonediazide loses the function of inhibiting dissolution of an alkali-soluble binder by thermal decomposition and o-quinonediazide per se converts to an alkali-soluble substance, thereby assist the solution of photosensitive materials. The o-quinonediazide compounds described in, e.g., J. Kosar, *Light-Sensitive Systems*, pp. 339 to 352, John Wiley & Sons, Inc. can be used in the present invention. Sulfonates or sulfonic acid amides of o-quinonediazide obtained by reaction with various aromatic polyhydroxyl compounds or aromatic amino compounds are particularly preferred. Further, the esters of benzoquinone-(1,2)-diazidosulfonic acid chloride or naphthoquinone-(1,2)-diazido-5-sulfonic acid chloride and pyrogallol/acetone resins disclosed in JP-B-43-28403, and the esters of benzoquinone-(1,2) -diazidosulfonic acid chloride or naphthoquinone-(1,2)-diazido-5-sulfonic acid chloride and phenol/formaldehyde resins disclosed in U.S. Pat. Nos. 3,046,120 and 3,188,210 are also preferably used.

Further, the esters of naphthoquinone-(1,2)-diazido-4-sulfonic acid chloride and phenol/formaldehyde resins or cresol/formaldehyde resins, and the esters of naphthoquinone-(1,2)-diazido-4-sulfonic acid chloride and pyrogallol/acetone resins are also preferably used in the present invention. As other useful o-quinonediazide compounds, those disclosed in the following patents can be exemplified: JP-A-47-5303, JP-A-48-63802, JP-A-48-63803, JP-A-48-96575, JP-A-49-38701, JP-A-48-13354, JP-B-41-11222, JP-B-45-9610, JP-B-49-17481,U.S. Pat. Nos. 2,797,213, 3,454,400, 3,544,323, 3,573,917, 3,674, 495, 3,785,825, British Patents 1,277,602, 1,251,345, 1,267, 005, 1,329,888, 1,330,932, and German Patent 854,890.

The addition amount of the o-quinonediazide compounds for use in the present invention is preferably from 1 to 50 wt %, more preferably from 5 to 30 wt %, and particularly preferably from 10 to 30 wt %, based on the entire solid content of the thermal positive type image-forming layer. These compounds can be used alone or they may be used as mixtures of two or more.

As the counter ions of onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, and paratoluenesulfonic acid can be exemplified. Of these, alkyl aromatic sulfonic acid such as hexafluorophosphoric acid, triisopropylnaphthalenesulfonic acid, and 2,5-dimethylbenzenesulfonic acid are preferred.

The addition amount of the additives other than o-quinonediazide compounds is preferably from 1 to 50 wt %, more preferably from 5 to 30 wt %, and particularly preferably from 10 to 30 wt %, based on the entire solid content of the thermal positive type image-forming layer.

For further improving sensitivity, cyclic acid anhydrides, phenols and organic acids can be used in combination. The examples of cyclic acid anhydrides include, as disclosed in U.S. Pat. No. 4,115,128, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride. The examples of phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Further, the examples of organic acids include, as disclosed in JP-A-60-88942 and JP-A-2-96755, sulfonic acids, sulfinic acids, alkylsulfuric acids, phosphonic acids, phosphates, and carboxylic acids, specifically, p-toluenesulfonic acid, dodecylbenzenesulfonic acid, p-toluenesulfinic acid, ethyl sulfuric acid, phenyl phosphonic acid, phenyl phosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid can be exemplified.

The proportion of the above cyclic acid anhydrides, phenols and organic acids in the image-forming layer is preferably from 0.05 to 20 wt %, more preferably from 0.1 to 15 wt %, and most preferably from 0.1 to 10 wt %. Surfactants can be added to the image-forming layer of the present invention for widening the processing stability against development conditions, e.g., the nonionic surfactants as disclosed in JP-A-62-251740 and JP-A-3-208514, and the ampholytic surfactants as disclosed in JP-A-59-121044 and JP-A-4-13149 can be added.

The specific examples of nonionic surfactants include sorbitan tristearate, sorbitan monopalmitate, sorbitan trioleate, stearic acid monoglyceride, and polyoxyethylenenonylphenyl ether. The specific examples of ampholytic surfactants include alkyldi(aminoethyl)glycine, alkylpolyaminoethylglycine hydrochloric acid salt, 2-alkyl-N-carboxyethyl-N-hydroxyethylimidazolinium betaine, N-tetradecyl-N,N-betaine type surfactants (e.g., Amorgen K, trade name, manufactured by Daiichi Kogyo Seiyaku Co., Ltd.), etc. The content of these nonionic and ampholytic surfactants is preferably from 0.05 to 15 wt %, more preferably from 0.1 to 5 wt %, based on the entire solid content of the thermal positive type image-forming layer.

Thermal Negative Type Image-forming Layer

The thermal negative type image-forming layer of type III contains at least a polymer having a constitutional unit represented by the following formula (IX), a thermal crosslinking agent, and an acid-generating agent, and a light/heat converting material described in detail later:

(IX)

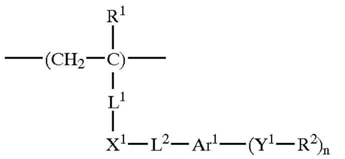

wherein $R^1$ represents a hydrogen atom or a methyl group; $X^1$ represents a linking group showing alkali solubility per se or a linking group having an alkali-soluble group. The alkali-soluble group used herein means a group containing such a moiety as sulfonic acid amide, sulfonic acid imide or carboxylic acid imide, specifically $-SO_2NH-$, $-NHSO_2-$, $-SO_2NHCO-$, $-CONHSO_2-$, and $-CONHCO-$ can be exemplified. $Ar^1$ represents an aromatic hydrocarbon group having 20 or less carbon atoms which may have a substituent., specifically a benzene ring, a naphthalene ring, an anthracene ring and a phenanthrene ring can be exemplified. Of these aromatic hydrocarbon groups, a benzene ring and a naphthalene ring are preferred because of easy availability and from economical viewpoint.

The preferred examples of the substituents which the aromatic hydrocarbon groups may have include a hydrocarbon group having 20 or less carbon atoms, a halogen atom, a cyano group, a nitro group, a carboxyl group, or a carbamoyl group. $Y^1$ represents $N-R^3$, an oxygen atom or a sulfur atom, $R^2$ represents a hydrocarbon group having 20 or less carbon atoms which may have a substituent, $R^3$ represents a hydrogen atom or a hydrocarbon group having 20 or less carbon atoms which may have a substituent. The preferred examples of the substituents for $R^2$ and $R^3$ include a halogen atom, a cyano group, a nitro group, a carboxyl group, a carbamoyl group, an alkoxyl group having 20 or less carbon atoms, a perfluoroalkyl group having 20 or less carbon atoms, and a hydroxyalkyl group having 20 or less carbon atoms. n represents an integer of from 1 to 4. $L^1$ represents a single bond, an ester bond, a carboxylic acid amide bond, a sulfonic acid amide bond, an ether bond, a thioether bond, or a hydrocarbon group having 20 or less carbon atoms which may have any of these bonds. $L^2$ represents a single bond or a hydrocarbon group having 20 or less carbon atoms, and a single bond is preferred because of easy availability and from economical viewpoint.

Further, $R^2$ and $Ar^1$, $R^3$ and $Ar^1$, and $R^2$ and $R^3$ may form a cyclic structure such as a cyclohexane ring. The polymer having a constitutional unit represented by formula (IX) preferably used in the present invention is a polymer having a constitutional unit represented by the following formula (X). In formula (X), definitions will be omitted as to those having the same symbols as in formula (IX).

(X)

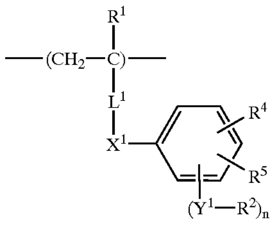

wherein $R^4$ and $R^5$, which may be the same or different, each represents a hydrogen atom or a hydrocarbon group having 20 or less carbon atoms which may have a substituent; as the preferred substituents which can be used in $R^4$ and $R^5$, a halogen atom, a cyano group, a nitro group, a carboxyl group, a carbamoyl group, an alkoxyl group having 20 or less carbon atoms, a perfluoroalkyl group having 20 or less carbon atoms, and a hydroxyalkyl group having 20 or less carbon atoms can be exemplified. $R^4$ and $R^5$ may form a cyclic structure such as a condensed benzene ring or cyclohexane ring. The polymer having the constitutional unit represented by formula (X) uses a monomer represented by corresponding formula (XI) and can be obtained by radical polymerization according to conventionally known methods. In formula (XI), definitions will be omitted as to those having the same symbols as in formula (X):

(XI)

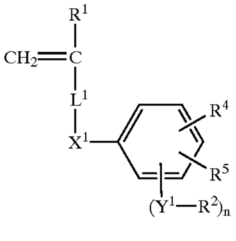

The examples of the monomers represented by formula (XI) which are preferably used in the present invention are shown below as formulae (XI-1) to (XI-13). In the formulae, $R^1$ represents a hydrogen atom or a methyl group and $Z^1$ represents an oxygen atom or NH:

(XI-1)
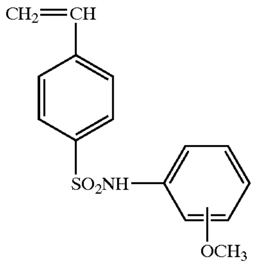
(o-, m-, p-)
(XI-2)
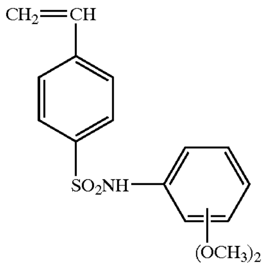
(XI-3)
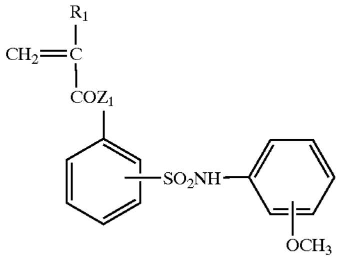
(o-, m-, p-)
(XI-4)
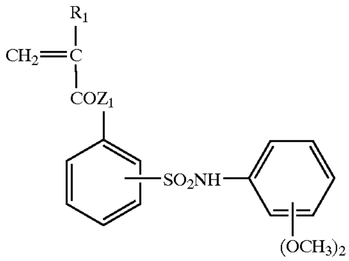
(XI-5)
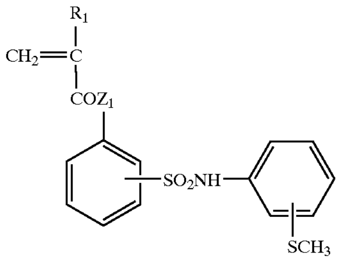
(o-, m-, p-)
(XI-6)
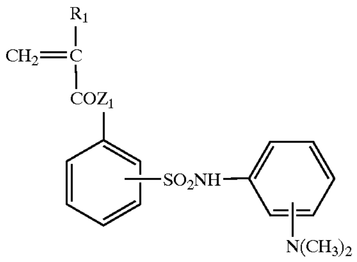
(o-, m-, p-)
-continued
(XI-7)
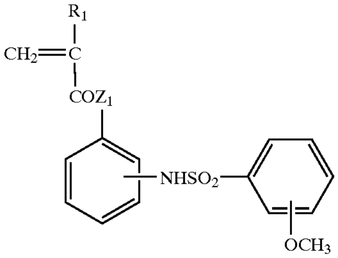
(o-, m-, p-)
(XI-8)
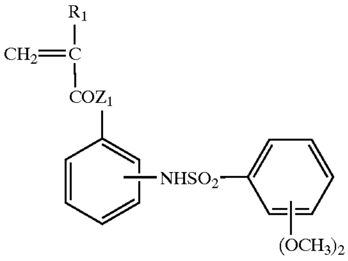
(XI-9)
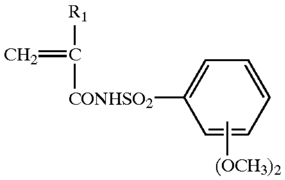
(XI-10)
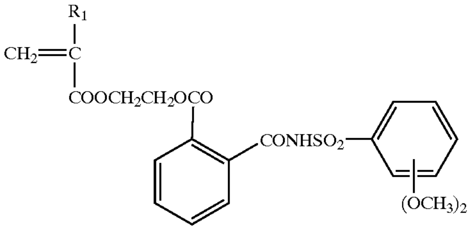
(XI-11)
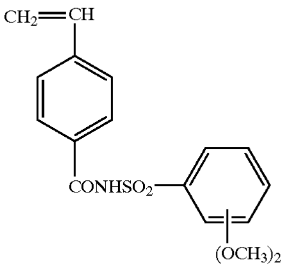
(XI-12)
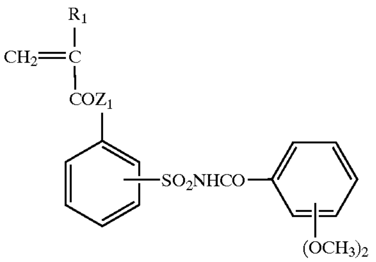

-continued (XI-13)

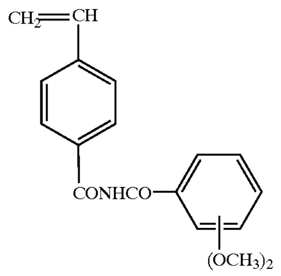

As the preferred monomers having a constituting unit represented by formula (IX), either a homopolymer comprising the monomer represented by formula (XI) alone or copolymers comprising two or more monomers may be used. In the present invention, it is preferred to use copolymers comprising the monomer represented by formula (XI) and conventionally well-known polymerizable monomers other than the monomer represented by formula (XI) from the viewpoint of the solubility in a coating solution and the flexibility of the coated film.

As well-known monomers for use in combination with the monomer represented by formula (XI), acrylates, e.g., methyl acrylate, ethyl acrylate, propyl acrylate, butyl acrylate, 2-ethylhexyl acrylate, cyclohexyl acrylate, 2-hydroxyethyl acrylate, and benzyl acrylate, methacrylate, e.g., methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate, and acrylonitrile can be exemplified.

The polymer having the constitutional unit represented by formula (IX) according to the present invention has $X^1$, which is a linking group showing alkali solubility (e.g., an acid group, etc.), as the partial structure, therefore, excellent in the solubility in alkali water, and the polymer may be a copolymer using a monomer having other acid group as assistant.

The examples of such monomers include acrylic acid, methacrylic acid, itaconic acid, maleic acid, N-(2-carboxyethyl)acrylamide, N-(2-carboxyethyl) methacrylamide, N-(carboxyphenyl)acrylamide, N-(carboxyphenyl)methacrylamide, carboxystyrene, maleimide, N-(phenylsulfonyl)acrylamide, N-(phenylsulfonyl)methacrylamide, N-(tolylsulfonyl) acrylamide, N-(tolylsulfonyl)methacrylamide, N-(chlorophenylsulfonyl)-acrylamide, N-(chlorophenylsulfonyl)methacrylamide, N-(sulfamoylphenyl)acrylamide, N-(sulfamoylphenyl)methacrylamide, N-(methylsulfamoylphenyl)acrylamide, N-(methylsulfamoylphenyl) methacrylamide, N-(phenylsulfamoylphenyl)-acrylamide, N-(phenylsulfamoylphenyl)methacrylamide, N-(tolylsulfamoylphenyl)acrylamide, N-(tolylsulfamoylphenyl)methacrylamide, N-[(chlorophenylsulfamoyl) phenyl]acrylamide, N-[(chlorophenylsulfamoyl)phenyl] methacrylamide, N-(hydroxyphenyl)acrylamide, N-(hydroxyphenyl)methacrylamide, N-(hydroxynaphthyl) acrylamide, and N-(hydroxynaphthyl)methacrylamide can be exemplified.

Although they are not acid groups, the monomers containing salts of strong acids such as sodium salt of p-styrenesulfonic acid, alkali metal salt and tetraalkylammonium salt of 2-acrylamide-2-methylpropanesulfonic acid, and potassium salt of 3-sulfopropyl acrylate can improve the solubility in water, as a result, the developing property of the image-forming layer in an aqueous developing solution can be improved. Accordingly, these compounds are preferred as the constitutional component of the copolymers for use in the thermal negative type image-forming layer.

The proportion of the constitutional unit represented by formula (IX) contained in the copolymers using these monomers is preferably from 20 to 95 wt %, more preferably from 30 to 90 wt %. Further, the weight average molecular weight of the polymers having the constitutional unit represented by formula (IX) contained in the thermal negative type image-forming layer is preferably 5,000 or more, more preferably from 10,000 to 300,000, and the number average molecular weight is preferably 1,000 or more, more preferably from 2,000 to 250,000. The degree of polydispersion (weight average molecular weight/number average molecular weight) of the polymers is preferably 1 or more, more preferably from 1.1 to 10. These polymers may be random polymers, block polymers or graft polymers, but preferably random polymers.

In synthesizing the polymer having the constitutional unit represented by formula (IX), the following solvents can be used alone or in combination of two or more thereof, e.g., tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. As radical polymerization initiators in synthesis, well-known compounds such as azo initiators and peroxide initiators can be used. The polymer having the constitutional unit represented by formula (IX) maybe used alone or as mixture, and the proportion of the polymer is from 20 to 95 wt %, preferably from 40 to 90 wt %, based on the entire solid content of the thermal negative type image-forming layer. When the addition amount is less than 20 wt %, the strength of the image area formed is insufficient, and when the addition amount exceeds 95 wt %, an image cannot be formed.

As the thermal crosslinking agents for use in the thermal negative type image-forming layer, compounds having two or more hydroxymethyl groups, alkoxymethyl groups, epoxy groups or vinyl ether groups in the molecule are exemplified. Compounds having such crosslinking functional groups directly bonded to aromatic rings are preferred. Specifically, methylolmelamine, resol resins, epoxidized novolak resin, and urea-formaldehyde resins can be exemplified. The compounds described in Shinzo Yamashita and Tosuke Kaneko, *Kakyozai Handbook* (*Handbook of Crosslinking Agents*), Taiseisha Co. Ltd. are also preferably used in the present invention. In particular, phenol derivatives having two or more hydroxymethyl groups or alkoxymethyl groups in the molecule are preferred because an image area having good strength can be formed. Specifically, resol resins can be exemplified as such phenol derivatives. However, it is proper that these thermal crosslinking agents are unstable to heat and the stability during storage after image-forming layer has been formed. Contrary to this, phenol derivatives having from four to eight benzene nuclei in the molecule, at least one phenolic hydroxyl group, and at least two groups represented by formula (XII) shown below is excellent in storage stability and most preferably used in the present invention:

$$—CH_2OR^6 \quad \text{(XII)}$$

wherein $R^6$ represents a hydrogen atom, an alkyl group or an acyl group. As the alkyl group, e.g., an alkyl group having from 1 to 4 carbon atoms such as a methyl group, an ethyl group, an n-propyl group, an isopropyl group, an n-butyl group, an isobutyl group, a sec-butyl group and a t-butyl group, and as the acyl group, e.g., a formyl group, an acetyl group, a butyryl group, a benzoyl group, a cinnamoyl group and a valeryl group are preferred. Further, a substituted alkyl group having from 1 to 4 carbon atoms, e.g., a methoxyethyl group, a methoxypropyl group, a hydroxyethyl group and a hydroxypropyl group, can be used.

A phenol derivative which can be used in the thermal negative type image-forming layer can be obtained by reacting a phenol compound with formaldehyde. For example, by the reaction of well-known phenol compounds, e.g., the phenol compounds disclosed in JP-A-1-289946, JP-A-3-179353, JP-A-3-200252, JP-A-3-128959, JP-A-3-200254, JP-A-5-158233, and JP-A-5-224409 with formaldehyde in a strong alkaline atmosphere at about 0 to 80° C., preferably from 10 to 60° C., for 1 to 30 hours, a phenol derivative wherein $R^6$ in formula (XII) represents a hydrogen atom can be obtained.

By further continuing the reaction thereafter under an acidic condition with an alcohol having from 1 to 4 carbon atoms, a substituted alcohol, acid halide or acid anhydride at 0 to 80° C. for 1 to 30 hours, a phenol derivative wherein $R^6$ in formula (XII) represents an alkyl group or an acyl group can be obtained. The temperature of the reaction with alcohol and a substituted alcohol is preferably from 20 to 80° C., and the temperature of the reaction with acid halide or acid anhydride is preferably from 0 to 30° C. As the specific examples of the phenol derivatives which are usable in the present invention, the compounds represented by the following formulae (XIII) to (XX) can be exemplified, but it should not be construed as the present invention is limited thereto. These phenol derivatives may be used alone or in combination of two or more, and the addition amount is from 0.2 to 60 wt %, preferably from 0.5 to 20 wt %, based on the content of the thermal negative type image-forming layer. Further, compounds having from one to three benzene nuclei, a phenolic hydroxyl group and a group represented by formula (XII) bring about the deterioration of ink receptivity and the lowering of development latitude, therefore, it is preferred that the thermal negative type image-forming layer substantially does not contain such compounds. Specifically, the content of such compounds in the thermal negative type image-forming layer is preferably 5 wt % or less, more preferably 3 wt % or less, and most preferably 0 wt %.

(XIII)

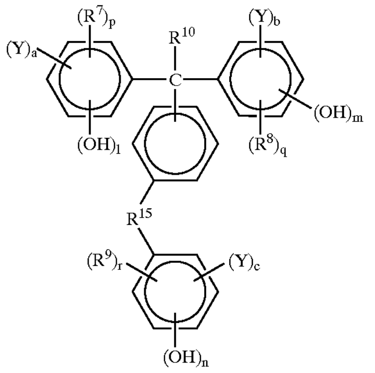

-continued (XIV)

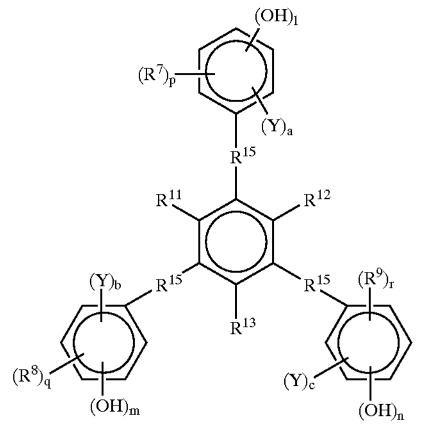

(XV)

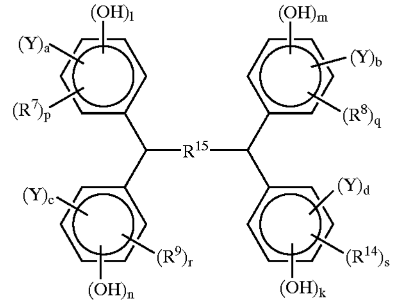

(XVI)

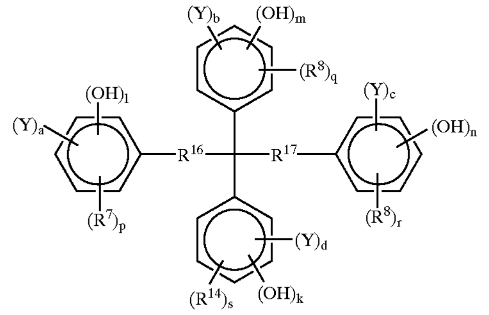

(XVII)

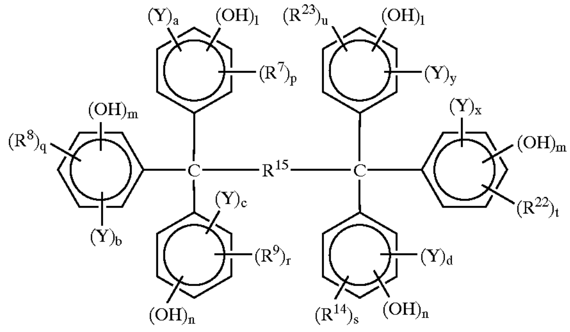

-continued (XVIII)

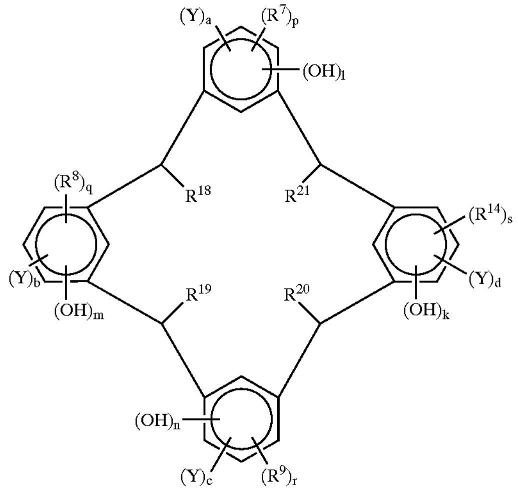

(XIX)

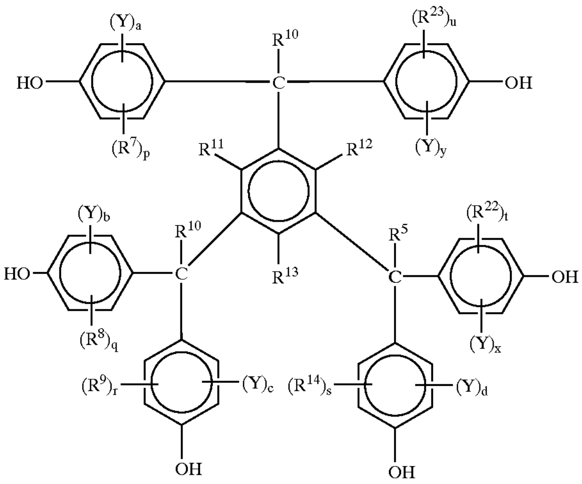

(XX)

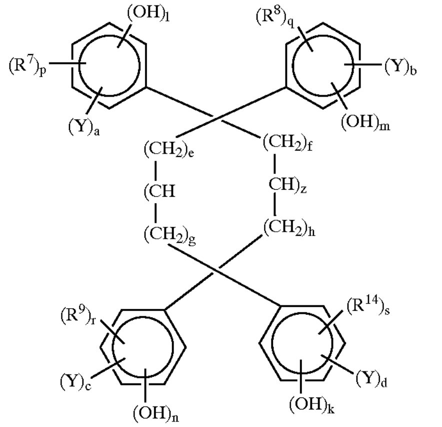

In the above formulae, $R^7$, $R^8$, $R^9$, $R^{14}$, $R^{22}$ and $R^{23}$ each represents a hydrogen atom, a halogen atom, an alkyl group or an alkoxyl group; $R^{10}$, $R^{18}$, $R^{19}$, $R^{20}$ and $R^{21}$ each represents a hydrogen atom or an alkyl group; $R^{11}$, $R^{12}$ and $R^{13}$ each represents a hydrogen atom, a halogen atom, or an alkyl group; $R^{15}$, $R^{16}$ and $R^{17}$ each represents a single bond, a substituted or unsubstituted alkylene group, alkenylene group, phenylene group, naphthylene group, carbonyl group, ether group, thioether group, amido bond, or a combination of two or more of these groups; Y represents a group represented by formula (XII); a, b, c, d, x and y each represents an integer of from 0 to 3, provided that a+b+c+d+x+y is an integer of from 2 to 16; k, l, m and n each represents an integer of from 0 to 3, provided that k, l, m and n do not represents 0 at the same time; e, f, g, h, p, q, r, s, t and u each represents an integer of from 0 to 3; and z represents 0 or 1.

The specific examples of the compounds represented by formulae (XIII) to (XX) are shown below:

(XXI)

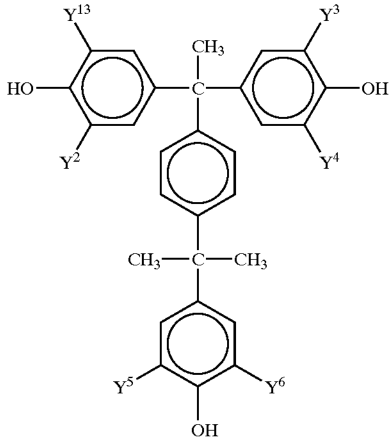

(XXII)

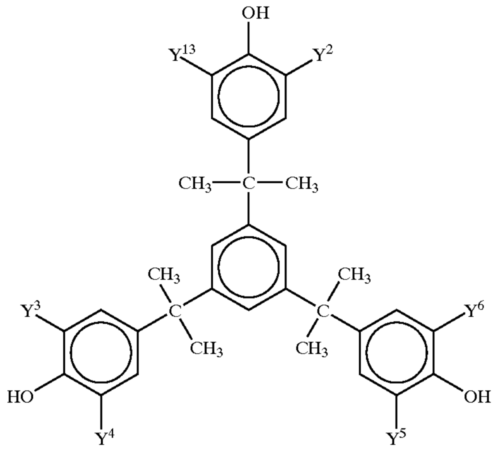

(XXIII)

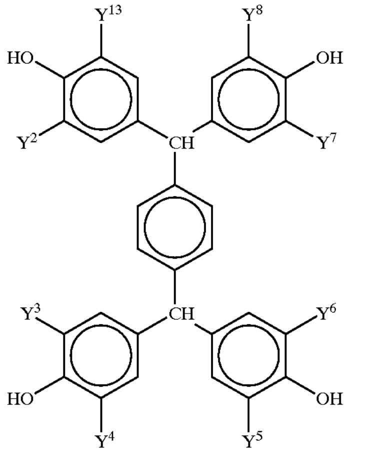

-continued (XXIV)

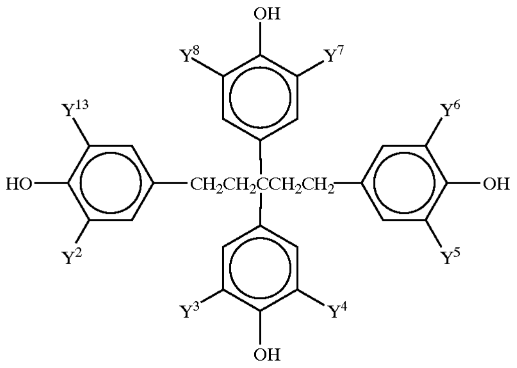

(XXV)

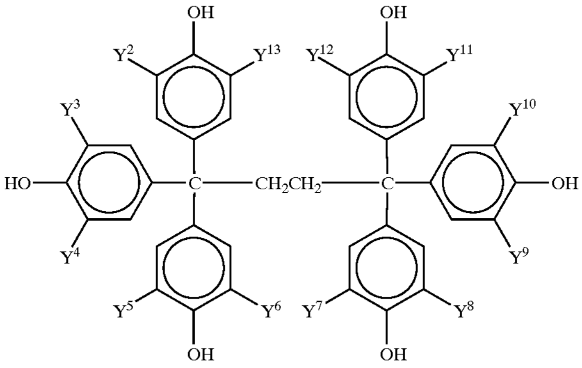

(XXVI)

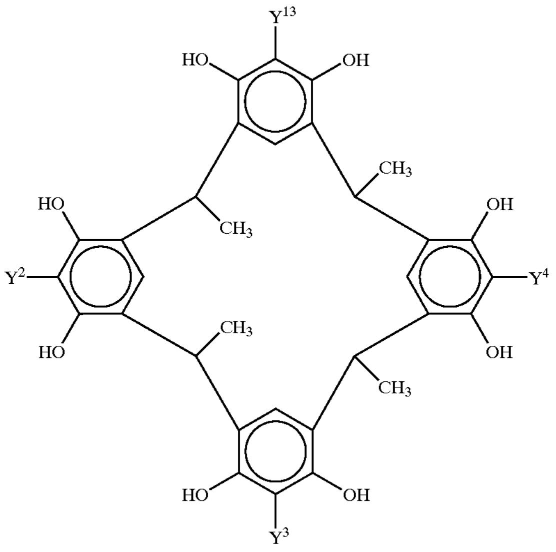

-continued (XXVII)

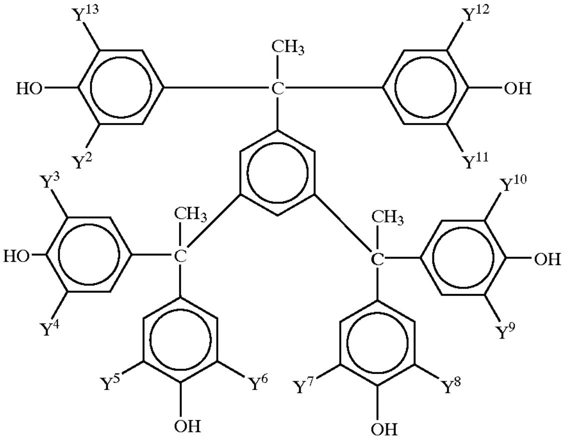

(XXVIII)

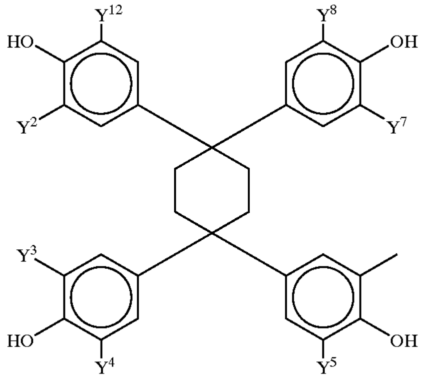

In the above formulae, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ each represents a hydrogen atom or a group represented by formula (XII), but at least two of them represent a group represented by formula (XII) in each compound, preferably all of $Y^2$ to $Y^{13}$ represent a group represented by formula (XII). Aldehyde and ketone compounds can be exemplified as other thermal crosslinking agents preferably used in the present invention. Preferred compounds are those having two or more aldehydes or ketones in the molecule. These thermal crosslinking agents may be used alone or in combination of two or more, and the addition amount of the thermal crosslinking agents is from 5 to 70 wt %, preferably from 10 to 65 wt %, based on the entire solid content of the thermal negative type image-forming layer. When the addition amount of the thermal crosslinking agents is less than 5 wt %, the film strength of the image area when an image is recorded is deteriorated, while when it exceeds 70 wt %, the storage stability cannot be ensured.

Further, an acid-generating agent is added to the thermal negative type image-forming layer. An acid-generating agent is a compound which is decomposed by light or heating of 100° C. or more and generates an acid, and acids to be generated are preferably strong acids having pKa of 2 or less, e.g., a sulfonic acid and a hydrochloric acid. As the acid-generating agents which can be preferably used in the present invention, onium salts such as an iodonium salt, a sulfonium salt, a phosphonium salt, and a diazonium salt can be exemplified. Specifically, the compounds disclosed in U.S. Pat. No. 4,708,925 and JP-A-7-20629 can be used in the present invention. Iodonium salts, sulfonium salts and diazonium salts having a sulfonate ion as a counter ion are particularly preferably used.

As diazonium salts, the diazonium compounds disclosed in U.S. Pat. Nos. 3,867,147 and 2,632,703, and the diazo resins disclosed in JP-A-1-102456 and JP-A-1-102457 are preferred. The benzyl sulfonates disclosed in U.S. Pat. Nos. 5,135,838 and 5,200,544, are also preferred. Further, the active sulfonates and disulfonyl compounds disclosed in JP-A-2-100054, JP-A-2-100055 and JP-A-9-197671 are also preferred. In addition, the haloalkyl-substituted s-triazines disclosed in JP-A-7-271029 are also preferred.

These compounds may be used alone or may be used in combination of two or more. These compounds are used in proportion of from 0.01 to 50 wt %, preferably from 0.1 to 25 wt %, and more preferably from 0.5 to 15 wt %, based on the entire solid content of the thermal negative type image-forming layer. When the addition amount is less than 0.01 wt %, an image cannot be obtained, while when the addition amount exceeds 50 wt %, smearing is generated on the non-image area at printing.

Various kinds of additives can be added to the thermal negative type image-forming layer, if necessary. For example, polyfunctional monomers having two or more radical polymerizable ethylenically unsaturated double bonds in the molecule can be added. As such compounds, ethylene glycol di(meth)acrylate, diethylene glycol di(meth) acrylate, polyethylene glycol di(meth)acrylate, bexanediol di(meth)acrylate, trimethylolethane tri(meth)acrylate, trimethylolpropane tri(meth)acrylate, tri-, tetra- or hexa(meth) acrylate of pentaerythritol and dipentaerythritol can be exemplified. The addition amount of these polyfunctional monomers is 30 wt % or less in the thermal negative type image-forming layer.

The development on machine type thermal negative image-forming layer of type IV contains a fine particle polymer having a heat-reactive functional group or microcapsules containing a compound having a heat-reactive functional group.

As the heat-reactive functional groups, ethylenically unsaturated groups which bring about a polymerization reaction (e.g., an acryloyl group, a methacryloyl group, a vinyl group and an allyl group), isocyanate groups which bring about an addition reaction, or the block of the isocyanate groups, and the functional groups having an active hydrogen atom of the opposite compound of the reaction (e.g., an amino group, a hydroxyl group and a carboxyl group), epoxy groups which bring about an addition reaction, and the amino group, the carboxyl group, and the hydroxyl group of the opposite compounds of the reaction, a carboxyl group and a hydroxyl group or an amino group which bring about a condensation reaction, an acid anhydride and an amino group or a hydroxyl group which bring about a ring-opening addition reaction, and diazonium groups which react with a hydroxyl group by thermal decomposition can be exemplified. However, functional groups which bring about any reaction may be used in the present invention so long as a chemical bond is formed.

As the fine particle polymers having a heat-reactive functional group for use in the development on machine type thermal negative image-forming layer, polymers having an acryloyl group, a methacryloyl group, a vinyl group, an allyl group, an epoxy group, an amino group, a hydroxyl group, a carboxyl group, an isocyanate group, an acid anhydride, and the groups protecting these groups can be exemplified. These functional groups may be incorporated into polymer particles at the time of polymerization or may be incorporated by utilizing a high polymer reaction after polymerization.

When these functional groups are incorporated into polymer particles at the time of polymerization, it is preferred that monomers having these functional groups are subjected to emulsification polymerization or suspension polymerization.

The specific examples of the monomers having such functional groups include allyl methacrylate, allyl acrylate, vinyl methacrylate, vinyl acrylate, glycidyl methacrylate, glycidyl acrylate, 2-isocyanatoethyl methacrylate or its block isocyanate by alcohol, 2-isocyanatoethyl acrylate or its block isocyanate by alcohol, 2-aminoethylmethacrylate, 2-aminoethyl acrylate, 2-hydroxyethyl methacrylate, 2-hydroxyethyl acrylate, acrylic acid, methacrylic acid, maleic anhydride, bifunctional acrylate and bifunctional methacrylate, but the present invention is not limited thereto.

As the monomers copolymerizable with these monomers not having a heat-reactive functional group, e.g., styrene, alkyl acrylate, alkyl methacrylate, acrylonitrile, and vinyl acetate can be exemplified, but the present invention is not limited thereto so long as they are monomers not having a heat-reactive functional group.

The high polymer reactions which are used in the case where a heat-reactive functional group is introduced after polymerization are disclosed, e.g., in WO 96/34316.

Of the above fine particle polymers having a heat-reactive functional group, fine particle polymers which coalesce with each other by heat are preferred, and those having hydrophilic surfaces and dispersible in water are particularly preferred. It is preferred that only fine particle polymers are coated and the contact angle of the film (water droplet in air) prepared by drying at lower temperature than the coagulation temperature is lower than the contact angle of the film (water droplet in air) prepared by drying at higher temperature than the coagulation temperature. Thus, when hydrophilic polymers such as polyvinyl alcohol and polyethylene glycol, or oligomers, or hydrophilic low molecular weight compounds are adsorbed onto the surfaces of the fine particle polymers, the surfaces of the fine particle polymers are made hydrophilic, but the method is not limited thereto.

The coagulation temperature of these fine particle polymers having heat-reactive functional groups is preferably 70° C. or higher, more preferably 100° C. or higher, in view of aging stability.

These fine particle polymers preferably have an average particle size of from 0.01 to 20 $\mu$m, more preferably from 0.05 to 2.0 $\mu$m, and particularly preferably from 0.1 to 1.0 $\mu$m. When the average particle size of the fine particle polymers is within this range, excellent definition and aging stability can be obtained.

The addition amount of these fine particle polymers having reactive functional groups is preferably 50 wt % or more, more preferably 60 wt % or more, based on the solid contents of the development on machine type thermal negative image-forming layer.

The microcapsules for use in the development on machine type thermal negative image-forming layer contain a compound having a heat-reactive functional group. As the compound having the heat-reactive functional group, a polymerizable unsaturated group, a hydroxyl group, a carboxyl group, a carboxylate group, an acid anhydride, an amino group, an epoxy group, an isocyanate group, or the blocked product of isocyanate groups can be exemplified.

As the compound having a polymerizable unsaturated group, compounds having at least one, preferably two or more ethylenically unsaturated bonds, e.g., an acryloyl group, a methacryloyl group, a vinyl group or an aryl group. These compounds are well known in the field of this industry and these compounds can be used with no particular restriction in the present invention. As the chemical forms, they are monomers, prepolymers, i.e., dimers, trimers, oligomers, and mixtures of them, or copolymers of them.

The specific examples of such compounds include unsaturated carboxylic acid (e.g., acrylic acid, methacrylic acid, itaconic acid, crotonic acid, isocrotonic acid and maleic acid), and esters and amides of them, and preferably the esters of unsaturated carboxylic acid and aliphatic polyhydric alcohols, and the amides of unsaturated carboxylic acid and aliphatic polyhydric amines can be exemplified.

Further, the addition reaction products of unsaturated carboxylic acid esters or unsaturated carboxylic acid amides having nucleophilic substituents such as a hydroxyl group, an amino group, or a mercapto group with monofunctional or polyfunctional isocyanates or epoxides, and the dehydration condensation reaction products of these unsaturated carboxylic acid esters or amides with monofunctional or polyfunctional carboxylic acids are also preferably used in the present invention.

Further, the addition reaction products of unsaturated carboxylic acid esters or unsaturated carboxylic acid amides having electrophilic substituents such as an isocyanate group and an epoxy group with monofunctional or polyfunctional alcohol, amine and thiol, and the substitution reaction products of unsaturated carboxylic acid esters or unsaturated carboxylic acid amides having eliminable substituents such as a halogen group and a tosyloxy group with monofunctional or polyfunctional alcohol, amine and thiol are also preferably used in the present invention.

As other preferred examples, the above compounds in which unsaturated carboxylic acid is substituted with unsaturated phosphonic acid or chloromethylstyrene can be exemplified.

The specific examples of the polymerizable compounds of esters of unsaturated carboxylic acids and aliphatic polyhydric alcohols include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl)isocyanurate, and polyester acrylate oligomer.

As methacrylates, the examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane, and bis[p-(methacryloyloxyethoxy)phenyl]dimethylmethane.

As itaconates, the examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

As crotonates, the examples include ethylene glycol dicrotonate, tetramethylene glycol dicrotonate, pentaerythritol dicrotonate, and sorbitol tetradicrotonate.

As isocrotonates, the examples include ethylene glycol diisocrotonate, pentaerythritol diisocrotonate, and sorbitol tetraisocrotonate.

As maleates, the examples include ethylene glycol dimaleate, triethylene glycol dimaleate, pentaerythritol dimaleate, and sorbitol tetramaleate.

As the examples of other esters, e.g., aliphatic alcohol esters disclosed in JP-B-46-27926, JP-B-51-47334 and JP-A-57-196231, esters having an aromatic skeleton disclosed in JP-A-59-5240, JP-A-59-5241 and JP-A-2-226149, and esters having an amino group disclosed in JP-A-1-165613 can be exemplified.

Further, the examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide and xylylenebis-methacrylamide.

As the examples of other preferred amide monomers, amide monomers having cyclohexylene structure disclosed in JP-B-54-21726 can be exemplified.

Further, urethane-based addition polymerizable compounds produced by an addition reaction of isocyanate and a hydroxyl group are also preferably used, and as the specific examples, e.g., the urethane compound having two or more polymerizable unsaturated groups in one molecule obtained by adding an unsaturated monomer having a hydroxyl group represented by the following formula (II) to a polyisocyanate compound having two or more isocyanate groups in one molecule disclosed in JP-B-48-41708 can be exemplified:

$$CH_2{=}C(R^1)COOCH_2CH(R^2)OH \quad (II)$$

wherein $R^1$ and $R^2$ each represents H or $CH_3$.

Further, the urethane acrylates as disclosed in JP-A-51-37193, JP-B-2-32293 and JP-B-2-16765, the urethane compounds having an ethylene oxide skeleton as disclosed in JP-B-58-49860, JP-B-56-17654, JP-B-62-39417 and JP-B-62-39418 can also be exemplified as preferred examples.

The radical polymerizable compounds having amino structure or sulfide structure in the molecule as disclosed in JP-A-63-277653, JP-A-63-260909 and JP-A-1-105238 can also be exemplified as preferred compounds.

As other preferred examples, the polyfunctional acrylates and methacrylates such as the polyester acrylates, and the epoxy acrylates obtained by reacting epoxy resin and methacrylic acid as disclosed in JP-A-48-64183, JP-B-49-43191 and JP-B-52-30490 can be exemplified. In addition, the special unsaturated compounds disclosed in JP-B-46-43946, JP-B-1-40337 and JP-B-1-40336, and the vinyl sulfonic acid-based compounds disclosed in JP-A-2-25493 can also be exemplified as preferred compounds. Further, the compounds containing a perfluoroalkyl group disclosed in JP-A-

61-22048 are also preferably used in some cases. The monomers introduced into *Bulletin of Nihon Setchaku Kyokai*, Vol. 20, No. 7, pp. 300 to 308 (1984) as photosetting monomers and oligomers can also be preferably used.

As preferred examples of epoxy compounds, glycerol polyglycidyl ether, polyethylene glycol diglycidyl ether, polypropylene diglycidyl ether, trimethylolpropane polyglycidyl ether, sorbitol polyglycidyl ether, bisphenols and polyphenols or hydrogenated polyglycidyl ethers of them can be exemplified.

As the preferred examples of isocyanate compounds, tolylene diisocyanate, diphenylmethane diisocyanate, polymethylenepolyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, or compounds obtained by blocking these compounds with alcohol or amine can be exemplified.

As the preferred examples of amine compounds, ethylenediamine, diethylenetriamine, triethylenetetramine, hexamethylenediamine, propylenediamine and polyethyleneimine can be exemplified.

As the preferred examples of the compounds having a hydroxyl group, compounds having methylol groups at terminals, polyhydric alcohol such as pentaerythritol, bisphenol/polyphenols can be exemplified.

As the preferred examples of the compounds having a carboxyl group, aromatic polyvalent carboxylic acid such as pyromellitic acid, trimellitic acid, and phthalic acid, and aliphatic polyvalent carboxylic acid such as adipic acid can be exemplified.

As the preferred examples of the compounds having a hydroxyl group and a carboxyl group, the compounds known as the binders of well-known PS plates, e.g., the compounds disclosed in JP-B-54-19773, JP-B-55-34929 and JP-B-57-43890 can also be exemplified in addition to the above compounds.

As preferred acid anhydrides, pyromellitic anhydride and benzophenonetetracarboxylic anhydride can be exemplified.

As the preferred examples of the copolymers of ethylenically unsaturated compounds, allyl methacrylate copolymers can be exemplified. For example, allyl methacrylate/methacrylic acid copolymers, allyl methacrylate/ethyl methacrylate copolymers, and allyl methacrylate/butyl methacrylate copolymers can be exemplified.

Microencapsulation can be performed by well-known methods. For example, as the manufacturing method of the microcapsules, the method making use of coacervation as disclosed in U.S. Pat. Nos. 2,800,457 and 2,800,458, the interfacial polymerization method as disclosed in British Patent 990,443, U.S. Pat. No. 3,287,154, JP-B-38-19574, JP-B-42-446 and JP-B-42-711, the method by the precipitation of a polymer as disclosed in U.S. Pat. Nos. 3,418,250 and 3,660,304, the method using isocyanate polyol wall materials as disclosed in U.S. Pat. No. 3,796,669, the method using isocyanate wall materials as disclosed in U.S. Pat. No. 3,914,511, the method using urea-formaldehyde-based or urea-formaldehyde-resorcinol-based wall materials as disclosed in U.S. Pat. Nos. 4,001,140, 4,087,376 and 4,089,802, the method using wall materials, such as melamine-formaldehyde resins and hydroxy cellulose, as disclosed in U.S. Pat. No. 4,025,445, the monomer polymerization in situ method as disclosed in JP-B-36-9163 and JP-B-51-9079, the spray drying method as disclosed in British Patent 930,422 and U.S. Pat. No. 3,111,407, and the electrolytic dispersion cooling method as disclosed in British Patents 952,807 and 967,074 can be exemplified, but the present invention is not limited thereto.

The microcapsule walls preferably used in the development on machine type thermal negative image-forming layer have three dimensional crosslinking and a property of swelling by a solvent. From this point of view, polyurea, polyurethane, polyester, polycarbonate, polyamide, and the mixtures of these compounds are preferably used as the microcapsule wall materials, and polyurea and polyurethane are particularly preferred. Microcapsule wall may contain a compound having a heat-reactive functional group.

Microcapsules preferably have an average size of from 0.01 to 20 μm, more preferably from 0.05 to 2.0 μm, and particularly preferably from 0.10 to 1.0 μm. Excellent definition and aging stability can be obtained with the average size of this range.

Microcapsules may coalesce by heat or may not coalesce. In brief, it is sufficient that the content of a microcapsule which oozes out or permeates in the microcapsule wall at coating time should cause a chemical reaction by heat, or may react with a hydrophilic resin or a low molecular compound added. Alternatively, two or more microcapsules containing different heat-reactive functional groups may be reacted to each other.

Accordingly, it is preferred from image-forming that microcapsules are melted and coalesced by heat but not essential.

The addition amount of microcapsules to the development on machine type thermal negative image-forming layer is preferably from 10 to 60 wt %, more preferably from 15 to 40 wt %, in terms of solid content. Excellent developing property on machine and, at the same time, satisfactory sensitivity and good press life can be obtained with the addition amount of this range.

When microcapsules are added to the development on machine type thermal negative image-forming layer, solvents which can dissolve and swell the content of the microcapsules can be added to the dispersion medium of the microcapsules. Due to such solvents, the diffusion of the compound containing a heat-reactive functional group out of the microcapsules is accelerated.

Such solvents can be easily selected from among commercially available solvents, although they depend upon the dispersion media, the wall materials, the wall thickness and the contents of microcapsules. For example, in the case of water-dispersible microcapsules comprising crosslinked polyurea and polyurethane walls, alcohols, ethers, acetals, esters, ketones, polyhydric alcohols, amides, amines and fatty acids are preferably used.

The specific examples of the solvents include methanol, ethanol, tertiarybutanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide, and N,N-dimethylacetamide, but the present invention is not limited thereto. These solvents may be used in combination of two or more.

Solvents which are not dissolved in microcapsule dispersion solutions but are dissolved when the above solvents are mixed can also be used in the present invention. The addition amount of the solvent is decided depending upon the combination of the materials but the addition amount is generally preferably from 5 to 95 wt %, more preferably from 10 to 90 wt %, and most preferably from 15 to 85 wt %, based on the coating solution.

Since fine particle polymers or microcapsules containing these heat-reactive functional groups are used in the development on machine type thermal negative image-forming layer, the compound which initiates or accelerates the reaction may be added, if necessary. As the reaction-initiating or accelerating compounds, compounds which generate radicals of cations by heat, e.g., lophine dimers, trihalomethyl compounds, peroxides, azo compounds, onium salts containing diazonium salt or diphenyl iodonium salt, acylphosphine and imidosulfonate can be exemplified These compounds can be added in an amount of from 1 to 20 wt % based on the solid content of the development on machine type thermal negative image-forming layer, preferably from 3 to 10 wt %. The excellent effect of reaction initiation or acceleration without impairing the developing property on machine can be obtained with the addition amount of this range.

Hydrophilic resins may be added to the development on machine type thermal negative image-forming layer. By the addition of hydrophilic resins, not only the developing property on machine can be improved but also the film strength of the development on machine type thermal negative image-forming layer itself can be improved.

Hydrophilic resins having a hydrophilic group such as a hydroxyl group, a carboxyl group, a hydroxyethyl group, a hydroxypropyl group, an amino group, an aminoethyl group, an aminopropyl group or a carboxymethyl group are preferred.

The specific examples of hydrophilic resins include gum arabic, casein, gelatin, starch derivatives, carboxymethyl cellulose and sodium salts of it, cellulose acetate, sodium alginate, vinyl acetate-maleic acid copolymers, styrene-maleic acid copolymers, polyacrylic acids and the salts of them, polymethacrylic acids and the salts of them, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having the degree of hydrolysis of at least 60 wt % and preferably at least 80 wt %, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide.

The addition amount of hydrophilic resins to the development on machine type thermal negative image-forming layer is preferably from 5 to 40 wt %, preferably from 10 to 30 wt %, based on the solid content of the layer. Excellent developing property on machine and good film strength can be obtained with the addition amount of this range.

To the thermal positive type image-forming layer, the thermal negative type image-forming layer and the development on machine type thermal negative image-forming layer described in detail above may be added in common light/heat converting agents for converting light such as laser rays to heat and, if necessary, printing out agents for obtaining visible images immediately after heating by exposure, dyes and pigments as coloring agents for coloring images, and plasticizers for giving flexibility to the image-forming layer.

As the light/heat converting agents, various pigments and dyes can be used in the present invention. As such pigments, the pigments commercially available and pigments described in Color Index (C.I.), *Shaishin Ganryo Binran* (*The Latest Pigment Handbook*), compiled by Nihon Ganryo Gijutsu Kyokai (1977), *Shaishin Ganryo Oyo Gijutsu* (*The Latest Pigment Applied Technique*), published by CMC Publishing Co. Ltd. (1986), *Insatsu Ink Gijutsu* (*Printing Ink Technique*), CMC Publishing Co. Ltd. (1984) can be used.

Various kinds of pigments can be used, e.g., black pigments, yellow pigments, orange pigments, brown pigments, red pigments, purple pigments, blue pigments, green pigments, fluorescent pigments, metallic powder pigments, and polymer-bonding pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used.

These pigments can be used without surface treatment or may be surface-treated. As methods of surface treatments, a method of surface-coating with resins and waxes, a method of adhering surfactants, and a method of bonding reactive substances (e.g., silane coupling agents, epoxy compounds, and polyisocyanate) on the surfaces of pigments can be exemplified. These surface treatment methods are described in *Kinzoku Sekken no Seishitsu to Oyo* (*Natures and Applications of Metal Soaps*), Saiwai Shobo Co., Ltd., *Insatsu Ink Gijutsu* (*Printing Ink Technique*), CMC Publishing Co., Ltd. (1984), and *Shaishin Ganryo Oyo Gijutsu* (*The Latest Pigment Applied Technique*), CMC Publishing Co., Ltd. (1986).

The particle size of pigments is preferably from 0.01 to 10 $\mu$m, more preferably from 0.05 to 1 $\mu$m, and particularly preferably from 0.1 to 1 $\mu$m. When the particle size of pigments is less than 0.1 $\mu$m, it is not preferred from the viewpoint of the stability of the dispersion in an image-forming layer-coating solution, while when it exceeds 10 $\mu$m, it is not preferred in view of the uniformity of the image-forming layer. Well-know dispersing methods used in the manufacture of inks and toners can be used as dispersing methods of these pigments. The examples of dispersing apparatus include an ultrasonic disperser, a sand mill, an attritor, a pearl mill, a super-mill, a ball mill, an impeller, a disperser, a KD mill, a colloid mill, a dynatron, a three-roll mill and a pressure kneader, and details are described in *Shaishin Ganryo Oyo Gijutsu* (*The Latest Pigment Applied Technique*), CMC Publishing Co., Ltd. (1986).

As dyes for this purpose, the dyes commercially available and well-known dyes described, for example, in *Senryo Binran* (*Dye Handbook*), compiled by Yuki Gosei Kagaku Kyokai (1970) can be utilized. Specifically, azo dyes, metal complex azo dyes, pyrazolone azo dyes, anthraquinone dyes, phthalocyanine dyes, carbonium dyes, quinoneimine dyes, methine dyes, and cyanine dyes can be used. Of these pigments and dyes, those which absorb infrared rays or near infrared rays are particularly preferably used in the laser which emits infrared rays or near infrared rays.

As such pigments which absorb infrared rays or near infrared rays, carbon blacks are preferably used. Further, as dyes which absorb infrared rays or near infrared rays, e.g., the cyanine dyes disclosed in JP-A-58-125246, JP-A-59-84356, JP-A-59-202829 and JP-A-60-78787, the methine dyes disclosed in JP-A-58-173696, JP-A-58-181690 and JP-A-58-194595, the naphthoquinone dyes disclosed in JP-A-58-112793, JP-A-58-224793, JP-A-59-48187, JP-A-59-73996, JP-A-60-52940 and JP-A-60-63744, the squarylium dyes disclosed in JP-A-58-112792, and the cyanine dyes disclosed in British Patent 434,875 can be exemplified.

Further, the near infrared-absorbing sensitizers disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium based compounds disclosed in JP-A-58-181051, JP-A-58-220143, JP-A-59-41363, JP-A-59-84248, JP-A-59-84249, JP-A-59-146063, and JP-A-59-146061, the cyanine dyes disclosed in JP-A-59-216146, the pentamethine thiopyrylium salts disclosed in U.S. Pat. No. 4,283,475, the pyrylium compounds disclosed in JP-B-5-13514 and JP-B-5-19702, Epolight III-178, Epolight III-130 and Epolight III-125 (manufactured by Epolin Co., Ltd.) are particularly preferably used.

As another example of particularly preferred dyes, the near infrared-absorbing dyes disclosed in U.S. Pat. No. 4,756,993 as formulae (I) and (II) can be exemplified. These pigments or dyes can be added to the image-forming layer in an amount of from 0.01 to 50 wt %, preferably from 0.1 to 10 wt %, based on the entire solid content of the image-forming layer, and in the case of the dyes, particularly preferably the amount of from 0.5 to 10 wt % and in the case of the pigments, particularly preferably the amount of from 3.1 to 10 wt %, can be added to the image-forming layer. When the addition amount of these pigments or dyes is less than 0.01 wt %, the sensitivity lowers, and when the amount exceeds 50 wt %, the uniformity of the image-forming layer is lost and the durability of the image-forming layer is deteriorated.

As the printing out agent, combinations of the compounds which release an acid upon heating by exposure (light/acid releasing agents) with the organic dyes which can form a salt can be exemplified as representatives. Specifically, the combinations of o-naphthoquinonediazide-4-sulfonic acid halogenide with salt-forming organic dyes disclosed in JP-A-50-36209 and JP-A-53-8128, and the combinations of trihalomethyl compounds with salt-forming organic dyes disclosed in JP-A-53-36223, JP-A-54-74728, JP-A-60-3626, JP-A-61-143748, JP-A-61-151644 and JP-A-63-58440 can be exemplified. As such trihalomethyl compounds, there are oxazole compounds and triazine compounds and both are excellent in aging stability and clear printing out image can be obtained.

As the coloring agents of an image, other dyes can be used besides the above-described salt-forming organic dyes. Oil-soluble dyes and basic dyes can be exemplified as proper dyes in addition to the salt-forming organic dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, dyes disclosed in JP-A-62-293247 are particularly preferably used as coloring agents of an image. These dyes can be added to the image-forming layer in an amount of from 0.01 to 10 wt %, preferably from 0.1 to 3 wt %, based on the entire solid content of the image-forming layer.

As plasticizers, e.g., butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid and methacrylic acid can be used.

The above-described ablation type image-forming layer, the thermal positive type image-forming layer and the thermal negative type image-forming layer comprising organic substances are in general manufactured by dissolving each component in a solvent and coating the coating solution on the metal layer having a hydrophilic surface.

The examples of the solvents used herein include ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone and toluene, but solvents are not limited thereto.

These solvents are used alone or as mixture. The concentration of the above components (entire solid content inclusive of additives) in a solvent is preferably from 1 to 50 wt %. The coating amount obtained after coating and drying (solid content) is varied according to purposes, but it is generally preferably from 0.5 to 5.0 g/m$^2$ in the case of the lithographic printing plate precursor.

Surfactants, e.g., fluorine surfactants disclosed in JP-A-62-170950 can be added to the coating solution for improving the coating property. The addition amount of surfactants is preferably from 0.01 to 1 wt %, more preferably from 0.05 to 0.5 wt %, based on the content of the image-forming layer.

Various coating methods can be used, e. g., bar coating, rotary coating, spray coating, curtain coating, dip coating, air knife coating, blade coating and roll coating can be used.

Plate-Making Method

The plate-making method of a lithographic printing plate using a lithographic printing plate precursor will be described below. The above-described lithographic printing plate precursor having a heat-sensitive type image-forming layer can be applied to direct imagewise heat-sensitive recording by means of a thermal recording head, or subjected to image exposure by means of a solid state laser or a semiconductor laser emitting infrared rays of the wavelength of from 760 to 1,200 nm, or an infrared lamp, or high intensity ultraviolet ray or visible ray flash exposure by a xenon electric discharge lamp.

Writing of images may be any of current exposure system and scanning system. The former case is infrared ray irradiation system, or the system of irradiating the plate precursor with xenon electric discharge lamp of high illumination intensity for a short time period and generating heat by light/heat conversion. When a current exposure light source such as an infrared lamp is used, preferred exposure amount varies by the illumination intensity but generally current exposure intensity before being modulated by images for printing is preferably from 0.1 to 10 J/cm$^2$, more preferably from 0.3 to 1 J/cm$^2$.

In the latter case, scanning is performed on the printing plate precursor using laser light sources containing a large amount of infrared ray components with modulating the laser beams by printing images. The examples of laser light sources include a semiconductor laser, a helium-neon laser, a helium-cadmium laser, and a YAG laser. It is preferred to perform irradiation with laser beams having peak output of 1,000 W, preferably 2,000 W. In this case, the exposure amount is preferably in current exposure intensity before modulation by images for printing of from 0.1 to 10 J/cm$^2$, more preferably from 0.3 to 1 J/cm$^2$.

The imagewise exposed lithographic printing plate precursor is subjected to development and, if necessary, gumming, and mounted on a printing machine and printing can be performed. The lithographic printing plate precursor can be mounted on a printer immediately after exposure without being subjected to development step and printing can be performed. In this case, the heated part or exposed part is swelled by a fountain solution and the swollen part is removed at initial stage of printing, thus a lithographic printing plate is formed. That is, in the plate-making method using the lithographic printing plate precursor according to the present invention, a lithographic printing plate can be formed without particularly subjecting to development processing. "Development processing" used herein means development processing with water or a developing solution having pH 2 or more containing water as a main component.

When development is performed or not performed, to perform heating treatment after exposure is preferred from the viewpoint of improving sensitivity at recording. Heating is preferably performed at 80 to 150° C. for 10 seconds to 5 minutes. That is, the laser energy necessary for recording can be reduced at laser irradiation time by performing the heating treatment.

The lithographic printing plate precursor obtained through these treatments is mounted on an offset printing machine after development or without developing step and used for printing of a large number of sheets.

The more preferred second embodiment of the present invention is described below.

FIG. 1 is a cross sectional view of the lithographic printing plate precursor according to the present invention. As shown in FIG. 1, lithographic printing plate precursor 1 of the present invention comprises aluminum support 4 comprising aluminum sheet 2 having formed thereon anodic oxide film 3, particle layer 5 comprising particles having an average particle diameter of from 8 to 800 nm, and heat-sensitive layer 6 provided in this order. Micro pore 7 in anodic oxide film 3 is sealed by particle layer 5 but has a void inside. In the sealing treatment of prior techniques, the micro pore on an anodic oxide film is filled in with boehmite to leave almost no void. The technique of the present invention largely differs from the prior techniques in the point that the micro pore of the present invention is void.

Due to the above constitution, the lithographic printing plate precursor of the present invention has the heat insulating property by the particle layer and by the void of the micro pore, as a result, heat diffusion from the heat-sensitive layer to the aluminum support is sufficiently inhibited and heat is efficiently used in image-forming. Accordingly, a lithographic printing plate precursor which is high sensitivity, excellent in press life and prevented in the generation of smearing in the non-image area can be realized according to the present invention.

The void ratio of the anodic oxide film of the lithographic printing plate precursor is preferably from 20 to 70%.

In the lithographic printing plate precursor of the present invention, the heat conductivity of the particles is preferably 60 W/(m·K) or less.

It is preferred that the particle layer is a layer obtained by electrolyzing the aluminum support with an electrolyte containing hydrophilic particles having an average particle diameter of from 8 to 800 nm.

The lithographic printing plate precursor of the present invention is described in further detail below.

Aluminum Support

Aluminum Sheet (Rolled Aluminum)

The aluminum sheets preferably used in the present invention comprise metals containing dimensionally stable aluminum as a main component, i.e., aluminum or aluminum alloys. Besides a pure aluminum sheet, alloy sheets containing a trace amount of foreign elements with aluminum as a primary component, plastic films or paper laminated or deposited with aluminum or aluminum alloys can be used. A composite sheet comprising a polyethylene terephthalate sheet having bonded thereon an aluminum sheet as disclosed in JP-B-48-18327 can also be used.

In the following description, an aluminum sheet is used as a general term for various kinds of substrates comprising the above-described aluminum or aluminum alloys and various kinds of substrates having layers comprising aluminum or aluminum alloys. The foreign elements which may be contained in an aluminum alloy are silicon, iron, manganese, copper, magnesium, chromium, zinc, bismuth, nickel and titanium. As the alloy components, the content of foreign elements is 10 wt % or less.

Particularly preferred aluminum sheets for use in the present invention are pure aluminum sheets but 100% pure aluminum is difficult to produce from the refining technique, accordingly an extremely small amount of foreign elements may be contained. The composition of aluminum plates used in the present invention are not specified as described above, and conventionally well-known and commonly used aluminum materials, e.g., aluminum alloy sheets according to JIS A1050, JIS A1100, JIS A3005 and Internationally Registered Alloy 3103A, can be used arbitrarily. The aluminum sheets for use in the present invention have a thickness of from about 0.1 to about 0.6 mm. The thickness can be optionally changed in accordance with the sizes of printing machine, the sizes of printing plates and the desire of users.

The aluminum support for use in the lithographic printing plate precursor of the present invention is obtained by providing an anodic oxide film on the aluminum sheet. Various steps may be included in the producing step of the aluminum support besides the anodic oxidation treatment.

Surface Roughening Treatment (Surface Graining Treatment)

The aluminum sheet is subjected to surface graining treatment in more preferred form. Surface graining is performed by mechanical graining (mechanical surface roughening) as disclosed in JP-A-56-28893, chemical etching and electrolytic graining. Further, electrochemical surface graining (electrochemical surface roughening) by performing graining treatment electrochemically in a hydrochloric acid electrolyte or a nitric acid electrolyte, wire brush graining of scratching an aluminum surface with metal wire, ball graining of graining an aluminum surface with abrading balls and an abrasive, and brush graining of graining an aluminum surface with a nylon brush and an abrasive can be used. These graining methods can be used in combination.

The surface graining method preferably used in the present invention is an electrochemical surface roughening method of performing graining electrochemically in a hydrochloric acid electrolyte or a nitric acid electrolyte. Preferred quantity of anode electricity is from 50 to 400 $C/dm^2$. Specifically, e.g., graining is performed in an electrolyte containing from 0.1 to 50 wt % of a hydrochloric acid or a nitric acid at 20 to 100° C. for 1 second to 30 minutes by direct current or alternating current on condition of from 10 to 100 $A/dm^2$ of electric current density. Since minute concavities and convexities can be easily provided on the surface of a support according to electrochemical surface roughening method, this method is also preferred to improve the adhesion of a heat-sensitive layer and a substrate.

Due to this surface roughening treatment, crater-like or honeycomb-like pits (i.e., pores) having an average diameter of from 0.5 to 20 $\mu m$ can be formed on the surface of an aluminum sheet at area coverage of from 30 to 100%. The pores provided have function of improving the smearing resistance of the non-image area and the press life of a lithographic printing plate precursor. In electrochemical treatment, the required quantity of electricity for providing sufficient pores on the surface of a sheet, i.e., the product of electric current and treating time, is an important condition in electrochemical surface roughening. That sufficient pores can be formed with less quantity of electricity is preferred in view of energy saving. It is preferred that the surface roughness after surface roughening treatment in conformity with JIS B0601-1994 is 0.8 mm in a cutoff value, and an arithmetic average surface roughness (Ra) is from 0.2 to 0.7 μm measured by evaluation length of 3.0 mm. The above electrochemical surface roughening treatment can be used in combination with electrochemical surface roughening treatment and mechanical surface roughening treatment of different conditions.

Etching Treatment

The thus-surface treated aluminum sheet by graining treatment is then subjected to chemical etching with an acid or an alkali.

When acids are used as the etchant, time is taken to destroy minute structure hence industrially disadvantageous to be applied to the present invention, however, this problem can be improved by using an alkali agent as the etchant.

The alkali agents preferably used in the present invention are not particularly restricted and, e.g., sodium hydroxide, sodium carbonate, sodium aluminate, sodium metasilicate, sodium phosphate, potassium hydroxide and lithium hydroxide can be used.

The conditions of alkali etching are not particularly restricted. The concentration of an alkali agent is preferably from 1 to 50 wt %, the temperature of an alkali agent is preferably from 20 to 100° C., and the dissolving amount of an aluminum sheet is preferably from 0.01 to 20 g/$m^2$, more preferably from 0.1 to 5 g/$m^2$.

To remove the smut remaining on the surface of the aluminum sheet after etching treatment, the aluminum sheet is washed with an acid. As the acids used for washing, e.g., a nitric acid, a sulfuric acid, a phosphoric acid, a chromic acid, a fluoric acid and a borofluoric acid can be exemplified. In particular, as particularly preferred smut-removing methods after electrochemical surface roughening treatment, the method of bringing the aluminum sheet into contact with a 15 to 65 wt % sulfuric acid at 50 to 90° C. as disclosed in JP-A-53-12739, and the alkali etching method as disclosed in JP-B-48-28123 are exemplified.

Anodic Oxidation Treatment

The thus-treated aluminum sheet is further subjected to anodic oxidation treatment. Anodic oxidation treatment can be performed according to ordinary methods in this industry. Specifically, an anodic oxide film can be formed by turning on an alternating or direct current to the aluminum sheet in an aqueous solution or non-aqueous solution comprising alone or combination of two or more of a sulfuric acid, a phosphoric acid, a chromic acid, an oxalic acid, a sulfamic acid or a benzenesulfonic acid.

At this time, the components at least ordinarily contained in Al alloy sheets, electrodes, city water and ground water may be contained in the electrolyte. Further, the second and third components may be contained. "The second and third components" herein means a metal ion of, e.g., Na, K, Mg, Li, Ca, Ti, Al, V, Cr, Mn, Fe, Co, Ni, Cu or Zn; a cation, e.g., an ammonium ion; and an anion, e.g., a nitrate ion, a carbonate ion, a chloride ion, a phosphate ion, a fluoride ion, a sulfite ion, a titanate ion, a silicate ion or a borate ion, and they can be contained in concentration of about 0 to 10,000 ppm.

The treatment conditions of anodic oxidation vary according to the electrolytes to be used hence cannot be mentioned unconditionally but in general it is preferred that the concentration of an electrolyte is from 1 to 80 wt %, the temperature of the solution is from 5 to 70° C., the electric current density is from 0.5 to 60 A/$dm^2$, the voltage is from 1 to 100 V, and the time of electrolysis is from 10 to 200 seconds.

Of anodic oxidation treatments, the method of anodization in a sulfuric acid electrolyte at high electric current density as disclosed in British Patent 1,412,768 and the method of anodization using a phosphoric acid as the electrolytic bath as disclosed in U.S. Pat. No. 3,511,661 are particularly preferred.

In the present invention, the amount of an anodic oxide film is preferably from 1 to 10 g/$m^2$, when the amount is less than 1 g/$m^2$, the printing plate becomes liable to be scratched, while when the amount exceeds 10 g/$m^2$, a vast quantity of electric power is required, thus economically disadvantageous. The amount of an anodic oxide film is more preferably from 1.5 to 7 g/$m^2$, and particularly preferably from 2 to 5 g/$m^2$.

In the present invention, the void ratio of an anodic oxide film is preferably from 20 to 70%, more preferably from 30 to 60%, and most preferably from 40 to 50%. When the void ratio of an anodic oxide film is 20% or more, the heat diffusion to the aluminum support is sufficiently inhibited and higher sensitivity can be sufficiently obtained. When the void ratio an anodic oxide film is 70% or less, smearing is difficult to occur in the non-image area.

Pore-widening Treatment

The aluminum support provided with an anodic oxide film in the manner as described above is, if necessary, subjected to pore-widening treatment for the purpose of adjusting the void ratio of the anodic oxide film to preferred range.

This treatment is performed by immersing the aluminum sheet in an aqueous solution of an acid or an alkali for adjusting the pore diameter of the anodic oxide film to 8 to 500 nm, preferably from 10 to 150 nm.

The aqueous solution of an acid is preferably an aqueous solution of a sulfuric acid, a phosphoric acid or mixture of them. The concentration of the aqueous solution of an acid is preferably from 10 to 500 g/liter, more preferably from 20 to 100 g/liter. The temperature of the acid aqueous solution is preferably from 10 to 90° C., more preferably from 40 to 70° C. The immersion time in the acid aqueous solution is preferably from 10 to 300 seconds, more preferably from 30 to 120 seconds.

The aqueous solution of an alkali is preferably an aqueous solution of sodium hydroxide, potassium hydroxide, lithium hydroxide, or mixture of them. The pH of the alkali aqueous solution is preferably from 11 to 14, more preferably from 11.5 to 13.5. The temperature of the alkali aqueous solution is preferably from 10 to 90°, more preferably from 20 to 60° C. The immersion time in the alkali aqueous solution is preferably from 5 to 300 seconds, more preferably from 10 to 60 seconds.

Particle Layer

Formation of Particle Layer

A particle layer comprising particles having an average particle diameter of from 8 to 800 nm, preferably from 10 to 500 nm, more preferably from 10 to 150 nm, is provided on the above-obtained aluminum support. When the average particle diameter is 8 nm or more, the particles are difficult to enter into the inside of the pore provided on the surface of the anodic oxide film, and higher sensitivity can be sufficiently obtained. When the average particle diameter is 800 nm or less, the adhesion to the heat-sensitive layer is enhanced, and so excellent press life can be obtained. The thickness of the particle layer is preferably from 8 to 800 nm, more preferably from 10 to 500 nm.

The heat conductivity of the particles is preferably 60 W/(m·K) or less, more preferably 40 W/(m·K) or less, and particularly preferably from 0.3 to 10 W/(m·K). When the heat conductivity of the particles is 60 W/(m·K) or less, the heat diffusion to the aluminum support is sufficiently inhibited and higher sensitivity can be sufficiently obtained.

The particle layer may be provided by any method, but a method of electrolyzing the aluminum support with an electrolyte containing hydrophilic particles having an average particle diameter of from 8 to 800 nm by DC or AC is preferred. As the wave form of alternating electric current for use in the above electrolytic treatment, a sine wave, a rectangular wave, a triangular wave and a trapezoidal wave can be exemplified. The frequency of alternating electric current is preferably from 30 to 200 Hz, more preferably from 40 to 120 Hz, in view of the economical point of the production of an electric power unit. When a trapezoidal wave is used as the wave form of alternating electric current, the time tp required for the electric current to reach the peak is preferably from 0.1 to 2 msec, more preferably from 0.3 to 1.5 msec. When the tp is less than 0.1 msec, great source voltage is necessary at the time of the rise of the wave form of alternating electric current by the influence of the impedance in the power circuit, and in some cases the equipment cost of an electric source increases.

As the hydrophilic particles, it is preferred to use alone or in combination of two or more of $Al_2O_3$, $TiO_2$, $SiO_2$ and $ZrO_2$. The electrolyte can be obtained by suspending the hydrophilic particles in water so that the content of the particles is from 0.01 to 20 wt % of the entire. The pH of the electrolyte can be adjusted by adding, e.g., a sulfuric acid, to be charged in plus or minus. The electrolytic treatment is performed by using the above electrolyte by applying direct current to the aluminum support as the cathode at voltage of from 10 to 200 V for 1 to 600 seconds.

According to this method, the mouths of the micro pores on the anodic oxide film can be easily sealed with leaving void inside.

Hydrophilization Treatment

The aluminum support provided with the particle layer is preferably subjected to hydrophilization treatment. As the hydrophilization treatment, the method of treating the aluminum support with an alkali metal silicate as disclosed in U.S. Pat. Nos. 2,714,066 and 3,181,461, the method of treating the aluminum support with a potassium fluorozirconate as disclosed in JP-B-36-22063, the method of treating the aluminum support with a polyvinyl phosphoric acid as disclosed in U.S. Pat. No. 4,153,461, the method of treating the aluminum support with an aqueous solution containing a phosphoric acid and an inorganic fluorine compound as disclosed in JP-A-9-244227, and the method of treating the aluminum support with an aqueous solution containing a titanium and a fluorine as disclosed in JP-A-10-252078 and JP-A-10-263411 can be exemplified. Of these methods, the method of treating with an alkali metal silicate and the method of treating with a polyvinyl phosphonic acid are preferred.

Sodium silicate, potassium silicate and lithium silicate are used as the alkali metal silicate for use in the method of treating with an alkali metal silicate.

As the method of treating with an alkali metal silicate, a method of immersing the aluminum support having the particle layer in an aqueous solution of alkali metal silicate having concentration of from 0.01 to 30 wt %, preferably 0.01 to 10 wt %, and particularly preferably from 0.05 to 3 wt %, pH at 25° C. of from 10 to 13, at 4 to 80° C. preferably for 0.5 to 120 seconds, more preferably for 2 to 30 seconds can be exemplified. The treating conditions, such as concentration of the alkali metal silicate, pH, temperature and treating time can be selected arbitrarily. When the pH of the alkali metal silicate aqueous solution is lower than 10, the solution is liable to gel, while when the pH is higher than 13, there is the possibility that the particle layer and the anodic oxide film are dissolved, thus attention must paid to this point.

In the hydrophilization treatment according to the present invention, if necessary, a hydroxide, e.g., s sodium hydroxide, a potassium hydroxide or a lithium hydroxide can be added to the aqueous solution of alkali metal silicate to increase the pH of the solution.

Further, if necessary, alkaline earth metal salts and/or metal salts belonging to IVb group may be added to the aqueous solution of alkali metal silicate. As the alkaline earth metal salts, nitrate of alkaline earth metal salts (e.g., calcium nitrate, strontium nitrate, magnesium nitrate, and barium nitrate), and water-soluble salts of these alkaline earth metal salts, such as sulfate, hydrochloride, phosphate, acetate, oxalate and borate can be exemplified. As the metal salts belonging to IVb group, titanium tetrachloride, titanium trichloride, potassium titanium fluoride, potassium titanium oxalate, titanium sulfate, titanium tetraiodide, zirconium chloride oxide, zirconium dioxide, zirconium oxychloride, and zirconium tetrachloride can be exemplified. The alkaline earth metal salts and the metal salts belonging to IVb group can be used alone or in combination of two or more. These metal salts are preferably used in an amount of from 0.01 to 10 wt %, more preferably from 0.05 to 5.0 wt %.

The concentration of the polyvinyl phosphoric acid in the aqueous solution for use in the method of treating with a polyvinyl phosphoric acid is from 0.01 to 10 wt %, preferably from 0.1 to 5 wt %, and more preferably from 0.2 to 2.5 wt %. The temperature is 10 to 70° C. and preferably 30 to 60° C. The hydrophilization treatment can be performed by immersing the aluminum support having the particle layer in the solution for 0.5 second to 10 minutes, preferably from 1 to 30 seconds.

With respect to details of each treatment described above, well-known techniques can be adopted. The contents of the literature quoted in this specification are the contents of the specification by quotation.

Undercoating Layer

In the present invention, if necessary, an inorganic undercoating layer of a water-soluble metal salt, such as zinc borate, or an organic undercoating layer may be provided on the above-obtained aluminum support before providing a heat-sensitive layer.

As the organic compounds for use in the organic undercoating layer, e.g., carboxymethyl cellulose; dextrin; gum arabic; polymers and copolymers having a sulfonic acid group at the side chain; polyacrylic acid; phosphonic acids having an amino group, such as 2-aminoethylphosphonic acid; organic phosphonic acid which may have a substituent, such as phenylphosphonic acid, naphthylphosphonic acid, alkyl-phosphonic acid, glycerophosphonic acid, methylenedi-phosphonic acid, and ethylenediphosphonic acid; organic phosphoric acid which may have a substituent, such as phenyl-phosphoric acid, naphthylphosphoric acid, alkylphosphoric acid, and glycerophosphoric acid; organic phosphinic acid which may have a substituent, such as phenylphosphinic acid, naphthylphosphinic acid, alkylphosphinic acid, and glycerophosphinic acid; amino acids such as glycine and β-alanine; hydrochloride of amine having a hydroxyl group, such as hydrochloride of triethanolamine; and yellow dyes are exemplified. These compounds may be used alone or in combination of two or more of them.

An organic undercoating layer can be provided by any of the following methods. That is, a method of dissolving the above organic compound in water or an organic solvent, e.g., methanol, ethanol, methyl ethyl ketone, or a mixed solvent of them, coating the thus-obtained solution on the aluminum support and then drying, to thereby provide an organic undercoating layer; and a method of dissolving the above organic compound in water or an organic solvent, e. g. methanol, ethanol, methyl ethyl ketone, or a mixed solvent of them, immersing the aluminum support in the thus-obtained solution to make the aluminum support adsorb the above organic compound, washing the aluminum support with water and then drying, to thereby provide an organic undercoating layer.

In the former method, the concentration of the solution having dissolved therein the above organic compound is preferably from 0.005 to 10 wt %. Coating can be performed by using any of bar coating, rotary coating, spray coating and curtain coating. In the latter method, the concentration of the solution having dissolved therein the above organic compound is preferably from 0.01 to 20 wt %, more preferably from 0.05 to 5 wt %. The immersion temperature is preferably from 20 to 90° C., more preferably from 25 to 50° C., the immersion time is preferably from 0.1 second to 20 minutes, more preferably from 2 seconds to 1 minute. The pH of the solution for use in these methods can be adjusted to 11 to 12 with basic substance such as ammonia, triethylamine and potassium hydroxide, and acidic substance such as hydrochloric acid and phosphoric acid.

The dry coating amount of the organic undercoating layer is preferably from 2 to 200 mg/$m^2$, more preferably from 5 to 100 mg/$m^2$. The press life can be improved with the above range of the dry coating amount.

Further, the intermediate layer comprising a high molecular compound having an acid group and an onium group as disclosed in JP-A-11-109637 can be used as the undercoating layer.

Heat-sensitive Layer

The lithographic printing plate precursor of the present invention comprises an aluminum support having thereon a particle layer, an undercoating layer which is provided according to necessity, and a heat-sensitive layer as described below. The heat-sensitive layer for use in the present invention is not particularly restricted so long as it is a heat-sensitive layer capable of forming an image by infrared laser exposure. For instance, a heat-sensitive layer containing a fine particle polymer having a heat-reactive functional group or microcapsules containing a compound having a heat-reactive functional group, and a heat-sensitive layer containing an infrared absorber and a high molecular compound insoluble in water but soluble in an alkali aqueous solution, whose solubility in an alkali developing solution changes and becomes to be capable of writing by infrared laser exposure can be exemplified.

With respect to the lithographic printing plate precursor according to the present invention, the case where a heat-sensitive layer containing a fine particle polymer having a heat-reactive functional group or microcapsules containing a compound having a heat-reactive functional group is described below by examples.

It is one of preferred embodiments that the heat-sensitive layer according to the present invention contains a fine particle polymer having a heat-reactive functional group or microcapsules containing a compound having a heat-reactive functional group. Concerning the microcapsules to be added to the heat-sensitive layer, the materials, addition amount and addition methods described in the item of the development on machine type thermal negative image-forming layer can be applied to the heat-sensitive layer.

Hydrophilic resins may further be added to the heat-sensitive layer. By the addition of hydrophilic resins, not only the developing property on machine can be improved but also the film strength of the heat-sensitive layer itself can be improved.

The hydrophilic resins described in the item of the development on machine type thermal negative image-forming layer and the addition amount can be applied to the heat-sensitive layer.

Further, if necessary, various compounds other than those described above may be added to the heat-sensitive layer. For example, polyfunctional monomers can be added to the matrix of the heat-sensitive layer. Those exemplified as the monomers which can be added to microcapsules can be used as such monomers. A particularly preferred monomer is a trimethylolpropane triacrylate.

For the purpose of easily discriminating an image area from a non-image area after image formation, dyes having large absorption in the visible region can be used in the heat-sensitive layer as the coloring agent of an image. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the dyes disclosed in JP-A-62-293247 can be exemplified. Further, phthalocyanine pigments, azo pigments and titanium oxide are preferably used. These coloring agents are preferably added in an amount of from 0.01 to 10 wt % based on the entire solid content of the heat-sensitive layer coating solution.

For inhibiting the unnecessary thermal polymerization of ethylenically unsaturated compounds during preparation or storage of the heat-sensitive layer coating solution, it is preferred to use a small amount of a thermal polymerization inhibitor. As appropriate thermal polymerization inhibitors, e.g., hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt are exemplified. The addition amount of these thermal polymerization inhibitors is preferably from about 0.01 to 5 wt % based on the weight of the entire composition of the heat-sensitive layer coating solution.

For preventing the polymerization inhibition by oxygen, higher fatty acid such as behenic acid, behenic acid amide and behenic acid derivative may be added to the heat-sensitive layer coating solution to be locally present on the surface of the heat-sensitive layer during drying after coating, if necessary. The addition amount of the higher fatty acid and the derivative is preferably from about 0.1 to about 10 wt % of the solid content of the heat-sensitive layer.

Plasticizers can be added to the heat-sensitive layer for improving the flexibility of the film, if necessary, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate can be used.

The heat-sensitive layer is prepared by dissolving the above-described each component in a solvent to prepare a coating solution and coating the coating solution on a resin layer. The examples of the solvents used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water, but the present invention is not limited thereto. These solvents are used alone or as mixture. The concentration of the solid content of the coating solution is preferably from 1 to 50 wt %.

The coating amount of the heat-sensitive layer on the support obtained after coating and drying (solid content) varies according to purposes, but the coating amount is generally preferably from 0.5 to 5.0 g/$m^2$. If the coating amount is less than the above range, the apparent sensitivity increases but the film property of the heat-sensitive layer which has function of image-recording lowers. Various coating methods can be used, e.g., bar coating, rotary coating, spray coating, curtain coating, dip coating, air knife coating, blade coating and roll coating are exemplified.

Surfactants, e.g., the fluorine surfactants disclosed in JP-A-62-170950, can be added to the heat-sensitive layer coating solution for improving coating property. The addition amount is preferably from 0.01 to 1 wt %, more preferably from 0.05 to 0.5 wt %, of the total solid contents of the heat-sensitive layer.

Overcoat Layer

In the lithographic printing plate precursor of the present invention, a water-soluble overcoat layer may be provided on the heat-sensitive layer comprising a lipophilic compound for preventing the contamination of the surface of the heat-sensitive layer by lipophilic substances.

The water-soluble overcoat layer for use in the present invention can be easily removed at printing time and contains resins selected from water-soluble organic high molecular compounds. The water-soluble organic high molecular compounds should have film-forming property by coating and drying. The specific examples of such high molecular compounds include polyvinyl acetate (having hydrolysis factor of 65% or more), polyacrylic acid and alkali metal salts or amine salts of it, polyacrylic acid copolymers and alkali metal salts or amine salts of them, polymethacrylic acid and alkali metal salts or amine salts of it, polymethacrylic acid copolymers and alkali metal salts or amine salts of them, polyacrylamide and copolymers of it, polyhydroxyethyl acrylate, polyvinyl pyrrolidone and copolymers of it, polyvinyl methyl ether, polyvinyl methyl ether/maleic anhydride copolymers, poly-2-acrylamide-2-methyl-1-propanesulfonic acid and alkali metal salts or amine salts of it, poly-2-acrylamide-2-methyl-1-propanesulfonic acid copolymers and alkali metal salts or amine salts of them, gum arabic, cellulose derivatives (e.g., carboxymethyl cellulose, carboxyethyl cellulose, and methyl cellulose) and modified products of them, white dextrin, pullulan, and enzyme-decomposing etherified dextrin. These resins may be used as mixture of two or more kinds according to purposes.

A water-soluble or water-dispersible light/heat converting agent may be added to the overcoat layer. In addition, a nonionic surfactant, e.g., polyoxyethylenenonylphenyl ether and polyoxyethylenedodecyl ether, can be added to the overcoat layer for the purpose of ensuring coating uniformity in the case of coating an aqueous solution.

The dry coating weight of the overcoat layer is preferably from 0.1 to 2.0 g/$m^2$. The developing property on machine is not impaired and the contamination on the surface of the heat-sensitive layer by lipophilic substances, such as fingerprints, can be prevented with the addition amount of this range.

In the present invention, when the heat-sensitive layer is a heat-sensitive layer containing a fine particle polymer having a heat-reactive functional group or microcapsules containing a compound having a heat-reactive functional group, it is preferred that at least one layer of a heat-sensitive layer, an overcoat layer and an undercoating layer contains a light/heat converting agent having the function of absorbing infrared rays and generating heat. By containing a light/heat converting agent, the effect of infrared ray absorption can be improved and heat-sensitive speed can be increased.

Substances having absorption band at at least a part of the wavelength of from 700 nm to 1,200 nm may be sufficient for this purpose, and various pigments and dyes can be used as the light/heat converting agents.

As such pigments, commercially available pigments and the infrared ray-absorbing pigments described in *Color Index* (*C.I.*) *Binran* (*Color Index* (*C.I.*) *Handbook*), *Saishin Ganryo Binran* (*The Latest Pigment Handbook*), compiled by Nihon Ganryo Gijutsu Kyokai (1977), *Saishin Ganryo Oyo Gijutsu* (*The Latest Applied Techniques of Pigments*), published by CMC Publishing Co. Ltd. (1986), and *Insatsu Ink Gijutsu* (*Printing Ink Techniques*), CMC Publishing Co. Ltd. (1984) can be used.

These pigments may be surface-treated by well-known surface treatment methods as required for improving the dispersibility in a layer to be added. As methods of surface treatments, a method of surface-coating with hydrophilic resins and lipophilic resins, a method of adhering surfactants, and a method of bonding reactive substances (e.g., silica sol, alumina sol, silane coupling agents, epoxy compounds and isocyanate compounds) on the surfaces of pigments can be exemplified.

The pigments to be added to an overcoat layer are preferably surface-coated with hydrophilic resins or silica sol so as to be dispersed with water-soluble resins and so as not to impair the hydrophilic property. The particle size of the pigments is preferably from 0.01 to 1 μm, more preferably from 0.01 to 0.5 μm. Well-known dispersing methods used in manufacturing inks and toners can be used as dispersing methods of pigments.

Of pigments, carbon black can be exemplified as a particularly preferred pigment.

As the dyes for this purpose, those commercially available and known dyes described, e.g., in *Senryo Binran* (*Dye Handbook*), compiled by Yuki Gosei Kagaku Kyokai (1970), "Kin-Sekigai Kyushu Shikiso (Near Infrared Ray Absorbing Dyes)" in *Kagaku Kogyo* (*Chemical Industry*), pp. 45 to 51 (May, 1986), 90 *Nen-dai Kinosei Shikiso no Kaihatsu to Shijo Doko* (*Development and Market Trend of Functional Dyes in the Nineties*), Item 2.3, Chapter 2, CMC Publishing Co. Ltd. (1990), or various patent specifications can be utilized.

Specifically, infrared ray-absorbing dyes, e.g., azo dyes, metal complex salt azo dyes, pyrazolone azo dyes, anthraquinone dyes, phthalocyanine dyes, carbonium dyes, quinoneimine dyes, polymethine dyes, and cyanine dyes are preferably used.

Further, as the dyes for use as the light/heat converting agent, e.g., the cyanine dyes disclosed in JP-A-58-125246, JP-A-59-84356, and JP-A-60-78787, the methine dyes disclosed in JP-A-58-173696, JP-A-58-181690, and JP-A-58-194595, the naphthoquinone dyes disclosed in JP-A-58-

112793, JP-A-58-224793, JP-A-59-48187, JP-A-59-73996, JP-A-60-52940, and JP-A-60-63744, the squarylium dyes disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, and the dyes disclosed in JP-A-10-268512 can be exemplified.

Further, as the dyes for use for this purpose, e.g., the near infrared-absorbing sensitizing dyes disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in JP-A-57-142645, the pyrylium-based compounds disclosed in JP-A-58-181051, JP-A-58-220143, JP-A-59-41363, JP-A-59-84248, JP-A-59-84249, JP-A-59-146063, and JP-A-59-146061, the cyanine dyes disclosed in JP-A-59-216146, the pentamethine thiopyrylium salts disclosed in U.S. Pat. No. 4,283,475, the pyrylium compounds disclosed in JP-B-5-13514 and JP-B-5-19702, Epolight III-178, Epolight III-130, and Epolight III-125 (manufactured by Epolin Co., Ltd.) are also be preferably used.

Of these dyes, water-soluble dyes are particularly preferably used in an overcoat layer, the binder polymer of a heat-sensitive layer and an undercoating layer and the specific examples are shown below:

(IR-1)

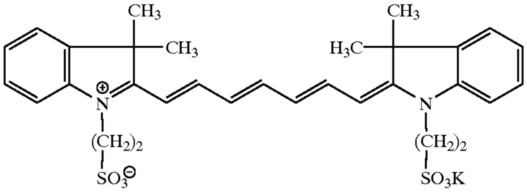

(IR-2)

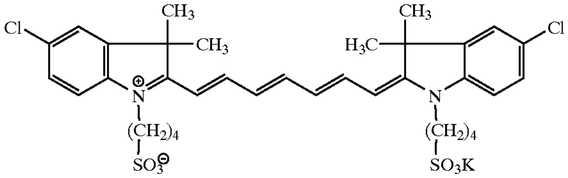

(IR-3)

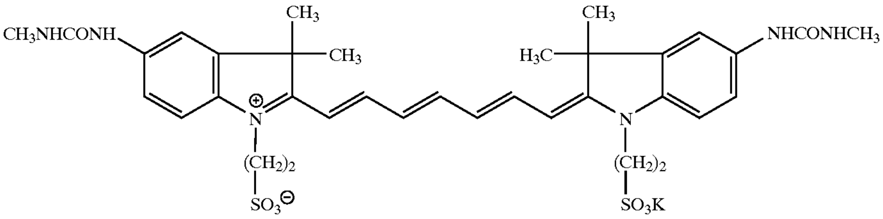

(IR-4)

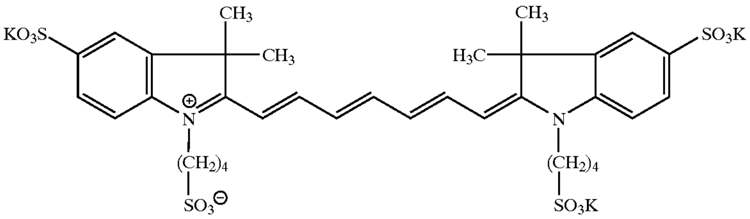

(IR-5)

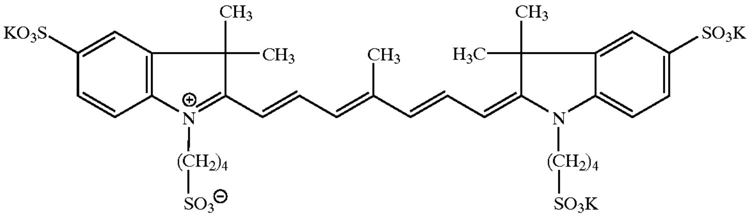

(IR-6)

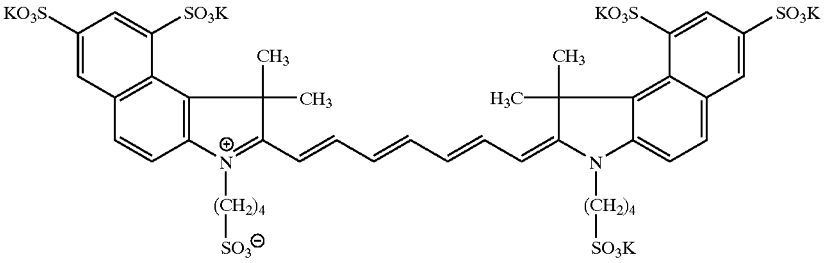

-continued
(IR-7)
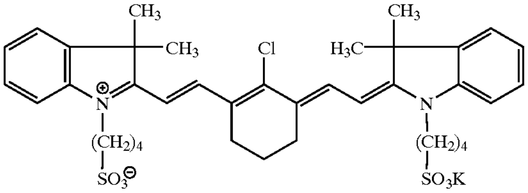
(IR-8)
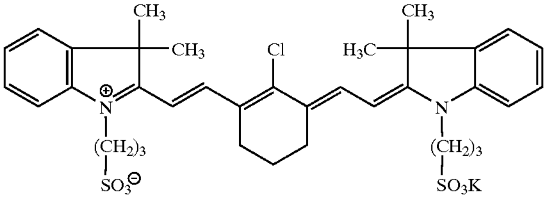
(IR-9)
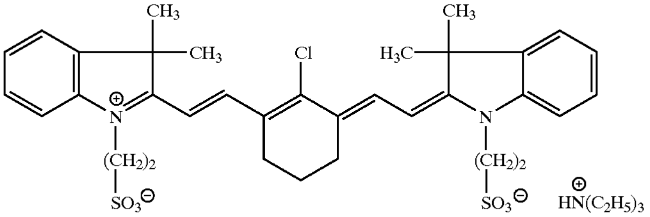
(IR-10)
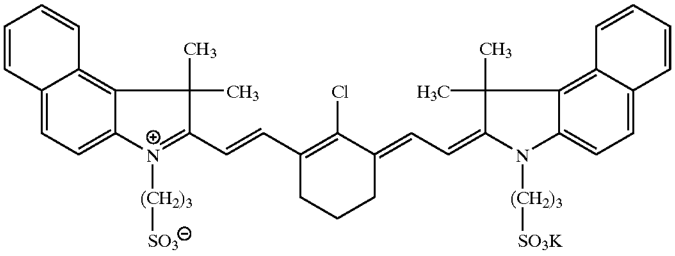
(IR-11)
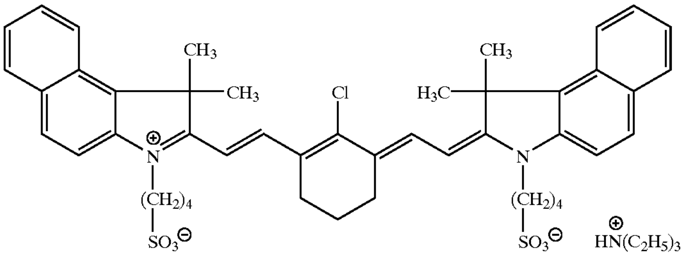
The above infrared-absorbing dyes can be used as the light/heat converting agent together with the compounds having a lipophilic heat-reactive functional group in the microcapsules in the heat-sensitive layer, but hydrophilic dyes are more preferably used. The following cyanine dyes can be exemplified as the specific examples:
(IR-21)
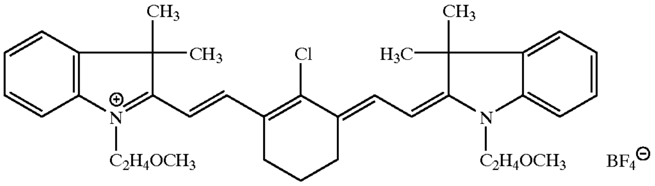
(IR-22)
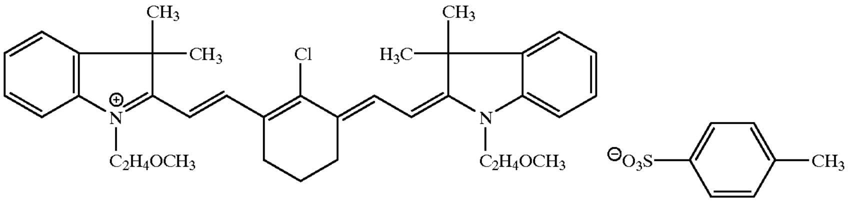

-continued (IR-23)

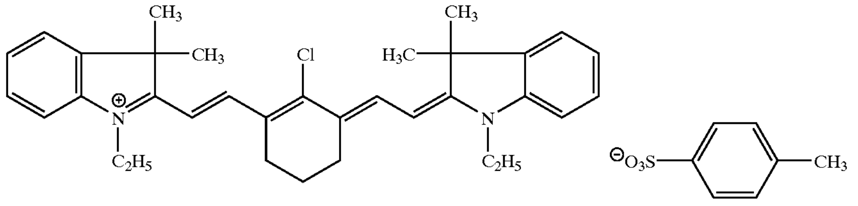

(IR-24)

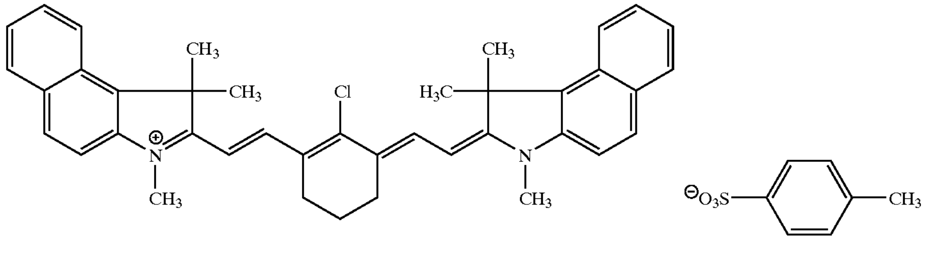

(IR-25)

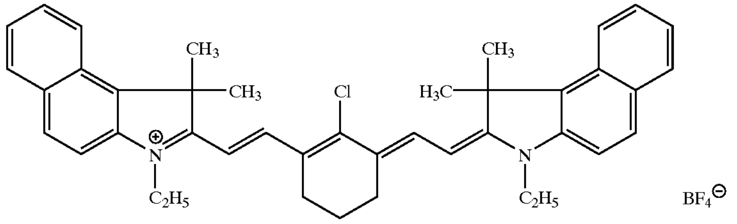

Metallic fine particles can also be used in the heat-sensitive layer as a light/heat converting agent. Many metallic fine particles are light/heat convertible and at the same time self exothermic. As the preferred metallic fine particles, the fine particles of the simple substance, alloy, oxide or sulfide of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re and Sb can be exemplified Of these metals constituting metallic fine particles, preferred metals are those liable to be coalesced by heat at the time of light irradiation, having a melting point of 1,000° C. or less, and having absorption in regions other than infrared, visible and ultraviolet regions, e.g., Re, Sb, Te, Au, Ag, Cu, Ge, Pb and Sn.

Fine particles of the metals having relatively low melting point and having relatively high absorbance in the infrared region, e.g., Au, Ag, Cu, Sb, Ge and Pb are particularly preferred, and Ag, Au and Cu are most preferred.

Light/heat converting agents of metallic fine particle may comprise two or more kinds of light/heat converting substances, e.g., fine particles of metals having a low melting point such as Re, Sb, Te, Au, Ag, Cu, Ge, Pb and Sn and fine particles of self exothermic metals such as Ti, Cr, Fe, Co, Ni, W and Ge may be used as mixture. Further, it is also preferred to use fine particles of metals which have high light absorption when they are fine particles such as Ag, Pt and Pd and other metallic fine particles in combination.

These particles preferably have a particle size of 10 μm or less, more preferably from 0.003 to 5 μm, and particularly preferably from 0.01 to 3 μm. The finer the particles, the lower is the solidifying temperature. That is, light sensitivity in heat mode recording becomes high when finer particles are used, which is advantageous, but dispersion of particles is difficult. While when the particle size is larger than 10 μm, the definition of the printed matter sometimes lowers.

When light/heat converting agents are pigments and dyes, the addition amount to a heat-sensitive layer is preferably up to 30 wt %, more preferably from 5 to 25 wt %, and particularly preferably from 7 to 20 wt %. When they are added to an overcoat layer, the addition amount of the light/heat converting agents is preferably from 1 to 70 wt %, more preferably from 2 to 50 wt %, of the solid contents in the overcoat layer.

Good sensitivity can be obtained with the addition amount of this range. When light/heat converting agents are added to an overcoat layer, the addition amounts to a heat-sensitive layer and an undercoating layer can be reduced according to the amount in the overcoat layer, or may not be added at all.

In the present invention, when these metallic fine particles are used as the light/heat converting agent, the addition amount is preferably 10 wt % or more of the solid content in a heat-sensitive layer, more preferably 20 wt % or more, and particularly preferably 30 wt % or more. When the addition amount is less than 10 wt %, the sensitivity lowers in some cases.

An image is formed by heating on a lithographic printing plate precursor according to the present invention. Specifically, an image is recorded by direct imaging with a heat-recording head, scanning exposure with an infrared laser, high intensity flash exposure by a xenon discharge lamp, and infrared lamp exposure. Exposure by solid state high output infrared lasers such as semiconductor lasers emitting infrared rays of wavelength of from 700 to 1,200 nm and YAG lasers is preferred in the present invention.

The lithographic printing plate precursor according to the present invention can also be used in printing after development with water or an aqueous solution as a developing solution.

When the lithographic printing plate precursor according to the present invention uses a heat-sensitive layer containing a fine particle polymer having a heat-reactive functional group or microcapsules containing (i.e., encapsulating) a compound having a heat-reactive functional group, the lithographic printing plate precursor can be loaded on a printing machine without requiring any further process, and printing can be performed using ink and a fountain solution by an ordinary procedure. In this case, the printing plate precursor can also be subjected to exposure with a laser, after being mounted on the plate cylinder of the printing machine, by the laser installed on the printing machine, and then development on machine with a fountain solution and/or an ink, as disclosed in Japanese patent 2938398.

EXAMPLES

The present invention is described in detail below with reference to the examples, but the present invention should not be construed as being limited thereto.

Examples I-1 to I-6 and Comparative Examples I-1 to I-6

Thermal Positive Type Image-forming Layer Preparation of Support

As a metal substrate, an aluminum sheet having a thickness of 0.24 mm which had been surface-treated by an alkali degreasing method was used. The aluminum sheet was subjected to the following treatment in this order.

1) Mechanical Surface Roughening Treatment

The aluminum sheet was subjected to ablation with supplying an abrasive in a slurry state (pumice having an average particle size of about 15 μm) at a rotation number of 150 rpm with a No. 0.9 nylon brush.

2) Chemical Dissolution Treatment i

The concentration of sodium hydroxide was fixed at 20 wt %, the solution temperature was 40° C., and the treating time was adjusted so that Ra reached 0.3 μm. Thereafter, the aluminum sheet was washed with flowing water for 10 seconds, immersed in a solution having the concentration of sulfuric acid of 120 g/liter at solution temperature of 50° C. for 10 seconds, and desmutted. The measured value of Ra (defined in JIS B 0601) was 0.3±0.05 μm (standard deviation).

3) Electrolytic Surface Roughening Treatment

The wave form of electric source disclosed in JP-A-3-79799 was used. The concentration of sulfuric acid was set at 12 g/liter, the concentration of aluminum was set at 6 g/liter, the solution temperature was set at 60° C., and the electric current density of the anode was set so that the pore number became from 1.2 to 91/mm$^2$. The aluminum sheet was then washed with water. As a result of observation with SEM, the pore number revealed to be 70±20/mm$^2$.

4) Chemical Dissolution Treatment ii

The concentration of sodium hydroxide was fixed at 20 wt %, the solution temperature was 40° C., and the treating time was adjusted so that Ra reached 1.3 μm. Thereafter, the aluminum sheet was washed with flowing water for 10 seconds, immersed in a solution having the concentration of sulfuric acid of 120 g/liter at solution temperature of 50° C. for 10 seconds, and desmutted.

5) Anodic Oxidation Treatment

Figure 4:
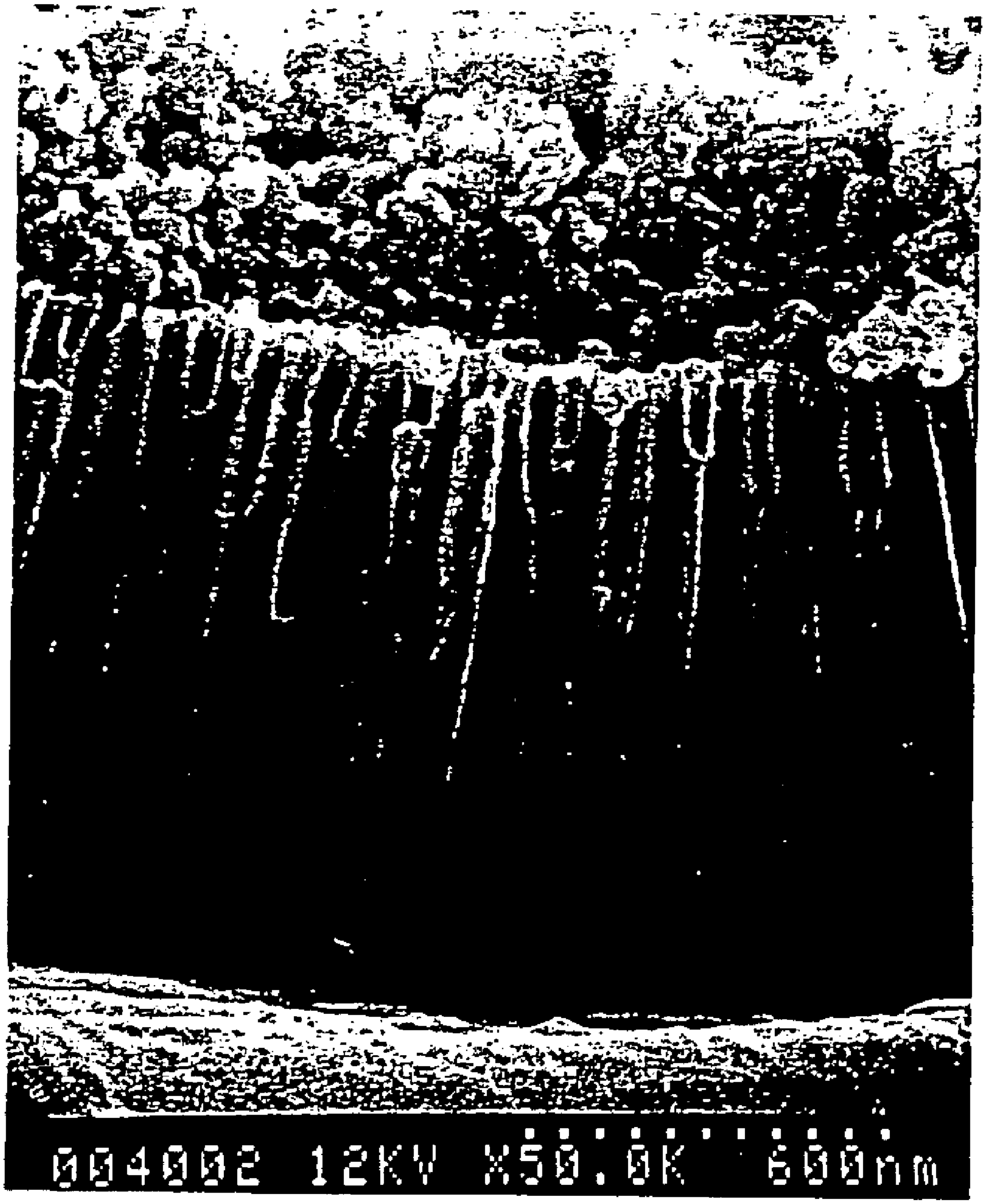
FIG. 4 is an electron microphotograph showing an example of the lithographic printing plate precursor according to the present invention.

Anodic oxidation treatment was performed using two apparatus connected in series. The apparatus used are shown in FIG. 4 in JP-A-8-264118. The treatment was performed according to the anodic oxidation treatment conditions shown in Table I-1 below, electric current was supplied using a DC electric source, a film was grown by adjusting the treating time so as to obtain a desired film thickness, and the sheet was washed with water. The measured value of Ra was 0.3±0.05 μm (average value±standard deviation).

6) Determining Method of Anodic Oxide Film Thickness

The determination of the treating time to obtain an anodic oxide film having a desired film thickness was performed according to a calibration curve. For example, a sample for a calibration curve was obtained by changing the treating time of the anodic oxidation treatment conditions shown in Table I-1. A part of the obtained sample for a calibration curve was bent, and the side of the cracked part which was generated when the sample was bent (usually called a broken out section) was observed with a super high resolution SEM (Hitachi S-900), and the thickness of the anodic oxide film was measured, from which a calibration curve showing the relationship between treating time and anodic oxide film thickness was formed. From the above formed calibration curve, the treating time corresponding to a desired film thickness was determined.

7) Measuring Method of Pore Diameter at Surface Mouth Area and Maximum Inside Diameter of Anodic Oxide Film A super high resolution SEM (Hitachi S-900) was used for the measurement of the pore diameter at the surface mouth area of an anodic oxide film. The surface of the anodic oxide film was observed by 150,000 magnifications at relatively low accelerating voltage of 12 V without performing vacuum evaporation for giving electric conductivity. Fifty pores were selected by random sampling and the average value obtained therefrom was used as the pore diameter at the mouth area of the anodic oxide film. The standard deviation error was ±10% or less.

The maximum inside diameter of the pore of the anodic oxide film was observed as follows: an aluminum sheet having been subjected to anodic oxidation treatment was bent and the side of the cracked part which was generated when the sheet was bent (usually called a broken out section) was observed with a super high resolution SEM (Hitachi S-900). The maximum inside diameter of the pore of the broken out section of the anodic oxide film was observed by 150,000 magnifications at relatively low accelerating voltage of 12 V without performing vacuum evaporation for giving electric conductivity. Fifty pores were selected by random sampling and the average value obtained therefrom was used as the pore diameter. The standard deviation error was ±10% or less.

8) Sealing Treatment

In Examples I-1 to I-4 and Comparative Example I-1, sealing treatment was performed by passing each aluminum sheet having been subjected to anodic oxidation treatment through boiling water for the prescribed time shown in Table I-1. In Example I-6 and Comparative Example I-4, sealing treatment was performed by passing each sample through 0.1 wt % NaF/10 wt % $NaH_2PO_4$ aqueous solution (sealing agent A) at 90 to 100° C. for the prescribed time shown in Table I-1. In Example I-5 and Comparative Examples I-1, I-2, I-5 and I-6, sealing treatment was not performed.

9) Formation of Undercoating Layer

The substrate having been subjected to sealing treatment (substrate A) was subjected to treatment using an aqueous solution of disodium trisilicate ($Na_2O/SiO_2$=⅓) having sodium silicate concentration of 1 wt % at 20° C. for 10 seconds, thereby substrate B was obtained. As a result of quantitative analysis of the coverage of sodium silicate according to calibration curve with a commercially available X-ray analyzer, the weight of silicic acid was 6 mg/m$^2$ and the weight of sodium silicate was 8 mg/m$^2$. A sample for calibration curve was prepared by dripping a certain amount of disodium trisilicate diluted with water on the entire area to be irradiated with X-ray, spreading and drying. Further, substrate B was treated with an aqueous solution of nitric acid having pH of 3 at 20° C. for 10 seconds, washed with water, thus substrate C was obtained. Undercoating layer coating solution A having the following composition was coated on the surface of substrate C, and dried at 80° C. for 15 seconds. Dry coating amount was 15 mg/m$^2$.

| Undercoating layer coating solution A | |
|---|---|
| The compound shown below | 0.3 g |
| Methanol | 100 g |
| Water | 1 g |

-continued

| Undercoating layer coating solution A |
|---|
| 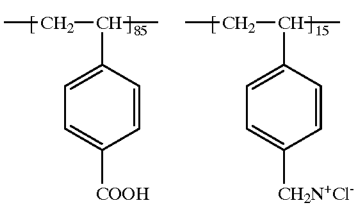 |

10) Formation of Image-forming Layer

Light-sensitive solution 1 having the composition shown below was coated on the above-treated substrate in a coating amount of 1.0 g/m$^2$, and the coated layer was dried with PERFECT OVEN PH200 (manufactured by TABAI Co.) at 140° C. for 50 seconds by setting Wind Control at 7, thereby a lithographic printing plate precursor was obtained.

| Light-sensitive solution 1 | |
|---|---|
| m-, p-Cresol novolak (m/p = 6/4, weight average molecular weight: 3,500, containing 0.5 wt % of unreacted cresol) | 0.427 g |
| Alkali-soluble resin (F-1) containing siloxane structure | 0.047 g |
| Specific Copolymer 1 (disclosed in JP-A-11-288093) | 2.37 g |
| Cyanine dye A (shown below) | 0.155 g |
| 2-Methoxy-4- (N-phenylamino) benzene diazonium hexafluorophosphate | 0.03 g |
| Tetrahydrophthalic anhydride | 0.19 g |
| Ethyl Violet having 6-hydroxy-B-naphthalenesulfonic acid as the counter ion | 0.05 g |
| Fluorine surfactant, Megafac F-176 PF (manufactured by Dainippon Chemicals and Ink Co., Ltd.) | 0.035 g |
| Fluorine surfactant, Megafac MCF-312 (manufactured by Dainippon Chemicals and Ink Co., Ltd.) | 0.05 g |
| p-Toluenesulfonic acid | 0.008 g |
| Bis-p-hydroxyphenylsulfone | 0.063 g |
| n-Dodecyl stearate | 0.06 g |
| γ-Butyrolactone | 13 g |
| Methyl ethyl ketone | 24 g |
| 1-Methoxy-2-propanol | 11 g |

Synthesis of Alkali-soluble Resin (F-1) Containing Siloxane Structure

Cresol novolak (m/p=60/40, Mw=5.2x10$^3$) (120 g) was dissolved in 400 ml of methanol, 5.4 g of sodium methoxide was added thereto and the mixed solution was stirred for 30 minutes. Methanol was distilled off and 400 ml of tetrahydrofuran was added to substitute the solvents. Epoxy type terminal reactive silicone MCR-E11 (manufactured by Chisso) (17 g) was added to the above solution and the solution was refluxed with heating for 6 hours. The temperature of the reaction solution was lowered to room temperature, and was poured into 8,000 ml of water, was filtered, the separated product was washed with water and dried, thereby 132 g of alkali-soluble resin (F-1) containing siloxane structure was obtained.

Cyanine Dye A

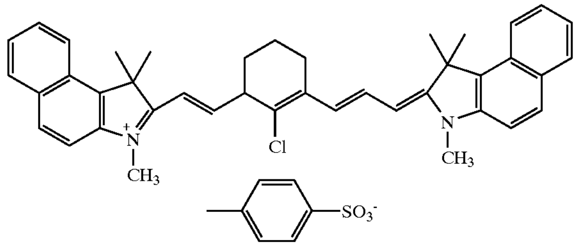

11) Condition of Laser Irradiation

Exposure was performed with a commercially available exposer Trend Setter 3244 (manufactured by Creo). Output was 0.5 W, wavelength was 830 nm, beam diameter was 17 μm (1/e$^2$) and main scanning velocity was 5 m/S.

12) Evaluation of Clear Sensitivity

The entire surface of the printing plate of a lithographic printing plate precursor was subjected to exposure with changing irradiation output of a laser. The exposed printing plate was developed with PS Processor 900H (manufactured by Fuji Photo Film Co., Ltd.) at solution temperature of 30° C. and development time of 12 seconds. Developing solution DT-1 (manufactured by Fuji Photo Film Co., Ltd.) (diluted to 8 times) and Finisher FP2W (manufactured by Fuji Photo Film Co., Ltd.) (diluted to 1 time) were stocked in the processor. The conductivity of the developing solution as this time was 45 mS/cm. The variation of the density after development was measured with Macbeth densitometer (blue). The evaluation of sensitivity was performed taking the point of variation (the point where the:image-forming layer completely vanishes and the color of the support appears) in the correlation diagram as clear sensitivity with the axis of ordinate being Macbeth density and with the axis of abscissa being laser output. The sensitivity of each sample in Examples I-1 to I-6 and Comparative Examples I-1 and I-3 to I-6 was obtained with taking the sensitivity of Comparative Example I-2 as standard (100 mJ/cm$^2$).

13) Method of Evaluation

The lithographic printing plate precursor irradiated with laser as above was developed with PS Processor 900H (manufactured by Fuji Photo Film Co., Ltd.) at solution temperature of 30° C. and development time of 12 seconds. Developing solution DT-1 (manufactured by Fuji Photo Film Co., Ltd.) (diluted to 8 times) and Finisher FP2W (manufactured by Fuji Photo Film Co., Ltd.) (diluted to 1 time) were stocked in the processor. The conductivity of the developing solution as this time was 45 mS/cm. The lithographic printing plate which underwent development was mounted on a printing machine and printing was performed. Harris Kikuhan monochromatic machine (manufactured by Harris Co.) was used as the printing machine, Geos Sumi (manufactured by Dainippon Chemicals and Ink Co., Ltd.) as the ink, and a mixture of 90 vol % of fountain solution EU-3 (manufactured by Fuji Photo Film Co., Ltd.) diluted with water to 100 times and 10 vol % of isopropanol was used as the fountain solution. Printing was performed using high quality paper.

14) Evaluation of Residual Color and Residual Film

The amount of the color remaining on the non-image area after development was measured with a commercially available spectrophotometer (measurement wavelength: 830 nm) and evaluated relatively.

The amount of the binder remaining on the non-image area after development was measured with a commercially available spectrophotometer (measurement wavelength: 280 nm) and evaluated relatively.

15) Evaluation of Smearing Resistance

The printing machine was stopped temporarily after 500 sheets were printed from the initiation, the ink adhered on the blanket of the printing machine was transferred to PET tape (manufactured by Nitto Denko Co. Ltd.) and the smearing on the non-image area due to the ink was visually observed.

16) Evaluation of Press Life

The point of time when the above smearing became Δ or under was judged to be the finish of printing. The number of the printed sheets was taken as end number.

The results obtained are shown in Table I-1 below.

TABLE I-1

| Example No. | Electrolyte | Control System | Electric Current/ Voltage, Treating Time | Pore Diameter/ Maximum Diameter/ Thickness | Sealing Treatment | Sensitivity ($mJ/cm^2$) | Residual Color/ Residual Film | Smearing/ Press Life |
|---|---|---|---|---|---|---|---|---|
| Ex. I-1 | phosphoric acid (0.5 mol/liter) 25° C. | constant electric current | 0.3 $A/dm^2$ 900 sec. | 0 nm/280 nm/1 μm | boiling water, 40 sec. | 60 | oo/oo | oo/oo |
| Ex. I-2 | phosphoric acid (0.5 mol/liter) 25° C. | constant electric current | 0.3 $A/dm^2$, 900 sec. | 28 nm/280 nm/ 1 μm | boiling water, 15 sec. | 60 | o/o | o/oo |
| Ex. I-3 (first) | sulfuric acid (170 g/liter) 20° C. | constant voltage | 17 V, 20 sec. | 0 nm/15 nm/0.3 μm | — | — | — | — |
| Ex. I-3 (second) | phosphoric acid (120 g/liter) 25° C. | constant voltage | 100 V, 20 sec. | 15 nm/150 nm/ 1.2 μm | boiling water, 20 sec. | 55 | oo/oo | oo/oo |
| Ex. I-4 (first) | sulfuric acid (170 g/liter) 40° C. | constant electric current | 30 $A/dm^2$, 30 sec. | 10 nm/10 nm/ 0.3 μm | — | — | — | — |
| Ex. I-4 (second) | phosphoric acid (120 g/liter) 40° C. | constant electric current | 0.3 $A/dm^2$, 900 sec. | 10 nm/280 nm/ 1.2 μm | boiling water, 20 sec. | 50 | oo/oo | oo/oo |
| Ex. I-5 (first) | sulfuric acid (170 g/liter) 40° C. | constant electric current | 30 $A/dm^2$, 30 sec. | 10 nm/10 nm/ 0.3 μm | — | — | — | — |
| Ex. I-5 (second) | phosphoric acid (120 g/liter) 40° C. | constant electric current | 0.3 $A/dm^2$, 900 sec. | 10 nm/280 nm/ 1.2 μm | none | 50 | o/o | oo/oo |
| Ex. I-6 | Oxalic acid (50 g/liter) 33° C. | constant electric current | 30 $A/dm^2$, 8 sec. | 0 nm/40 nm/1 μm | sealing agent A, 40 sec. | 90 | o/o | o/oo |
| Comp. Ex. I-1 | sulfuric acid (170 g/liter) 33° C. | constant electric current | 30 $A/dm^2$, 50 sec. | 0 nm/10 nm/1 μm | boiling water, 20 sec. | 120 | oo/oo | oo/oo |
| Comp. Ex. I-2 | sulfuric acid (17 g/liter) 33° C. | constant electric current | 30 $A/dm^2$, 50 sec. | 10 nm/15 nm/1 μm | none | 100 | o/o | oo/oo |
| Comp. Ex. I-3 | phosphoric acid (0.5 mol/liter) 25° C. | constant electric current | 0.3 $A/dm^2$, 900 sec. | 35 nm/280 nm/1 μm | none | 60 | x/x | oo/oo |
| Comp. Ex. I-4 | phosphoric acid (0.5 mol/liter) 25° C. | constant voltage | 200 V, 500 sec. | 0 nm/350 nm/1 μm | sealing agent A, 40 sec. | 60 | oo/oo | x/x |
| Comp. Ex. I-5 | phosphoric acid (0.5 mol/liter) 25° C. | constant voltage | 200 V, 500 sec. | 40 nm/350 nm/1 μm | none | 60 | x/x | x/x |
| Comp. Ex. I-6 | Oxalic acid (50 g/liter) 33° C. | constant electric current | 30 $A/dm^2$, 8 sec. | 40 nm/40 nm/1 μm | none | 90 | x/x | oo/oo |

Note:
Residual color/residual film
oo: Not detected
o: Detected a little
Δ: Detected
x: Considerably detected
xx: Detectedon the entire surface
Smearing
oo: Not smeared at all
o: A little smeared
Δ: Smeared
x: Considerably smeared
xx: The entire surface was smeared
Press life (end number)
oo: 30,000 sheets or more
o: 10,000 or more and less than 30,000
Δ: 3,000 or more and less than 10,000
x: More than 100 and less than 3,000
xx: 100 or less

Examples I-7 to I-12 and Comparative Examples I-7 to I-12

Thermal Negative Type Image-forming Layer

The same procedures were repeated as in Examples I-1 to I-6 and Comparative Examples I-1 to I-6 up to sealing treatment, on the conditions as shown in Table I-2 below.

Formation of Image-forming Layer

The image-forming layer coating solution (prescription B) having the composition shown below was coated on a substrate by bar coating and the coated layer was dried in an oven at 100° C. for 1 minute. The thicknesses of the coating solution before and after coating were measured with a micrometer at 10 points and averaged. As a result, the average thickness of the thermal negative type image-forming layer (prescription B) was 1.5 μm on average and the standard deviation was 0.8 μm. The thickness computed from the weight variation of the coating solution before and after coating and specific gravity was 1.7 μm. This was used as the lithographic printing plate precursor.

| Image-forming layer coating solution (prescription B) | |
|---|---|
| Compound shown below which generates acid by light or heat | 0.2 g |
| Crosslinking agent shown below which causes crosslinking by acid (phenol derivative) | 0.7 g |
| Binder (Maruka Linker MS-4P (polyvinyl phenol, manufactured by Maruzen Petroleum Co., Ltd.) | 1.5 g |
| Infrared absorber NK-3508 (trade name, manufactured by Nihon Kanko Shikiso Kenkyu-Jo) | 0.15 g |
| Other additives | |
| Victoria Pure Blue BO (C.I. 44040) | 0.05 g |
| Fluorine surfactant, Megafac F-177 (manufactured by Dainippon Chemicals and Ink Co., Ltd.) | 0.06 g |
| Solvent | |
| Methyl ethyl ketone | 15 g |
| 1-Methoxy-2-propanol | 5 g |
| Methyl alcohol | 7 g |

Compound Generating Acid by Light or Heat

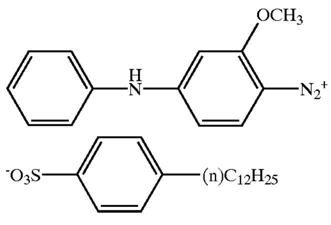

Crosslinking Agent Which Causes Crosslinking by Acid

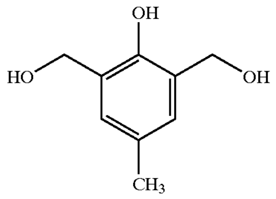

Conditions of Laser Irradiation and Development

Each of the above obtained lithographic printing plate precursors was exposed using a solid state continuous oscillation YAG laser emitting infrared rays of wavelength 1,064 nm (maximum output: 0.724 W). After each printing plate precursor was subjected to exposure at scanning velocity of 120 cm/s, $1/e^2$ beam diameter D of 35 μm (beam profile showed good Gaussian distribution, and so approximated, and the point of $1/e^2$ light putout of the maximum strength of the peak was made beam diameter), heat treated in an oven set at 140° C. for 45 seconds. Thereafter, heat-treated sample was development processed using a commercially available automatic processor PS-900NP (manufactured by Fuji Photo Film Co., Ltd.) having an immersion type developing tank. An alkali developing solution (pH about 13) having the following composition (20 liters) was stocked in PS-900NP and the developing solution was maintained at 30° C.

City water (8 liters) was stocked in the second tank of PS-900NP, and 8 liters of finishing gum solution FP2W (manufactured by Fuji Photo Film Co., Ltd.) diluted with water to 1 time were stocked in the third tank.

| Alkali development processing solution | |
|---|---|
| D-Sorbitol | 2.5 wt % |
| Sodium hydroxide | 0.85 wt % |
| Pentasodium diethylenetriaminepenta-(methylenephosphonate) | 0.05 wt % |
| Water | 96.6 wt % |

The evaluation of clear sensitivity and printing property were performed in the same manner as in Examples I-1 to I-6 and Comparative Examples I-1 to I-6 except for changing the developing conditions as above. With respect to clear sensitivity, the sensitivity of each sample in Examples I-7 to I-12 and Comparative Examples I-7 and I-9 to I-12 was obtained with taking the sensitivity of Comparative Example I-8 as standard (100 mJ/cm$^2$). Residual color, residual film, smearing resistance and press life were evaluated in the same manner as in Examples I-1 to I-6 and Comparative Examples I-1 to I-6.

The results obtained are shown in Table I-2 below.

TABLE I-2

| Example No. | Electrolysis | Control System | Electric Current/ Voltage, Treating Time | Pore Diameter/ Maximum Diameter/ Thickness | Sealing Treatment | Sensitivity (mJ/cm$^2$) | Residual Color/ Residual Film | Smearing/ Press Life |
|---|---|---|---|---|---|---|---|---|
| Ex. I-7 | phosphoric acid (0.5 mol/liter) 25° C. | constant electric current | 0.3 A/dm$^2$ 900 sec. | 0 nm/280 nm/1 μm | boiling water, 40 sec. | 120 | oo/oo | oo/oo |

TABLE I-2-continued

| Example No. | Electrolysis | Control System | Electric Current/ Voltage, Treating Time | Pore Diameter/ Maximum Diameter/ Thickness | Sealing Treatment | Sensitivity ($mJ/cm^2$) | Residual Color/ Residual Film | Smearing/ Press Life |
|---|---|---|---|---|---|---|---|---|
| Ex. I-8 | phosphoric acid (0.5 mol/liter) 25° C. | constant electric current | 0.3 $A/dm^2$, 900 sec. | 28 nm/280 nm/ 1 μm | boiling water, 15 sec. | 120 | o/o | o/oo |
| Ex. I-9 (first) | sulfuric acid (170 g/liter) 20° C. | constant voltage | 17 V, 20 sec. | 0 nm/15 nm/0.3 μm | — | — | — | — |
| Ex. I-9 (second) | phosphoric acid (120 g/liter) 25° C. | constant voltage | 100 V, 20 sec. | 15 nm/150 nm/ 1.2 μm | boiling water, 20 sec. | 110 | oo/oo | oo/oo |
| Ex. I-10 (first) | sulfuric acid (170 g/liter) 40° C. | constant electric current | 30 $A/dm^2$, 30 sec. | 10 nm/10 nm/ 0.3 μm | — | — | — | — |
| Ex. I-10 (second) | phosphoric acid (120 g/liter) 40° C. | constant electric current | 0.3 $A/dm^2$, 900 sec. | 10 nm/280 nm/ 1.2 μm | boiling water, 20 sec. | 100 | oo/oo | oo/oo |
| Ex. I-11 (first) | sulfuric acid (170 g/liter) 40° C. | constant electric current | 30 $A/dm^2$, 30 sec. | 10 nm/10 nm/ 0.3 μm | — | — | — | — |
| Ex. I-11 (second) | phosphoric acid (120 g/liter) 40° C. | constant electric current | 0.3 $A/dm^2$, 900 sec. | 10 nm/280 nm/ 1.2 μm | none | 100 | o/o | oo/oo |
| Ex. I-12 | Oxalic acid (50 g/liter) 33° C. | constant electric current | 30 $A/dm^2$, 8 sec. | 0 nm/40 nm/1 μm | sealing agent A, 40 sec. | 180 | o/o | o/oo |
| Comp. Ex. I-7 | sulfuric acid (170 g/liter) 33° C. | constant electric current | 30 $A/dm^2$, 50 sec. | 0 nm/10 nm/1 μm | boiling water, 20 sec. | 240 | oo/oo | oo/oo |
| Comp. Ex. I-8 | sulfuric acid (170 g/liter) 33° C. | constant electric current | 30 $A/dm^2$, 50 sec. | 10 nm/15 nm/1 μm | none | 200 | o/o | oo/oo |
| Comp. Ex. I-9 | phosphoric acid (0.5 mol/liter) 25° C. | constant electric current | 0.3 $A/dm^2$, 900 sec. | 35 nm/280 nm/1 μm | none | 120 | x/x | oo/oo |
| Comp. Ex. I-10 | phosphoric acid (0.5 mol/liter) 25° C. | constant voltage | 200 V, 500 sec. | 0 nm/350 nm/1 μm | sealing agent A, 40 sec. | 120 | oo/oo | x/x |
| Comp. Ex. I-11 | phosphoric acid (0.5 mol/liter) 25° C. | constant voltage | 200 V, 500 sec. | 40 nm/350 nm/1 μm | none | 120 | x/x | x/x |
| Comp. Ex. I-12 | Oxalic acid (50 g/liter) 33° C. | constant electric current | 30 $A/dm^2$, 8 sec. | 40 nm/40 nm/1 μm | none | 180 | x/x | oo/oo |

Note:
Residual color/residual film
oo: Not detected
o: Detected a little
Δ: Detected
x: Considerably detected
xx: Detectedon the entire surface
Smearing
oo: Not smeared at all
o: A little smeared
Δ: Smeared
x: Considerably smeared
xx: The entire surface was smeared
Press life (end number)
oo: 30,000 sheets or more
o: 10,000 or more and less than 30,000
Δ: 3,000 or more and less than 10,000
x: More than 100 and less than 3,000
xx: 100 or less

Examples I-13 to I-18 and Comparative Examples I-13 to I-18

Ablation Positive Type Image-forming Layer

The same procedures were repeated as in Examples I-1 to I-6 and Comparative Examples I-1 to I-6 up to sealing treatment, on the conditions as shown in Table I-3 below.

Formation of Image-forming Layer

After sealing treatment, the ablation positive type image-forming layer coating solution was coated on the support and dried. That is, the image-forming layer coating solution (prescription C) having the composition shown below was coated on the support by bar coating and the coated layer was dried in an oven at 120° C. for 1 minute. The thicknesses of the image-forming layer (prescription C) before and after coating were measured with a micrometer at 10 points and averaged. As a result, the average thickness of the image-forming layer (prescription C) was 1 μm± on average and the standard deviation was 0.8 μm. The thickness of the image-forming layer computed from the weight variation of the coating solution before and after coating and specific gravity was 1 μm.

Image-forming Layer Coating Solution (Prescription C)

Behenic acid (5 mg), 41 mg of PMMA (Aldrich, average molecular weight: 99,600 (GPC)), 8 mg of Cyabsorb IR-165 (manufactured by American Cyanamid) were dissolved in 13 ml of chloroform, thereby the image-forming layer (prescription C) was prepared.

Conditions of Laser Exposure

A solid state continuous oscillation YAG laser (wavelength 1,064 nm) maximum output of laser beam: 0.724 W, scanning velocity: 120 cm/s, $1/e^2$ beam diameter: 35 μm (beam profile showed good Gaussian distribution, and so approximated, and the point of $1/e^2$ light putout of the maximum strength of the peak was made beam diameter).

The evaluation of clear sensitivity and printing property were performed in the same manner as in Examples I-1 to I-6 and Comparative Examples I-1 to I-6 except for omitting development processing. With respect to clear sensitivity, the sensitivity of each sample in Examples I-13 to I-18 and Comparative Examples I-13 and I-15 to I-18 was obtained with taking the sensitivity of Comparative Example I-14 as standard (100 $mJ/cm^2$). Residual color, residual film, smearing resistance and press life were evaluated in the same manner as in Examples I-1 to I-6 and Comparative Examples I-1 to I-6.

The results obtained are shown in Table I-3 below.

TABLE I-3

| Example No. | Electrolysis | Control System | Electric Current/ Voltage, Treating Time | Pore Diameter/ Maximum Diameter/ Thickness | Sealing Treatment | Sensitivity ($mJ/cm^2$) | Residual Color/ Residual Film | Smearing/ Press Life |
|---|---|---|---|---|---|---|---|---|
| Ex. I-13 | phosphoric acid (0.5 mol/liter) 25° C. | constant electric current | 0.3 $A/dm^2$ 900 sec. | 0 nm/280 nm/1 μm | boiling water, 40 sec. | 240 | oo/oo | oo/oo |
| Ex. I-14 | phosphoric acid (0.5 mol/liter) 25° C. | constant electric current | 0.3 $A/dm^2$, 900 sec. | 28 nm/280 nm/ 1 μm | boiling water, 15 sec. | 240 | o/o | o/oo |
| Ex. I-15 (first) | Sulfuric acid (170 g/liter) 20° C. | constant voltage | 17 V, 20 sec. | 0 nm/15 nm/0.3 μm | — | — | — | — |
| Ex. I-15 (second) | phosphoric acid (120 g/liter) 25° C. | constant voltage | 100 V, 20 sec. | 15 nm/150 nm/ 1.2 μm | boiling water, 20 sec. | 220 | oo/oo | oo/oo |
| Ex. I-16 (first) | Sulfuric acid (170 g/liter) 40° C. | constant electric current | 30 $A/dm^2$, 30 sec. | 10 nm/10 nm/ 0.3 μm | — | — | — | — |
| Ex. I-16 (second) | phosphoric acid (120 g/liter) 40° C. | constant electric current | 0.3 $A/dm^2$, 900 sec. | 10 nm/280 nm/ 1.2 μm | boiling water, 20 sec. | 200 | oo/oo | oo/oo |
| Ex. I-17 (first) | Sulfuric acid (170 g/liter) 40° C. | constant electric current | 30 $A/dm^2$, 30 sec. | 10 nm/10 nm/ 0.3 μm | — | — | — | — |
| Ex. I-17 (second) | phosphoric acid (120 g/liter) 40° C. | constant electric current | 0.3 $A/dm^2$, 900 sec. | 10 nm/280 nm/ 1.2 μm | none | 200 | o/o | oo/oo |
| Ex. I-18 | Oxalic acid (50 g/liter) 33° C. | constant electric current | 30 $A/dm^2$, 8 sec. | 0 nm/40 nm/1 μm | sealing agent A, 40 sec. | 360 | o/o | o/oo |
| Comp. Ex. I-13 | Sulfuric acid (170 g/liter) 33° C. | constant electric current | 30 $A/dm^2$, 50 sec. | 0 nm/10 nm/1 μm | boiling water, 20 sec. | 480 | oo/oo | oo/oo |
| Comp. Ex. I-14 | Sulfuric acid (170 g/liter) 33° C. | constant electric current | 30 $A/dm^2$, 50 sec. | 10 nm/15 nm/1 μm | none | 400 | o/o | oo/oo |
| Comp. Ex. I-15 | phosphoric acid (0.5 mol/liter) 25° C. | constant electric current | 0.3 $A/dm^2$, 900 sec. | 35 nm/280 nm/1 μm | none | 240 | x/x | oo/oo |
| Comp. Ex. I-16 | phosphoric acid (0.5 mol/liter) 25° C. | constant voltage | 200 V, 500 sec. | 0 nm/350 nm/1 μm | sealing agent A, 40 sec. | 240 | oo/oo | x/x |
| Comp. Ex. I-17 | phosphoric acid (0.5 mol/liter) 25° C. | constant voltage | 200 V, 500 sec. | 40 nm/350 nm/1 μm | None | 240 | x/x | x/x |
| Comp. Ex. I-18 | Oxalic acid (50 g/liter) 33° C. | constant electric current | 30 $A/dm^2$, 8 sec. | 40 nm/40 nm/1 μm | None | 180 | x/x | oo/oo |

Note:
Residual color/residual film
oo: Not detected
o: Detected a little
Δ: Detected
x: Considerably detected
xx: Detectedon the entire surface
Smearing
oo: Not smeared at all
o: A little smeared TABLE I-3-continued

| Example No. | Electrolysis | Control System | Electric Current/ Voltage, Treating Time | Pore Diameter/ Maximum Diameter/ Thickness | Sealing Treatment | Sensitivity (mJ/cm²) | Residual Color/ Residual Film | Smearing/ Press Life |
|---|---|---|---|---|---|---|---|---|

Δ: Smeared
x: Considerably smeared
xx: The entire surface was smeared
Press life (end number)
oo: 30,000 sheets or more
o: 10,000 or more and less than 30,000
Δ: 3,000 or more and less than 10,000
x: More than 100 and less than 3,000
xx: 100 or less

Examples I-19 to I-29 and Comparative Examples I-19 to I-29

Ablation Positive Type Image-forming Layer

A lithographic printing plate precursor was prepared by providing the same ablation positive type image-forming layer as in each of Examples I-13 to I-18 on the support having the anodic oxide film having the properties (average pore diameter of the surface mouth area, maximum inside diameter, film thickness at surface mouth area, film thickness of inside pore, pore density of the surface mouth area, and void ratio of pore) shown in Table I-4 below.

The developing property on machine, scratch resistance, sensitivity and press life of each lithographic printing plate precursor were evaluated.

The press life was evaluated in the same manner as in Examples I-1 to I-18, and the developing property on machine, scratch resistance and sensitivity were evaluated in the manner described below. The results obtained are shown in Table I-4.

Evaluation of Developing Property on Machine

Printing machine: Harris Kikuhan monochromatic machine (manufactured by Harris Co.)

Ink: Geos Scarlet (manufactured by Dainippon Chemicals and Ink Co., Ltd.

The number of the printed matters from the beginning of printing until normal printed matter was obtained.

o: From 1 to 50 sheets
oΔ: From 51 to 100 sheets
Δ: From 101 to 200 sheets
x: 201 sheets or more Scratch Resistance Test The difficulty of being scratched of printing plate precursor was tested with HEIDON Scratching Intensity TESTER HEIDON-18 and a diamond needle with varying the load from 50 g to 400 g, and the level was evaluated by synthetic judgement.

o: Scratch resistance is excellent from synthetic judgement
Δ: Good (practicable)
x: Impracticable Evaluation of Sensitivity and Clear Sensitivity The entire surface of the printing plate of a lithographic printing plate precursor was subjected to exposure with changing irradiation output of a laser. After the lithographic printing plate precursor was mounted on a printing machine (Harris Kikuhan monochromatic machine, manufactured by Harris Co.) and driven for 5 minutes without using an ink, the variation of the density was measured with Macbeth densitometer (blue). The evaluation of sensitivity was performed taking the point of variation (the point where the image-forming layer completely vanishes and the color of the support appears) in the correlation diagram as clear sensitivity with the axis of ordinate being Macbeth density and with the axis of abscissa being laser output. The sensitivity of each sample in Examples I-19 to I-29 and Comparative Examples I-19 and I-21 to I-26 was obtained with taking the sensitivity of Comparative Example I-20 as standard (100 mJ/$cm^2$).

TABLE I-4

| Example No. | Average Pore Diameter of Surface Mouth Area (μm) | Maximum Inside Diameter (μm) | Film Thickness at Surface Mouth Area (μm) | Film Thickness of Inside Pore (μm) | Pore Density of Surface Mouth Area (number/μm²) | Void Ratio of Pore (%) | Developing Property on Machine | Scratch Resistance | Sensitivity (mJ/cm²) | Press Life (number of sheets) |
|---|---|---|---|---|---|---|---|---|---|---|
| Ex. I-19 | 5 | 60 | 100 | 1,200 | 1,800 | 38 | o | o | 180 | 18,000 |
| Ex. I-20 | 30 | 60 | 100 | 1,200 | 520 | 41 | OΔ | o | 185 | 19,000 |
| Ex. I-21 | 5 | 21 | 100 | 1,200 | 1,800 | 25 | o | o | 165 | 13,000 |
| Ex. I-22 | 15 | 295 | 100 | 1,200 | 890 | 67 | OΔ | OΔ | 195 | 22,000 |
| Ex. I-23 | 5 | 60 | 12 | 1,300 | 1,800 | 45 | o | OΔ | 185 | 20,000 |
| Ex. I-24 | 7 | 60 | 490 | 800 | 1,800 | 30 | o | o | 170 | 16,000 |
| Ex. I-25 | 5 | 290 | 500 | 108 | 1,800 | 21 | o | o | 150 | 12,000 |
| Ex. I-26 | 5 | 60 | 20 | 1,950 | 1,800 | 44 | o | OΔ | 190 | 20,000 |
| Ex. I-27 | 30 | 60 | 100 | 1,200 | 50 | 37 | o | o | 180 | 17,000 |
| Ex. I-28 | 5 | 60 | 100 | 1,200 | 2,234 | 39 | O | OΔ | 180 | 18,000 |
| Ex. I-29 | 5 | 23 | 450 | 850 | 2,234 | 20 | O | o | 130 | 10,000 |
| Comp. Ex. I-19 | 40 | 60 | 100 | 1,200 | 500 | 40 | X | o | 185 | 19,000 |
| Comp. Ex. I-20 | 5 | 15 | 100 | 1,200 | 1,800 | 16 | O | o | 100 | 5,000 |

TABLE I-4-continued

| Example No. | Average Pore Diameter of Surface Mouth Area (μm) | Maximum Inside Diameter (μm) | Film Thickness at Surface Mouth Area (μm) | Film Thickness of Inside Pore (μm) | Pore Density of Surface Mouth Area (number/$\mu m^2$) | Void Ratio of Pore (%) | Developing Property on Machine | Scratch Resistance | Sensitivity ($mJ/cm^2$) | Press Life (number of sheets) |
|---|---|---|---|---|---|---|---|---|---|---|
| Comp. Ex. I-21 | 5 | 310 | 100 | 1,200 | 1,800 | 72 | O | x | 210 | 24,000 |
| Comp. Ex. I-22 | 5 | 60 | 8 | 1,300 | 1,800 | 38 | O | Δx | 180 | 19,000 |
| Comp. Ex. I-23 | 5 | 60 | 550 | 1,300 | 1,800 | 28 | O | o | 170 | 16,000 |
| Comp. Ex. I-24 | 5 | 60 | 100 | 92 | 1,800 | 18 | O | o | 95 | 4,000 |
| Comp. Ex. I-25 | 5 | 60 | 100 | 2,120 | 1,800 | 52 | O | o | 190 | 20,000 |
| Comp. Ex. I-26 | 5 | 60 | 100 | 1,800 | 2,620 | 38 | O | x | 185 | 19,000 |

Due to the constitution of the lithographic printing plate precursor of the present invention comprising a metal support having provided thereon an anodic oxide film having pores having a surface mouth diameter of from 0 to 30 nm and the maximum inside diameter of from 20 to 300 nm, residual color and residual film can be improved with maintaining sensitivity, smearing resistance and press life.

Further, when the thickness of the surface mouth area having the pore diameter of from 0 to 30 nm of the anodic oxide film is from 10 to 500 nm, the thickness of the area having the maximum inside diameter of from 20 to 300 nm is from 100 to 2,000 nm, the pore density of the surface area of the anodic oxide film is 2,500/$\mu m^2$ or less, and the void ratio of the anodic oxide film is from 20 to 70%, scratch resistance can be improved.

1. Preparation of a Lithographic Printing Plate Precursor

Example II-1

An aluminum support was prepared in the following method by using an aluminum plate having a thickness of 0.24 mm defined in JIS A1050 as a substrate.

(a) Etching Treatment by Alkali Agent

The aluminum plate was subjected to spray etching treatment with an aqueous solution containing a sodium hydroxide in concentration of 26 wt % and an aluminum ion in concentration of 6.5 wt % at 70° C., thereby 6 g/$m^2$ of the aluminum plate was dissolved. The plate was then washed by spraying.

(b) Desmutting Treatment

The aluminum plate was subjected to spray desmutting treatment with an aqueous solution containing a nitric acid in concentration of 1 wt % (containing a 0.5 wt % of aluminum ion) at 30° C., and then washed by spraying water. The aqueous solution of nitric acid used in the desmutting treatment was the waste solution for electrochemical surface roughening treatment using an aqueous solution of nitric acid by alternating current.

(c) Electrochemical Surface Roughening Treatment

Figure 2:
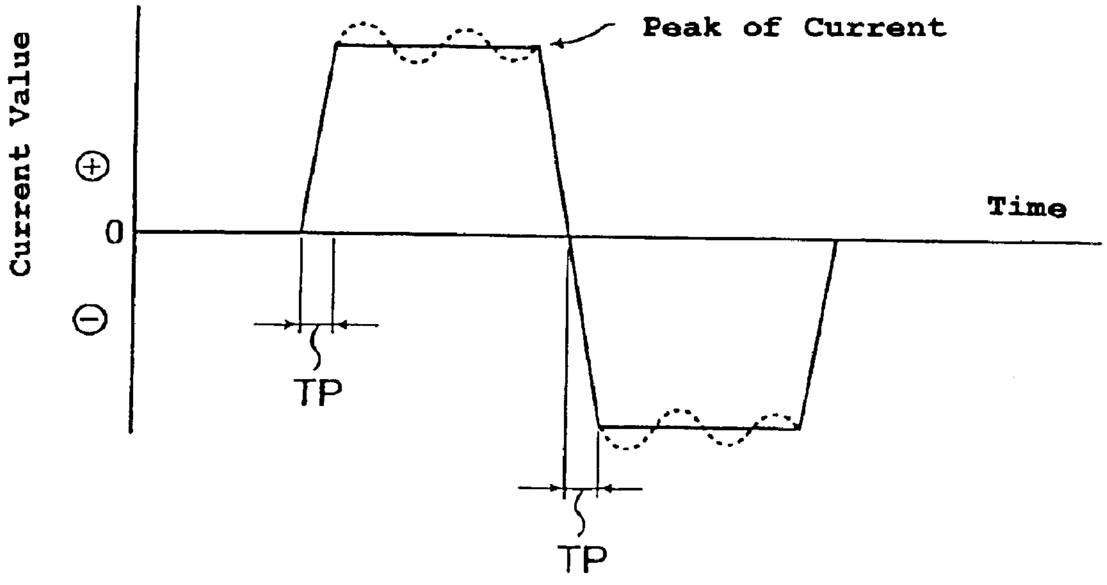
FIG. 2 is a graph showing an example of alternating current waveform for use in electrochemical surface roughening treatment in the preparation of an aluminum support for use in the lithographic printing plate precursor according to the present invention.
Figure 3:
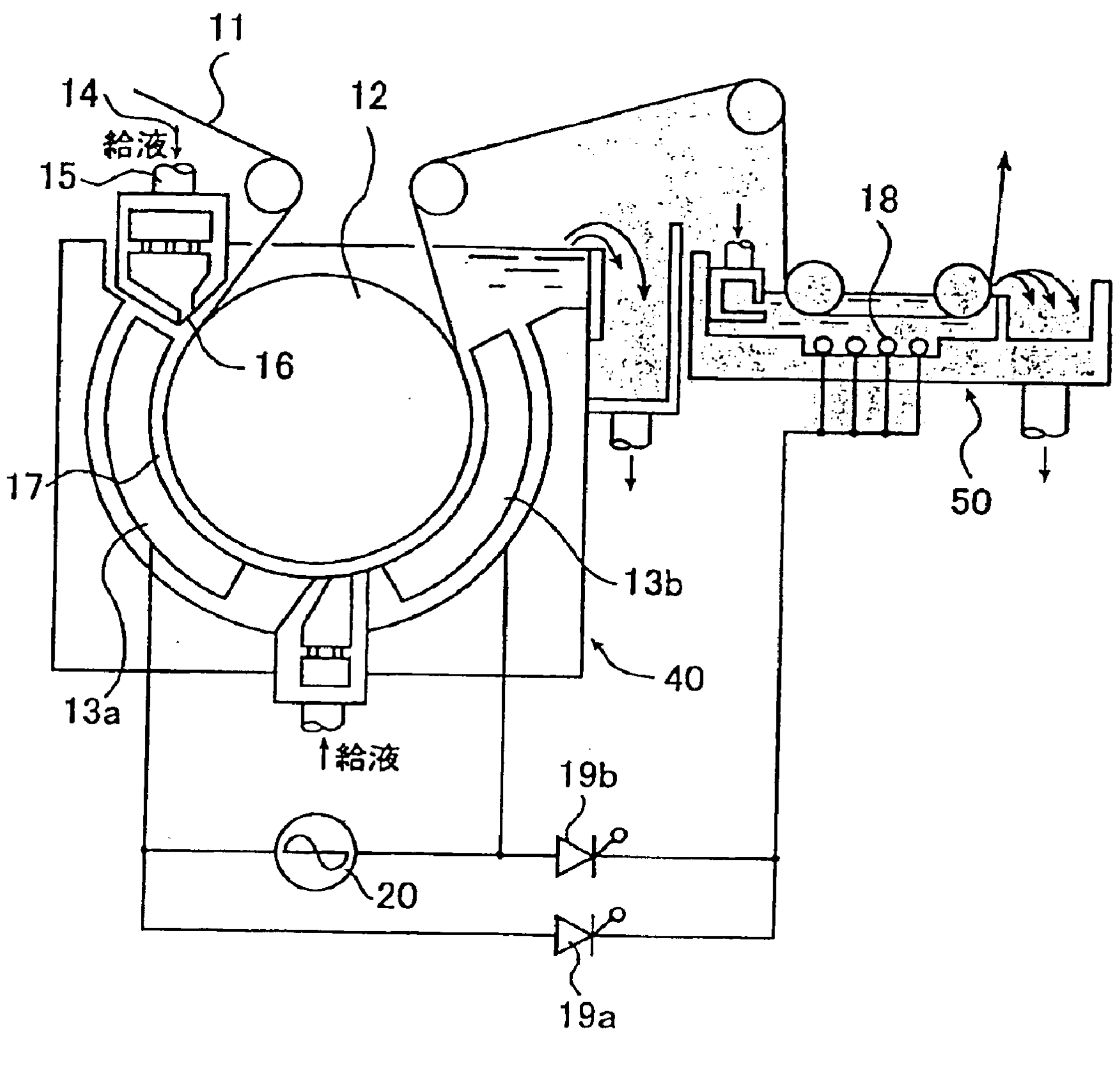
FIG. 3 is a side view showing an example of radial type cell in electrochemical surface roughening treatment using alternating current in the preparation of an aluminum support for use in the lithographic printing plate precursor according to the present invention.

Electrochemical surface roughening treatment was performed continuously by alternating voltage of 60 Hz. The electrolyte at this time was an aqueous solution containing a nitric acid in concentration of 1 wt % (containing a 0.5 wt % of aluminum ion and a 0.007 wt % of ammonium ion) and the temperature was 50° C. The wave form shown in FIG. 2 was used as the wave form of the AC electric source. The time tp required for the electric current to reach the peak from 0 was 2 msec, the DUTY ratio was 1/1, and electrochemical surface roughening treatment was performed using trapezoidal rectangular wave form alternating current with a carbon electrode as the counter electrode. Ferrite was used as the supporting anode. Two electrolytic baths shown in FIG. 3 were used.

The electric current density was 30 A/$dm^2$ at a peak value of electric current, and the quantity of electricity was 270 C/$dm^2$ in the quantity of electricity of sum total in the case when the aluminum plate was the anode. Five percent of the electric current from the electric source was diverted to the supporting anode.

The aluminum plate was then washed by spraying water.

(d) Etching Treatment

The aluminum plate underwent etching treatment by spraying with an aqueous solution comprising a sodium hydroxide in concentration of 26 wt % and an aluminum ion in concentration of 6.5 wt % at 70° C., thereby 0.2 g/$m^2$ of the aluminum plate was dissolved. A smut component mainly comprising an aluminum hydroxide which was formed when electrochemical surface roughening treatment was performed by alternating voltage in the prior stage was removed, and also the edge parts of the pores formed were dissolved to smooth the edge part, and then the aluminum plate was washed by spraying water.

(e) Desmutting Treatment

Desmutting treatment by spraying was performed with an aqueous solution containing a sulfuric acid in concentration of 25 wt % (containing a 0.5 wt % of aluminum ion) at 60° C., and then the aluminum plate was washed by spraying water and dried, thereby substrate 1 was obtained.

(f) Anodic Oxidation Treatment

Substrate 1 was subjected to anodic oxidation treatment in an electrolyte containing a sulfuric acid in concentration of 50 g/liter at 50° C. by electric current density of 12 A/$dm^2$ and direct current for 30 seconds, to thereby form an anodic oxide film.

(g) Pore-widening Treatment

Pore-widening treatment of substrate 1 having undergone anodic oxidation treatment was performed by immersing in an aqueous solution of sodium hydroxide of pH 13 at 50° C. for 30 seconds, and then washing with water and drying.

(h) Formation of Particle Layer

A particle layer was formed with substrate 1 subjected to pore-widening treatment as the cathode using a water suspension containing 0.5 wt % of $Al_2O_3$ particles (heat conductivity 36 W/(m·K)) having an average particle size of 15 nm as the electrolyte, and electrolytic treatment was performed by constant voltage of 110 V for 60 seconds.

Substrate 1 was then washed with water and dried, thereby a particle layer was formed.

(i) Hydrophilization Treatment (Silicate Treatment)

Hydrophilization treatment (silicate treatment) was performed by continuously immersing substrate 1 on which a particle layer had been formed in a 2.5 wt % aqueous solution of disodium trisilicate. The temperature of the treating solution was 70° C. and the immersion time was 10 seconds. Substrate 1 was then washed by spraying water and dried, thus a support for a lithographic printing plate having an anodic oxide film provided thereon a particle layer was obtained.

(j) Formation of Heat-sensitive Layer

A coating solution for a heat-sensitive layer as shown below was coated on the thus-obtained support for a lithographic printing plate, thereby a lithographic printing plate precursor was prepared.

A coating solution 1 for a heat-sensitive layer having the composition shown below was coated on the above-obtained support for a lithographic printing plate with a bar coater in a dry coating amount (the coating amount of the heat-sensitive layer) of 0.7 $g/m^2$, and the coated layer was dried in an oven at 100° C. for 60 seconds to form a heat-sensitive layer, thereby a lithographic printing plate precursor was obtained.

| Composition of heat-sensitive layer coating solution | |
|---|---|
| Microcapsule solution shown below | 25 g (solid content 5 g) |
| Trimethylolpropane triacrylate | 3 g |
| Infrared absorber IR-11 (exemplified in the present invention) | 0.3 g |
| Water | 60 g |
| 1-Methoxy-2-propanol | 1 g |

Microcapsule

Xylylene diisocyanate (40 g), 10 g of trimethylolpropane diacrylate, 10 g of a copolymer of allyl methacrylate and butyl methacrylate (molar ratio 7/3) and0.1 g of a surfactant (Pionin A41C, manufactured by Takemoto Yushi Co., Ltd.) were dissolved in 60 g of ethyl acetate to prepare an oil phase component. On the other hand, 120 g of a 4% aqueous solution of polyvinyl alcohol (PVA205, manufactured by Kuraray Co., Ltd.) was prepared as a water phase component. The oil phase component and the water phase component were put in a homogenizer and emulsified at 10,000 rpm for 10 minutes. Thereafter, 40 g of water was added to the emulsion and the reaction mixture was stirred at room temperature for 30 minutes, followed by further stirring at 40° C. for 3 hours, thereby a microcapsule solution was obtained. The concentration of the solid content of thus-obtained microcapsule solution was 20 wt % and the average particle size of the microcapsule was 0.5 μm.

Example II-2

A lithographic printing plate precursor was prepared in the same manner as in Example II-1 except that a water suspension of $Al_2O_3$ particles to which an aqueous solution containing a sulfuric acid in concentration of 100 g/liter was added to adjust to 2 the pH of the suspension was used in the above (h) formation of a particle layer in place of the above water suspension of $Al_2O_3$ particles.

Comparative Example II-1

A lithographic printing plate precursor was prepared in the same manner as in Example II-1 except that process (h) formation of a particle layer was not performed.

Examples II-3 to II-6 and Comparative Examples II-2 and II-3

A lithographic printing plate precursor was prepared in the same manner as in Example II-1 except that $Al_2O_3$ particles having an average particle size as shown in Table II-1 below were used in process (h) formation of a particle layer in place of $Al_2O_3$ particles having an average particle size of 15 nm.

Example II-7

A lithographic printing plate precursor was prepared in the same manner as in Example II-1 except that an anodic oxide film was formed by anodic oxidation treatment of substrate 1 in an electrolyte containing a sulfuric acid in concentration of 170 g/liter at 33° C. by electric current density of 5 $A/dm^2$ and direct current for 36 seconds in place of (f) anodic oxidation treatment, and that process (g) pore-widening treatment was not performed.

Example II-8

A lithographic printing plate precursor was prepared in the same manner as in Example II-7 except that the anodic oxide film formed was immersed in an aqueous solution of sodium hydroxide having pH of 13 at 30° C. for 30 seconds, and then washed with water and dried to perform pore-widening treatment.

Example II-9

A lithographic printing plate precursor was prepared in the same manner as in Example II-1 except that process (g) pore-widening treatment was not performed.

Example II-10

A lithographic printing plate precursor was prepared in the same manner as in Example II-1 except that an anodic oxide film was formed by anodic oxidation treatment of substrate 1 in an electrolyte containing a phosphoric acid in concentration of 50 g/liter at 30° C. by 60 V and direct current for 3 minutes in place of (f) anodic oxidation treatment, and that process (g) pore-widening treatment was not performed.

Comparative Example II-4

A lithographic printing plate precursor was prepared in the same manner as in Example II-7 except that process (h) formation of a particle layer was not performed.

Comparative Example II-5

A lithographic printing plate precursor was prepared in the same manner as in Example II-8 except that process (h) formation of a particle layer was not performed.

Comparative Example II-6

A lithographic printing plate precursor was prepared in the same manner as in Example II-8 except that substrate 1 was immersed in pure water at 80° C. for 20 seconds to perform sealing treatment in place of performing process (h) formation of a particle layer.

Examples II-11 to II-14

A lithographic printing plate precursor was prepared in the same manner as in Example II-1 except that $Al_2O_3$ particles having an average particle size and heat conductivity as shown in Table II-1 below were used in process (h) formation of a particle layer in place of $Al_2O_3$ particles having an average particle size of 15 nm.

Example II-15

A lithographic printing plate precursor was prepared in the same manner as in Example II-1 except that substrate 1 after pore-widening treatment was subjected to electrolytic sealing treatment with an aqueous solution of a mixture of 60 g/liter of nickel sulfate hexahydrate and 30 g/liter of boric acid as the electrolyte at 25° C. and 20 V by sine wave alternating current of 60 Hz for 60 minutes in place of performing process (h) formation of a particle layer.

Example II-16

A lithographic printing plate precursor was prepared in the same manner as in Example II-1 except that substrate 1 after pore-widening treatment was subjected to sealing treatment by heating deposition using metallic Sn particles (manufactured by Nilaco Co., purity: 99.9%, diameter: 0.5 mm) in a vacuum deposition apparatus (manufactured by Nippon Denshi Co., Ltd.) by electric current 30 A for 1 minute in place of performing process (h) formation of a particle layer.

2. Observation of the Cross Section of a Lithographic Printing Plate Precursor

The cross section of the non-image area after development processing of each of the above-obtained lithographic printing plate precursors was observed with a scanning electron microscope (S-900, manufactured by Hitachi, Ltd.) by accelerating voltage of 12 kV, without performing vacuum deposition, by magnification of from 5 to 150,000 times.

The SEM photograph of the cross section of the non-image area after development processing of the lithographic printing plate precursor obtained in Example II-1 is shown in FIG. 4. It can be seen from the photograph that particle layer 5 is formed on aluminum support 4 comprising aluminum sheet 2 having provided thereon anodic oxide film 3. It can also be seen that micro pores 7 in anodic oxide film 3 are sealed by particle layer 5 but have voids inside.

The same may be said of the lithographic printing plate precursors obtained in Examples II-2 to II-16.

3. Diameter of the Micro Pores on the Anodic Oxide Film Surface of a Lithographic Printing Plate Precursor The diameter of the micro pores of the anodic oxide film surface on the non-image area of each of the above-obtained lithographic printing plate precursors after development processing was obtained from an SEM photograph by a scanning electron microscope (S-900, manufactured by Hitachi, Ltd.) by accelerating voltage of 12 kV, without performing vacuum deposition, by magnification of 150,000 times. An average value of 50 micro pores selected randomly was taken as the micro pore and shown in Table II-1.

4. Void Ratio of the Anodic Oxide Film of a Lithographic Printing Plate Precursor The void ratio of the anodic oxide film of each lithographic printing plate precursor was obtained according to the following equation. The values obtained are shown in Table II-1.

$$\text{Void ratio (\%)}=[1-(\text{density of anodic oxide film}/3.98)]\times 100$$

In the formula, the density of anodic oxide film ($g/cm^3$) was obtained by dividing the weight of the anodic oxide film per unit area ($g/cm^2$) by the thickness of the anodic oxide film (cm). The weight of the anodic oxide film per unit area was obtained by cutting out an appropriate piece of the lithographic printing plate of the non-image area after development processing, immersing the cut out piece of the lithographic printing plate in a Meison solution comprising chromic acid/phosphoric acid to dissolve the anodic oxide film, measuring the weight before and after dissolution, and dividing the difference by the area cut out. The thickness of the anodic oxide film was obtained by observing the anodic oxide film of the non-image area after development processing with a scanning electron microscope (T20, manufactured by Nippon Denshi Co., Ltd.), measuring the film thickness at 50 points and averaging the values obtained.

Further, 3.98 is the density of an aluminum oxide ($g/cm^3$) according to Nippon Kagaku-Kai compiled, *Kagaku Binran* (*Handbook of Chemistry*), published by Maruzen Co.

5. Heat Conductivity of the Particle of Particle Layer of a Lithographic Printing Plate Precursor The heat conductivities of the particles shown in Table II-1 were measured in accordance with the Committee of compiling Fine Ceramics Jiten, *Fine Ceramics Jiten* (*Thesaurus of Fine Ceramics*), compiled by 136 Committee of Future Processing Techniques, the Japan Society for the Promotion of Science, *Fine Ceramics Gijutsu Handbook* (*Handbook of Fine Ceramics Techniques*), and compiled by Nippon Kagaku-Kai, *Kagaku Binran* (*Handbook of Chemistry*).

With respect to Comparative Examples II-6 and II-7, the heat conductivities of Ni and Sn are shown.

6. Sensitivity of a Lithographic Printing Plate Precursor

Each lithographic printing plate precursor was imagewise exposed by 2,400 dpi using a plate setter, Trend Setter 3244F (loading multi-beam of 192 channels, manufactured by Creo) after adjusting each parameter (Sr, Sd, bmslope and bmcurve). Exposure was performed with varying the rotation number of the drum and output stepwise. After exposure, the lithographic printing plate precursor was development processed on machine, and the quantity of energy which could form 1% dot was taken as the sensitivity of the lithographic printing plate precursor. The results obtained are shown in Table II-1.

7. Press Life and Smearing Resistance

Each lithographic printing plate precursor having been subjected to exposure was mounted on a printing machine, and after fountain solution was supplied, development processing was performed on machine by supplying an ink, subsequently printing was performed. Printing machine Sprint manufactured by Komori Insatsuki Co., Ltd. was used as the printing machine, Geos Sumi (manufactured by Dainippon Chemicals and Ink Co., Ltd.) as the ink, and a mixture of 90 vol % of fountain solution EU-3 (manufactured by Fuji Photo Film Co., Ltd.) diluted with water to 100 times and 10 vol % of isopropanol was used as the fountain solution. Printing was performed using high quality paper.

Printing was performed on the above condition, and the number of sheets to the image area of which the ink was not adhered were counted and this was taken as the criterion of the press life. The results obtained are shown in Table II-1.

Further, after 500 sheets were printed on the above condition, the lithographic printing plate was taken out of the printing machine, after allowing the printing plate to stand for 30 minutes in room, it was again mounted on the printing machine, supply of a fountain solution, ink and printing paper was started at the same time. The number of sheets until a clear non-image area was formed were measured, and this was taken as the evaluation of smearing resistance. The less the number of smeared sheets, the more excellent is the smearing resistance. The results obtained are shown in Table II-1.

As is apparent from the results shown in Table II-1, the lithographic printing plate precursors according to the present invention (Examples II-1 to II-16) are excellent in all of sensitivity, press life and smearing resistance.

Contrary to this, when the particle layer was not provided (Comparative Examples II-1, II-4 and II-5), when the average particle size was too small or too big, although the particle layer was provided (Comparative Examples II-2 and II-3), and when the particle layer was not provided and sealing treatment was performed with boiling water (Comparative Example II-6), they were inferior in at least any of sensitivity, press life and smearing resistance.

TABLE II-1

| Example No. | Electrolyte | Anodic Oxide Film: Pore-Widening Treatment | Anodic Oxide Film: Diameter of Micro Pore (nm) | Anodic Oxide Film: Void Ratio (%) | Particle Layer: Particles | Particle Layer: Average Particle Diameter (nm) | Particle Layer: Heat Conductivity [W/(m · K)] | Sensitivity ($mJ/cm^2$) | Press Life | Smearing Resistance |
|---|---|---|---|---|---|---|---|---|---|---|
| Example II-1 | oxalic acid | present | 40 | 37 | $Al_2O_3$ | 15 | 36 | 280 | 16,000 | 14 |
| Example II-2 | oxalic acid | present | 40 | 37 | $Al_2O_3$ | 15 | 36 | 280 | 17,000 | 15 |
| Example II-3 | oxalic acid | present | 40 | 35 | $Al_2O_3$ | 10 | 36 | 300 | 15,000 | 13 |
| Example II-4 | oxalic acid | present | 40 | 38 | $Al_2O_3$ | 50 | 36 | 280 | 16,000 | 16 |
| Example II-5 | oxalic acid | present | 40 | 38 | $Al_2O_3$ | 100 | 36 | 280 | 14,000 | 15 |
| Example II-6 | oxalic acid | present | 40 | 38 | $Al_2O_3$ | 750 | 36 | 280 | 14,000 | 15 |
| Comparative Example II-1 | oxalic acid | present | 40 | 40 | — | — | — | 300 | 15,000 | 50 |
| Comparative Example II-2 | oxalic acid | present | 40 | 32 | $Al_2O_3$ | 5 | 36 | 400 | 5,000 | 35 |
| Comparative Example II-3 | oxalic acid | present | 40 | 38 | $Al_2O_3$ | 1,000 | 36 | 280 | 6,000 | 50 |
| Example II-7 | sulfuric acid | absent | 10 | 17 | $Al_2O_3$ | 15 | 36 | 330 | 13,000 | 15 |
| Example II-8 | sulfuric acid | present | 15 | 75 | $Al_2O_3$ | 15 | 36 | 200 | 14,000 | 17 |
| Example II-9 | oxalic acid | absent | 20 | 22 | $Al_2O_3$ | 15 | 36 | 280 | 14,000 | 18 |
| Example II-10 | phosphoric acid | absent | 80 | 35 | $Al_2O_3$ | 15 | 36 | 250 | 15,000 | 20 |
| Comparative Example II-4 | sulfuric acid | absent | 10 | 18 | — | — | — | 500 | 1,000 | 60 |
| Comparative Example II-5 | sulfuric acid | present | 15 | 75 | — | — | — | 500 | 10,000 | 60 |
| Comparative Example II-6 | sulfuric acid | present | 15 | 18 | sealing treatment by boiling water | | | 500 | 1,000 | 20 |
| Example II-11 | oxalic acid | present | 40 | 38 | $TiO_2$ | 20 | 8.4 | 230 | 15,000 | 16 |
| Example II-12 | oxalic acid | present | 40 | 38 | $ZrO_2$ | 26 | 3.3 | 220 | 16,000 | 15 |
| Example II-13 | oxalic acid | present | 40 | 36 | $ZrO_2$ | 63 | 3.3 | 210 | 15,000 | 17 |
| Example II-14 | oxalic acid | present | 40 | 37 | $SiO_2$ | 20 | 1.38 | 200 | 15,000 | 16 |
| Example II-15 | oxalic acid | present | 40 | 35 | Ni | 10 | 90 | 330 | 12,000 | 30 |
| Example II-16 | oxalic acid | present | 40 | 36 | Sn | 10 | 67 | 300 | 10,000 | 30 |

The lithographic printing plate precursor according to the present invention can efficiently utilize a heat in image formation, and is high sensitivity and excellent in press life, and the generation of smearing in a non-image area is inhibited, therefore, the lithographic printing plate precursor of the present invention can be preferably used as both thermal positive type and thermal negative type lithographic printing plate precursors. Further, the lithographic printing plate precursor according to the present invention can also be preferably used as the development on machine type lithographic printing plate precursor, thus extremely useful.

The entitle disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a metal support having formed thereon an anodic oxide film, said anodic oxide film having pores with a surface mouth diameter of from 0 to 30 nm and a maximum inside diameter of from 20 to 300 nm with the maximum inside diameter being larger than the surface mouth diameter, and an image-forming layer containing a light-to-heat converting agent provided on the anodic oxide film wherein a sealing treatment is performed on the surface mouth areas of the pores of the anodic oxide film and the pore diameters of the surface mouth areas are lessened.

2. The lithographic printing plate precursor as claimed in claim 1, wherein the thickness of the surface mouth area of the pore diameter of from 0 to 30 nm of the anodic oxide film is from 10 to 500 nm and the thickness of the area having the maximum inside diameter of from 20 to 300 nm is from 100 to 2,000 nm.

3. The lithographic printing plate precursor as claimed in claim 1, wherein the pore density of the surface area of the anodic oxide film is 2,500/$\mu m^2$ or less.

4. The lithographic printing plate precursor as claimed in claim 1, wherein the void ratio of the anodic oxide film is from 20 to 70%.

5. The lithographic printing plate precursor as claimed in claim 1, wherein the anodic oxide film is formed by anodic oxidation treatment with an electrolyte containing a sulfuric acid and then by anodic oxidation treatment with an electrolyte containing a phosphoric acid.

6. A lithographic printing plate precursor comprising an aluminum support having formed thereon an anodic oxide film, said anodic oxide film having pores with a surface mouth diameter of from 0 to 30 nm and a maximum inside diameter of from 20 to 300 nm with the maximum inside diameter being larger than the surface mouth diameter, a particle layer comprising particles having an average particle diameter of from 8 to 800 nm and an image-forming layer containing a light-to-heat converting agent and capable of image-forming with infrared laser exposure with the layers being provided in this order.

7. The lithographic printing plate precursor as claimed in claim 6, wherein the heat conductivity of the particles is 60 W/(m° K) or less.

8. A lithographic printing plate precursor comprising an aluminum support having formed thereon an anodic oxide film, said anodic oxide film having pores with a surface mouth diameter of from 0 to 30 nm and a maximum inside diameter of from 20 to 300 nm with the maximum inside diameter being larger than the surface mouth diameter, a particle layer comprising particles having an average particle diameter of from 8 to 800 nm formed by electrolytic treatment of the aluminum support with an electrolyte containing hydrophilic particles having an average particle diameter of from 8 to 800 nm, and an image-forming layer containing a light-to-heat converting agent and capable of image-forming with infrared laser exposure with the layers being provided in this order.

* * * * *